(12) United States Patent
Richardson et al.

(10) Patent No.: US 10,741,960 B2
(45) Date of Patent: Aug. 11, 2020

(54) SYSTEM FOR CONTROLLING LIVING SPACE FEATURES

(71) Applicant: Deako, Inc., Seattle, WA (US)

(72) Inventors: Derek Richardson, Seattle, WA (US); Patrick Prendergast, Clinton, WA (US); Allen Stedman, Bellevue, WA (US); Dan Blase, Everett, WA (US); Chris Keeser, Everett, WA (US)

(73) Assignee: Deako, Inc., Seattle, WA (US)

( * ) Notice: Subject to any disclaimer, the term of this patent is extended or adjusted under 35 U.S.C. 154(b) by 133 days.

(21) Appl. No.: 15/756,510

(22) PCT Filed: Aug. 31, 2016

(86) PCT No.: PCT/US2016/049797
§ 371 (c)(1),
(2) Date: Feb. 28, 2018

(87) PCT Pub. No.: WO2017/040729
PCT Pub. Date: Mar. 9, 2017

(65) Prior Publication Data
US 2019/0252814 A1    Aug. 15, 2019

Related U.S. Application Data

(63) Continuation of application No. 15/253,819, filed on Aug. 31, 2016, now abandoned, and a continuation of
(Continued)

(51) Int. Cl.
*H01R 13/447*  (2006.01)
*G06F 3/041*   (2006.01)
(Continued)

(52) U.S. Cl.
CPC ........... *H01R 13/447* (2013.01); *G06F 3/041* (2013.01); *H02G 3/08* (2013.01); *H02G 3/12* (2013.01);
(Continued)

(58) Field of Classification Search
CPC ........................... H01R 13/447; Y04S 20/227
See application file for complete search history.

(56) References Cited

U.S. PATENT DOCUMENTS

| 5,224,649 A | 7/1993 | Brown et al. |
| 8,089,032 B2 * | 1/2012 | Beland ............... G05D 23/1902 219/492 |

(Continued)

FOREIGN PATENT DOCUMENTS

EP    1260886 A2    11/2002

OTHER PUBLICATIONS

Wikipedia contributors. "Junction box." Wikipedia, The Free Encyclopedia. Wikipedia, The Free Encyclopedia, Oct. 28, 2019. Web. Mar. 14, 2020. (Year: 2020).*

(Continued)

*Primary Examiner* — Daniel J Cavallari
(74) *Attorney, Agent, or Firm* — Suiter Swantz pc llo

(57) ABSTRACT

A living space feature control apparatus includes a living space feature controller, a junction box controller receiver, wireless capabilities, and a programmable user interface. The living space feature control apparatus is configured with modular units including a junction box, backplate, device control assembly and faceplate making the control apparatus toollessly exchanged, upgraded or replaced. The control apparatus functions in a variety of ways including identifying different users, recording user preferences, automatically turning lights on and off according to user preferences, closing blinds automatically, initiating security actions, act-
(Continued)

ing as an intercom system and triangulating occupant location. The living space feature controller may include inductive coils for inductive signal and power transfer and a rotary optical encoder for selectable user living space control.

12 Claims, 44 Drawing Sheets

Related U.S. Application Data application No. 15/253,815, filed on Aug. 31, 2016, now Pat. No. 10,153,113, and a continuation of application No. 15/253,811, filed on Aug. 31, 2016, now Pat. No. 10,078,786, and a continuation of application No. 15/145,624, filed on May 3, 2016, now Pat. No. 10,069,235, and a continuation of application No. 15/074,915, filed on Mar. 18, 2016, now Pat. No. 10,063,002.

(60) Provisional application No. 62/212,388, filed on Aug. 31, 2015.

(51) Int. Cl.
| | | |
|---|---|---|
| H02G 3/12 | (2006.01) |
| H02G 3/16 | (2006.01) |
| H05B 47/10 | (2020.01) |
| H05B 47/19 | (2020.01) |
| H02G 3/08 | (2006.01) |
| H05K 5/00 | (2006.01) |
| H05K 5/02 | (2006.01) |
| H05K 5/03 | (2006.01) |
| H01R 12/72 | (2011.01) |
| H01R 13/24 | (2006.01) |
| H01R 13/627 | (2006.01) |
| H01R 24/62 | (2011.01) |
| H01R 107/00 | (2006.01) |

(52) U.S. Cl.
CPC .............. *H02G 3/16* (2013.01); *H05B 47/10* (2020.01); *H05B 47/19* (2020.01); *H05K 5/0004* (2013.01); *H05K 5/0017* (2013.01); *H05K 5/0221* (2013.01); *H05K 5/0256* (2013.01); *H05K 5/03* (2013.01); *H01R 12/724* (2013.01); *H01R 13/2407* (2013.01); *H01R 13/6275* (2013.01); *H01R 24/62* (2013.01); *H01R 2107/00* (2013.01); *Y04S 20/227* (2013.01)

(56) References Cited

U.S. PATENT DOCUMENTS

| | | |
|---|---|---|
| 8,878,058 B2 | 11/2014 | Wurms et al. |
| 9,122,449 B2 * | 9/2015 | DeSilva ................ G06F 1/1632 |
| 9,437,978 B2 | 9/2016 | Green |
| 9,583,924 B2 | 2/2017 | Thornton et al. |
| 9,653,897 B2 | 5/2017 | Hemingway et al. |
| 2006/0065510 A1 | 3/2006 | Kiko et al. |
| 2006/0066151 A1 | 3/2006 | Hatemata |
| 2009/0138353 A1 | 5/2009 | Mendelson |
| 2010/0097225 A1 | 4/2010 | Petricoin, Jr. |
| 2013/0099009 A1 | 4/2013 | Filson et al. |
| 2016/0056629 A1 | 2/2016 | Baker et al. |
| 2016/0195856 A1 | 7/2016 | Spero |

OTHER PUBLICATIONS

"Notification of Transmittal of International Search Report and the Written Opinion of the International Searching Authority" from the parent PCT Application No. PCT/US16/49797 filed on Aug. 31, 2016; document dated Nov. 17, 2016; 9 pages.

\* cited by examiner

Table 7 - Prediction LUT

| Current Room | Velocity (mpm) | Direction | BR2 | Laundry | H1 | Garage |
|---|---|---|---|---|---|---|
| H2 | 100 | E | 10% | 15% | 75% | 0% |
| H2 | 100 | W | 10% | 10% | 0% | 80% |
| H2 | 50 | E | 30% | 20% | 50% | 0% |
| H2 | 50 | W | 30% | 50% | 0% | 20% |

FIG. 17B

Table 9 - Updating the Observation Table

| Current Room | Velocity (mpm) | Direction | Occurrences | BR2 | Laundry | H1 | Garage | BR2 | Laundry | H1 | Garage |
|---|---|---|---|---|---|---|---|---|---|---|---|
| H2 | 100 | E | 60+1 | 6+1 | 9 | 45 | 0 | 11% | 15% | 74% | 0% |
| H2 | 100 | W | 90 | 9 | 9 | 0 | 72 | 10% | 10% | 0% | 80% |
| H2 | 50 | E | 70 | 21 | 14 | 35 | 0 | 30% | 20% | 50% | 0% |
| H2 | 50 | W | 60 | 18 | 30 | 0 | 12 | 30% | 50% | 0% | 20% |

Table 12 - Light Response to Occupancy with Prediction

| # | Time | Entry AIROS | Entry LUC | Living AIROS | Living LUC | Kitchen AIROS | Kitchen LUC | H1A AIROS | H1A LUC | H1B AIROS | H1B LUC | BR1 AIROS | BR1 LUC | Notes |
|---|---|---|---|---|---|---|---|---|---|---|---|---|---|---|
| 1 | 1:00 | Occupied | On | Vacant | On | Vacant | Off | Vacant | Off | Vacant | Off | Vacant | Off | Living Room light turns on when entryway AIROS detects occupancy |
| 2 | 1:00 | Occupied | On | Occupied | On | Vacant | Off | Occupied | On | Vacant | Off | Vacant | Off | |
| 3 | 1:01 | Vacant | Off | Activity | On | Occupied | On | Vacant | Off | Vacant | Off | Vacant | Off | Entryway and Hallway 1 lights turn off when person walks towards Kitchen |
| 4 | 1:03 | Vacant | Off | Vacant | Start Timer | Occupied | On | Vacant | On | Vacant | On | Vacant | Off | Entryway light stays off, Hallway 1 lights turn on when person walks in that direction |
| 5 | 1:05 | Vacant | Off | Vacant | Off | Activity | Off | Occupied | Off | Occupied | On | Vacant | On | Bedroom 1 lights come on in response to person walking in that direction, Kitchen and Dining Room lights turned off |
| 6 | 1:08 | Vacant | Off | Vacant | Off | Vacant | Off | Vacant | Start Timer | Activity | Start Timer | Occupied | On | |
| 7 | 1:08 | Vacant | Off | Vacant | On | Vacant | On | Occupied | On | Occupied | On | Vacant | Off | Kitchen and Living Room lights turn on in response to person walking down Hallway 1. Bedroom 1 lights off after person leaves |
| 8 | 1:09 | Vacant | Off | Vacant | Start Timer | Occupied | On | Vacant | Start Timer | Vacant | Start Timer | Vacant | Off | Living Room lights timed turn-off started |
| 9 | 1:10 | Vacant | Off | Vacant | Timer | Activity | On | Occupied | On | Occupied | On | Vacant | Off | |
| 10 | 1:10 | Activity | Off | Occupied | On | Vacant | Start Timer | Occupied | Off | Vacant | Off | Vacant | Off | |
| 11 | 1:55 | Activity | Off | Activity | On | Vacant | Off | Vacant | Off | Vacant | Off | Vacant | Off | |

SYSTEM FOR CONTROLLING LIVING SPACE FEATURES

TECHNICAL FIELD

The present disclosure relates generally to device controllers and, more particularly, to a method and apparatus for controlling the automation of building functions.

DISCLOSURE OF THE INVENTION

Technical Problems

The modification of an existing electrical wiring system in a commercial or residential building is often difficult and/or costly. An electrical wiring system in a commercial or residential building typically includes a multitude of electrical circuits in which electrical wires are routed between a mains power source and electrical junction boxes placed at fixed locations throughout the building. Based on known or anticipated needs, certain electrical junction boxes are wired to have direct access to electrical power (e.g. an electrical outlet), while other electrical junction boxes are wired such that access to electrical power is controlled by electrical switches (e.g. a light or a switched electrical outlet). The electrical wiring is typically installed during a construction phase of the building, secured to support structures according to electrical and building codes, and covered during a finishing phase. In this regard, a modification of the existing wiring system in response to changing needs is generally limited to minor alterations of electrical connections within accessible electrical junction boxes or the installation of new electrical wiring, which often requires remodeling and/or refinishing.

Further, the replacement, repair, or alteration of the functionality of existing electrical wiring devices such as electrical outlets or switches connected to a mains power source is often performed by a journeyman due to safety concerns and/or uncertainty regarding proper wiring configurations. It would therefore be advantageous to provide a safe, time effective way for consumers to replace and/or upgrade electrical outlets or switches connected to a mains power source.

Technical Solutions

An apparatus is disclosed in accordance with one or more illustrative embodiments of the present disclosure. In one illustrative embodiment, a user upgradeable and programmable living space feature control apparatus includes a living space feature controller and a junction box controller receiver to substantially house within and make mechanical connection to a junction box. In one illustrative embodiment, the controller receiver includes a cover that has at least an active and an inactive state, a living space controller interface for at least one of inductively and electrically connecting the receiver with a living space feature controller for living space feature control. In one illustrative embodiment, the controller receiver includes a lock configured to removably receive, activate, and retain for operational control the living space feature controller with the receiver. In another illustrative embodiment, the living space feature controller provides wireless addressable connectivity and at least one of lighting control, voice control, motion control, audio control, security control, video control, and climate control. In another illustrative embodiment, the living space feature controller includes a programmable user interface for wireless programming living space features and at least one of a haptic (auditory, visual, touch) user control and a wireless control of at least one living space feature.

Advantageous Effects

In one illustrative embodiment, the living space feature controller is toollessly exchangeable for providing differential living space feature control and capable of recording user feature selection over time. In another illustrative embodiment, the living space feature controller differentiates between users and predicts user feature selection based at least in part on previously recorded user feature selection. In another illustrative embodiment, the living space feature controller provides control for at least window opacity and window shades. In another illustrative embodiment, the living space feature controller includes a rotary optical encoder for interconnecting the controller and the receiver for selectable user living space control. In another illustrative embodiment, the living space feature controller plays occupancy noises and user recorded noises as part of security measures when an unauthorized occupant is detected. In another illustrative embodiment, the living space feature controller can perform triangulation using at least three controller and receiver pairs to identify the location of a hand held device or occupant. In another illustrative embodiment, the living space feature controller performs intercom communication that actively maintains connection to occupied rooms of a building.

BRIEF DESCRIPTION OF THE DRAWINGS

The numerous advantages of the disclosure may be better understood by those skilled in the art by reference to the accompanying figures in which:

FIG. 17B is a prediction look-up-table, in accordance with one or more embodiments of the present disclosure.

FIG. 17C is an updated observation table, in accordance with one or more embodiments of the present disclosure.

FIG. 21B is a table illustrating light response to occupancy with prediction, in accordance with one or more embodiments of the present disclosure.

DETAILED DESCRIPTION

Figure 1:
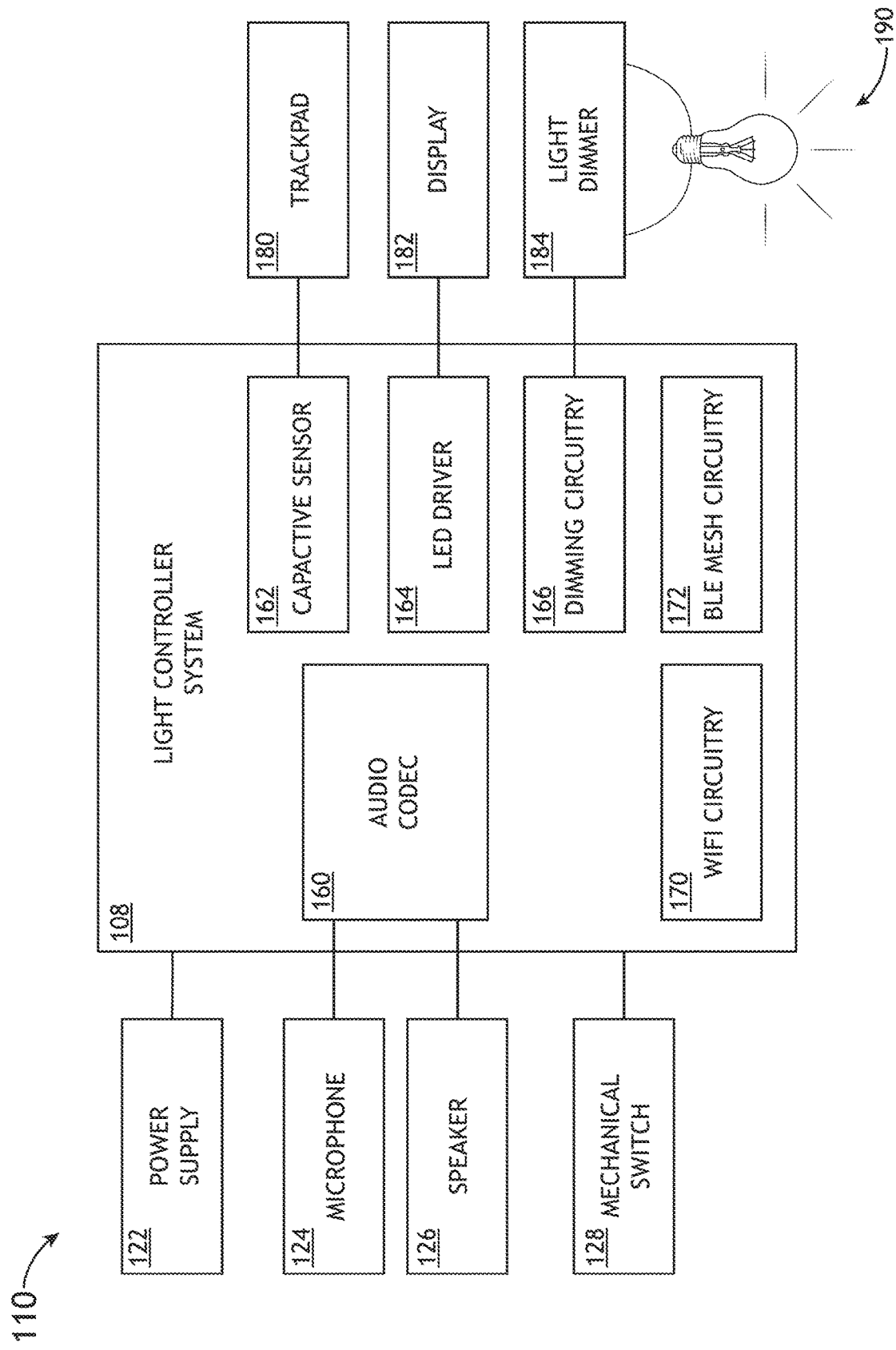
FIG. 1 is a block diagram of components of a light controller system switch, in accordance with one or more embodiments of the present disclosure.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting Reference will now be made in detail to the subject matter disclosed, which is illustrated in the accompanying drawings. A configurable network of device controllers to automate building functions is described, in accordance with one or more embodiments of the present disclosure. Embodiments of the present disclosure are directed to the formation of a network of device controllers that perform functions in a building. Additional embodiments of the present disclosure are directed to pairing device controllers with one or more loads in which a device controller regulates one or more paired loads. Additional embodiments are directed to device controllers in a configurable network configured to regulate any load connected to any other device controllers on the configurable network. Additional embodiments are directed to a network of backplates electrically connected to mains power to facilitate a network of modular device controllers. Additional embodiments are directed to monitoring building occupant location and determining building occupant habits. Additional embodiments of the present disclosure are directed to adjusting building functions based on predicted building occupant habits. Further embodiments of the present disclosure are directed to the automation of functions performed in a building to coincide with system settings.

It is recognized herein that an electrical wiring system of a building typically includes multiple electrical circuits to route electrical power from a power source (e.g. mains power) to multiple electrical junction boxes located throughout the building. Typically, power cables containing electrical wires are routed from a power distribution panel such as, but not limited to, an electrical fuse box (circuit breaker panel), to the multiple electrical junction boxes. The electrical junction boxes may further facilitate electrical connections between the power distribution panel and one or more electrical devices or device controllers by providing an enclosure in which the electrical devices may be connected to, or otherwise terminate, the electrical wires provided by the power cable. An electrical junction box may additionally provide structural support for mounting an electrical device.

The topology of the configuration of wires between junction boxes as well as the number of wires routed between junction boxes may vary depending on the anticipated function of electrical devices to be installed within the junction boxes. Further, power cables associated with an electrical wiring system are typically routed between studs associated with walls and joists associated with ceilings of the building and are typically secured according to building and electrical codes. Accordingly, modifications of the configuration and number of wires between electrical boxes may be difficult and/or undesirable.

Embodiments of the present disclosure are directed to a configurable network of device controllers connected to the electrical wiring system and further in data communication to provide control over the regulation of electrical loads. In this regard, data communication between device controllers supplements and/or expands the capabilities of wired electrical connections associated with the electrical wiring system to provide fully customizable control over load regulation. Further, embodiments of the present disclosure are directed to incorporating additional devices (e.g. shades, sensors, luminaires, electrical appliances, or the like) to the configurable network of device controllers. Further embodiments include, adjusting the incorporated additional devices (e.g. sensors, luminaires, electrical appliances, or the like) to function according to system settings. Additional embodiments of the present disclosure are directed to modular control units with interchangeable device control assemblies for flexible modification of the configurable network of device controllers.

FIG. 1 is a block diagram illustrating a device control assembly 110, in accordance with one or more embodiments of the present disclosure. It is noted herein that the device control assembly 110 described herein is provided solely for illustrative purposes and should not be interpreted as limiting the present disclosure. It is further noted herein that for the purposes of the present disclosure the terms "device control assembly" and "living space feature controller" are used interchangeably. In some embodiments, the device control assembly 110 is included in a modular control unit 100 and/or within an automation home product. For example, the device control assembly 110 may include, but is not limited to, a light switch, dimmer or keypad. In some embodiments, the device control assembly 110 is connected to one or more load devices 190. It is noted herein that the load devices may be any type of load devices including, but not limited to, luminaires, fans, or electrical outlets configured to provide power to one or more attached electrical devices. In some embodiments, the device control assembly 110 is coupled to a power supply 122. In some embodiments, the device control assembly 110 includes a lighting controller system 108. In some embodiments, the device control assembly 110 is communicatively coupled to one or more input devices. In some embodiments, an input device could be any device that is coupled to the device control assembly 110 and supplies information and/or data to the device control assembly 110. For example, the one or more input devices may include, but are not limited to, a microphone 124, mechanical switch 128, capacitive sensor 162, or trackpad 180. In some embodiments, the device control assembly includes Bluetooth Low Energy (BLE) mesh circuitry 172. In some embodiments, a capacitive sensor 162 is coupled to a trackpad 180. In some embodiments, a resistive sensor is coupled to a trackpad 180. In some embodiments, the trackpad 180 is coupled to a sensing circuit and logic circuit to detect the location of a touch and/or touch gesture. In some embodiments, the device control assembly 110 can detect mechanical actuation using input from a mechanical switch 128 (e.g. a dome switch, or the like) communicatively coupled to a general-purpose input/output processor of a microcontroller in the control unit assembly 101. In some embodiments, when the mechanical switch 128 is depressed the load device 190 is togged (activated). For example, a light is switched from being off to being on when the mechanical switch 128 is depressed. For instance, when the mechanical switch 128 is depressed the dimming circuitry 166 actuates the light dimmer 184 to lower the light level of a luminary load device 190. By way of another example, a fan is switched from being on to being off when the mechanical switch 128 is depressed. In some embodiments, the device control assembly 110 has a front portion that includes a display 182, holes for a microphone 124, and one or more speakers 126. In some embodiments, the microphone 124 and one or more speakers 126 are communicatively coupled to an audio codec 160. In some embodiments, an LED driver 164 is coupled to a display 182. In some embodiments, a user interface 112 is coupled to the display 182. For example, the user interface 112 may include, but is not limited to, a touch-sensitive display. In one embodiment the display is fabricated out of acrylic or glass. The display 182 may include any type of display known in the art suitable for representing visual data. For example, the display 182 may include, but is not limited to, a liquid crystal display, a dead front display, or a backlit overlay display.

Figure 2:
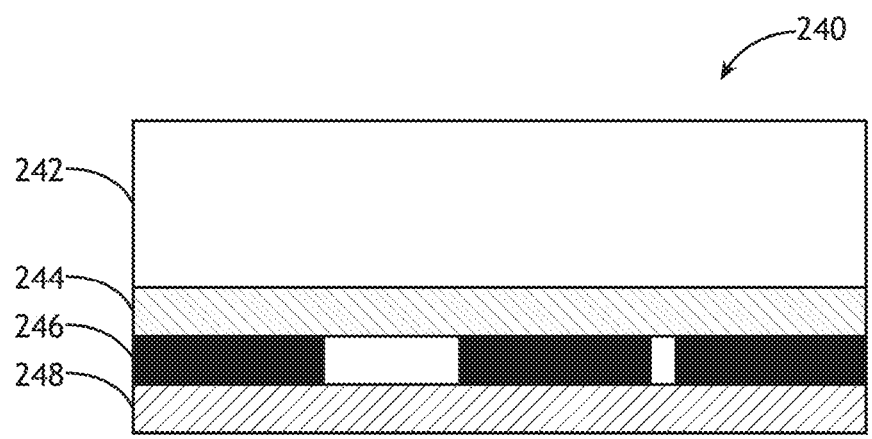
FIG. 2 is a cross-sectional view of a dead front display, in accordance with one or more embodiments of the present disclosure.

FIG. 2 is a cross section view illustrating a dead front display 240, in accordance with one or more embodiments of the present disclosure. In some embodiments, the display 242 is fabricated using a technique known as deadfronting. In some embodiments, the backlight 248 may include one or more optical components suitable for generating illumination such as, but not limited to, one or more LEDs, one or more light-guides, one or more lasers, one or more homogenizers, one or more filters, or one or more polarizers. In some embodiments, the backlight 248 may produce illumination of any color such as, but not limited to white light or light of a particular color. In some embodiments, the color of illumination provided by the backlight 248 is adjustable. In some embodiments, the deadfronting technique allows for images to be printed with opaque media 246 on top of semi-transparent media 244. In some embodiments, the semi transparent media 244 appears to be opaque when not illuminated by a backlight 248. In some embodiments, the graphics in the semi-transparent media are visible through the cover lens 242 when the opaque media 246 is illuminated by a backlight 248.

Figure 3:
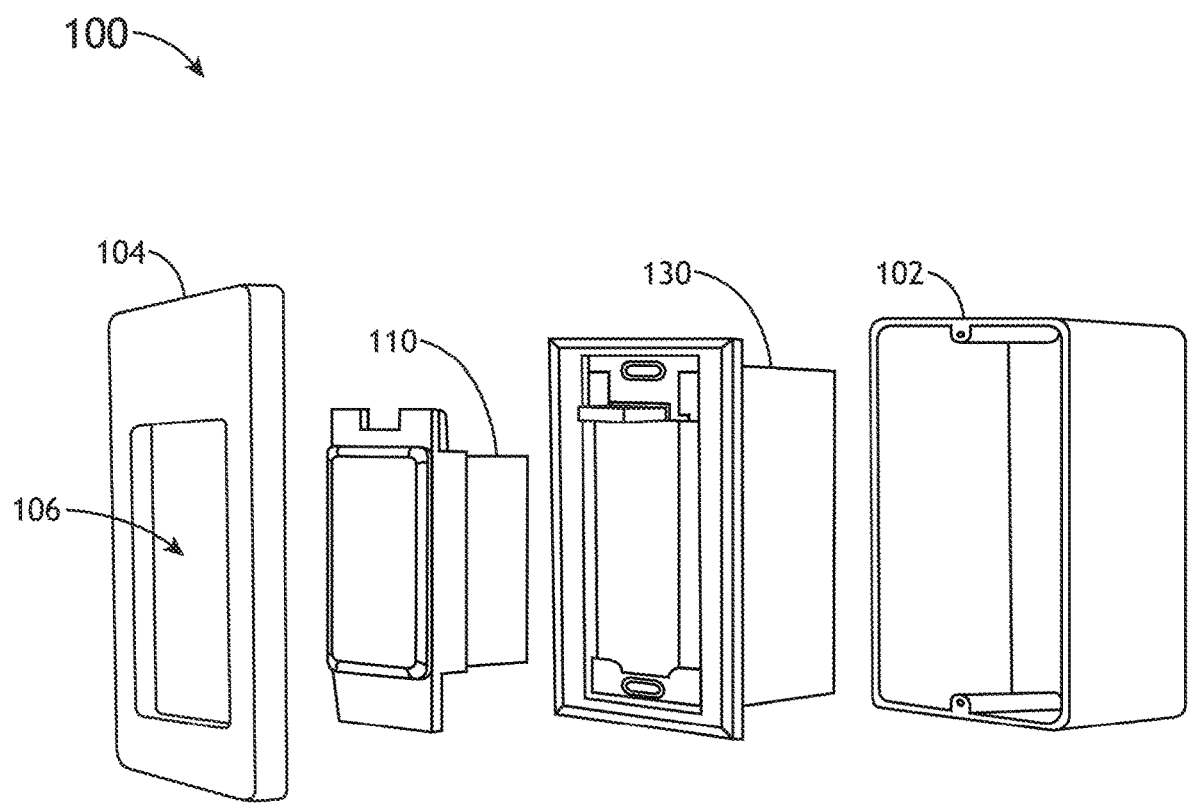
FIG. 3 is an exploded view of a modular control unit configured to mount within an electrical junction box, in accordance with one or more embodiments of the present disclosure.

FIG. 3 is an exploded view of a modular control unit 100 configured to mount within an electrical junction box 102, in accordance with one or more embodiments of the present disclosure. In some embodiments, the modular control unit 100 includes a backplate 130 configured to mount within an electrical junction box 102 and provide an electrical connection to an electrical wiring system. In some embodiments, the junction box 102 and the backplate 130 are configured as a junction box controller receiver. In some embodiments, a modular control unit 100 includes a device control assembly 110 to control one or more load devices and is configured to removably couple with the backplate 130. Further, the modular control unit 100 may include a faceplate 104 configured to cover the electrical junction box 102. In this regard, a backplate 130 may provide a standardized mounting assembly for device control assemblies 110. Further, device assemblies 110 may be removably and/or interchangeably connected to the electrical wiring system through the backplate 130. In some embodiments, a living space feature controller includes a device control assembly 110 and an occupancy sensor assembly 1205.

For the purposes of the present disclosure, a load device 110 may include any device directly or indirectly attached to the electrical wiring system. For example, a load device 110 may include a wired load such as, but not limited to, a luminaire or a fan. As an additional example, a load device 110 may include an electrical outlet into which loads may be removably connected.

In some embodiments, the device control assemblies 110 facilitate moving, upgrading, or replacing device control assemblies 110. For example, a user can replace a dimmer installed in a bathroom for a switch installed in the bedroom. In some embodiments, device control assemblies 110 are designed to feature safe and simple electrical connections from device controller to electrical wiring systems.

In some embodiments, the backplate 130 has wire terminals for hooking up to AC mains and multiple wiring configurations for AC outlets, USB chargers, or controlling different light installations (one-way, three-way and four-way). In some embodiments, the backplate 130 and device control assembly 110 may be keyed so that the connections to the device control assembly 110 are oriented correctly.

In some embodiments, it may be desirable to use a traditional control unit where a backplate 130 is already installed in a junction box 102. In some embodiments, an interposer from an existing AC outlet receptacle or light switch may be used to make a swappable plug. For example, an interposer is used to mount the non-device control assembly device and make contact from existing switch terminals to a plug that interfaces to the correct connections in the backplate 130.

In some embodiments, the device control assembly 110 includes a recessed receptacle to allow for furniture to be placed flush against the wall. In some embodiments, the device control assembly is constructed so that it can be inserted into a backplate 130. In some embodiments, the location of the user accessible plugs is the same as that of the interface to the backplate 130 so the receptacle depth can take advantage of the depth of the backplate 130 receptacles.

In some embodiments, a device control assembly 110 includes electrical circuitry and/or mechanical components to actuate, regulate, or otherwise control one or more load devices connected to the electrical wiring system. For example, a device control assembly 110 may include, but is not limited to, one or more input devices, one or more buttons, mechanical switches, one or more electrical relays, one or more MOSFETs (metal-oxide-semiconductor field-effect transistors) or one or more TRIACs (triode for alternating current). In this regard, a device control assembly 110 may include, but is not limited to, a toggle switch, a dimmer switch, an alternating current (AC) electrical outlet, a direct current (DC) electrical outlet (e.g. a universal serial bus (USB) outlet), a mechanical switch, or a multi-function keypad. Additionally, a device controller assembly 110 may include, but is not limited to, one or more display devices, one or more speakers, one or more microphones, or one or more sensors.

In some embodiments, the backplate 130 is configured to electrically connect to an electrical wiring system through the electrical junction box 102. For example, the backplate 130 may connect to a power distribution panel through an electrical wiring system terminated at the electrical junction box 102. Additionally, the backplate 130 may be configured to terminate a power cable with any number of conductors such as, but not limited to, a two-conductor power cable, a three-conductor power cable, or a four-conductor power cable. It is noted herein that the backplate 130 may be compatible with any electrical wiring system in any configuration. For example, the backplate 130 may, but is not limited to, be configured to accept a wire connected to a ground source (e.g. a "ground" wire), a wire connected to a power source (e.g. a "hot" wire), a wire connected to a neutral bar (e.g. a "neutral" wire), or one or more additional wires (e.g. one or more "traveler" wires). Further, the backplate 130 may be configured to accept any gauge of wire. In some embodiments, the backplate 130 accepts 14-gauge wire (e.g. from a 14/2 power cable or a 14/3 power cable). In some embodiments, the backplate 130 accepts 12-gauge wire (e.g. from a 12/2 power cable or a 12/3 power cable). It is recognized herein that electrical systems may include any number of switches or connections between components. As such, the description of electrical wiring systems above is presented solely for illustrative purposes and should not be interpreted as limiting.

A backplate 130 may be electrically connected to an electrical wiring system through the electrical junction box 102. In some embodiments, a backplate 130 is configured to connect to an electrical wiring system through twist-on wire connectors. For example, a backplate 130 may include one or more wires suitable for connecting to a power cable through twist-on wire connectors. In some embodiments, the backplate 130 is configured to connect to an electrical wiring system through push-in wire connectors. For example, a backplate 130 may include one or more push-in connectors to connect to conductors in a power cable such as, but not limited to, a "hot" wire, a "neutral" wire, a "ground" wire, or a "traveler" wire.

In some embodiments, a backplate 130 is configured to interchangeably couple to device control assemblies 110 without modification of the connection between the backplate 130 and the electrical wiring network. For example, a device control assembly 110 configured to operate as a toggle switch may be removed and replaced with a device control assembly configured to operate as a dimmer switch without modification to the backplate 130 or the associated electrical connections to the electrical wiring network. In this regard, the modular control unit 100 provides a semi-permanent element (e.g. a backplate 130 attached to an electrical junction box 102 via one or more screws) connected to the electrical wiring system and interchangeable functional units (e.g. a device control assembly 110).

In some embodiments, a device control assembly 110 may be inserted into or removed from a backplate 130 while a backplate 130 is connected to live power from the electrical wiring assembly. For example, an electrical connection established between a backplate 130 and a device control assembly 110 may be configured to establish a ground connection prior to establishing a "hot" wire connection.

A backplate 130 may be configured to occupy one or more device positions within an electrical junction box 102. In some embodiments, a backplate 130 is configured to occupy one position within an electrical junction box 102. In this manner, a single backplate 130 may be mounted to a 1-gang electrical junction box 102, two backplates 130 may be mounted to a 2-gang electrical junction box 102, or the like. Further, a backplate 130 may be mounted to an electrical junction box 102 alongside one or more additional devices. For example, a backplate 130 and a typical light switch may be mounted within 2-gang electrical junction box 102. In some embodiments, a backplate 130 is configured to occupy two or more positions within an electrical junction box 102. For example, a single backplate 130 may be configured to accept two or more device control assemblies 110 such that each device control assembly 110 effectively occupies a single position within the electrical junction box 102. As an additional example, a backplate 130 occupying two or more positions within an electrical junction box 102 may accept one or more device control assemblies 110 of any size. In this regard, a single device control assembly 110 may effectively occupy any portion of an electrical junction box 102.

In some embodiments, the modular control unit 100 includes a faceplate 104 to cover a portion of the electrical junction box 102 not covered by the backplate 130 or the device control assembly 110. In some embodiments, the faceplate 104 includes one or more openings 106 to provide access to one or more elements of the device control assembly 110. For example, the faceplate 104 may include, but is not limited to, one or more openings 106 to provide access to one or more displays, one or more speakers, one or more microphones, one or more antennas, or one or more sensors associated with a device control assembly 110. In some embodiments, the faceplate 104 provides access to one or more elements of the device control assembly 110 while covering exposed areas of the electrical junction box 102. For example, a device control assembly 110 and/or a backplate 130 attached to an electrical junction box 102 may leave one or more areas of the electrical junction box 102 exposed. In this regard, a faceplate 104 may cover the one or more exposed areas of the junction box.

Figure 4A:
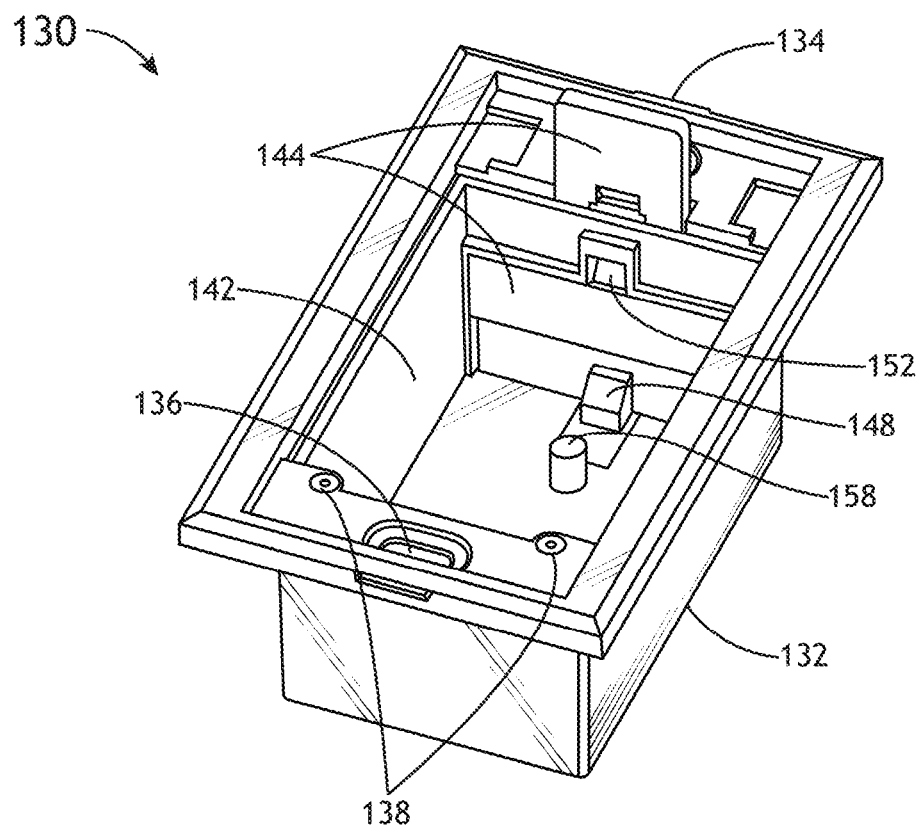
FIG. 4A is an isometric view of a backplate with backplate contacts shielded by an air gap actuator, in accordance with one or more embodiments of the present disclosure.

FIG. 4A is an isometric view of a backplate 130, in accordance with one or more embodiments of the present disclosure. In some embodiments, the backplate 130 and device control assembly 110 are coupled by an air gap actuator 144. In some embodiments, a position of the air gap actuator 144 is maintained through friction associated with one or more adjacent elements (e.g. the casing 132). In some embodiments, the air gap actuator 144 is held in tension (e.g. by a spring) to force the air gap actuator 144 to remain in the closed position unless a counter-force is applied. In this regard, a force must be applied to translate the air gap actuator 144 from a closed position to an open position.

In some embodiments, the device control assembly 110 includes one or more contact pads 118 to provide an electrical connection from the backplate 130 to the electronic components within the casing. In this regard, the device control assembly 110 may be connected to the electrical wiring system through the backplate 130. The contact pads 118 may be formed from any material known in the art suitable for providing an electrical connection between the device control assembly 110 and the backplate 130 such as, but not limited to, brass. In some embodiments, the device control assembly 110 includes one or more locking features 120 for securing the device control assembly 110 to the backplate 130 when an electrical connection between the device control assembly 110 and the backplate 130 is established. In some embodiments, the backplate 130 includes one or more backplate contacts 140 to provide one or more electrical connections between an electrical wiring assembly (e.g. one or more power cables) and the one or more contact pads 118 of an inserted device control assembly 110.

In some embodiments, the backplate 130 includes a locking lever 152 to secure a device control assembly 110 to the backplate 130 when the air gap actuator 144 is in an open position (e.g. the backplate contacts 140 are in connection with the contact pads 118 of the device control assembly 110). In some embodiments, the backplate 130 includes an air gap actuator lock 148 configured to regulate the movement of the air gap actuator 144. In some embodiments, the air gap actuator lock 148 is configured to translate between a locked position and an unlocked position.

In some embodiments, the casing 132 includes one or more keyed features 158 to facilitate alignment of a device control assembly 110 into a backplate 130. For example, the one or more keyed features 158 may be of any type known in the art. For example, the one or more keyed features 158 may include, but are not limited to, raised features, recessed features, or grooves. In some embodiments, a keyed feature 158 is a raised feature with a height equal to or greater than a height of the air gap actuator lock 148 in a locked position. In this regard, air gap actuator lock 148 is accessible to objects with one or more corresponding keyed features 158 (e.g. keyed features on a device control assembly 110).

Figure 4B:
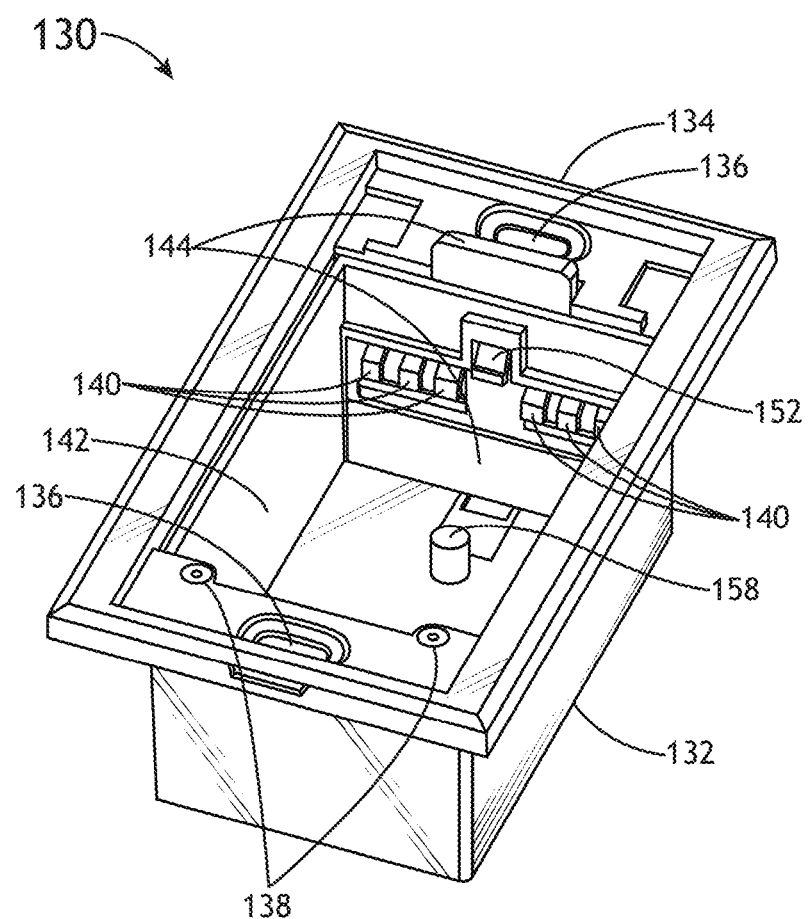
FIG. 4B is an isometric view of a backplate with backplate contacts exposed, in accordance with one or more embodiments of the present disclosure

FIG. 4B is an isometric view of a backplate 130 with backplate contacts 140 exposed, in accordance with one or more embodiments of the present disclosure. In some embodiments, the backplate and the device control assembly make electrical contact. For example, the backplate includes backplate contacts 140 that are configured to make electrical contact with the contact pads 118 on a device control assembly 110.

Figure 4C:
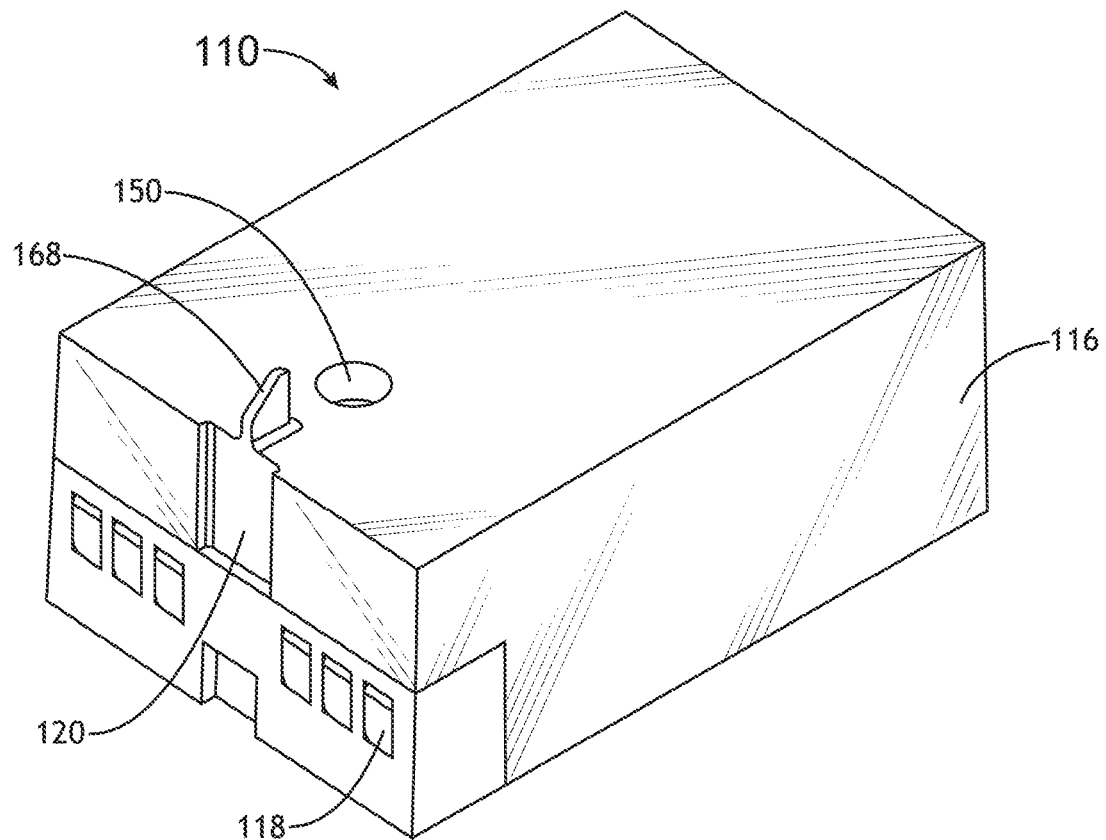
FIG. 4C is an isometric view of the back side of a device control assembly, in accordance with one or more embodiments of the present disclosure.

FIG. 4C is an isometric back side view of a device control assembly 110 illustrating the coupling mechanisms of the device control assembly 110 including a coupling tab 168. In some embodiments, the device control assembly 110 of a modular control unit 100 is configured to interchangeably couple with a backplate 130. For example, the coupling tab 168 may pass through an opening of the backplate 130 to actuate the air gap actuator lock 148 when coupling the device control assembly 110 to the backplate 130.

In some embodiments, the device control assembly 110 includes a user interface 112 to accept one or more input signals. For example, the user interface 112 may include, but is not limited to, a touch-sensitive display. In some embodiments, the device control assembly 110 includes a sensor panel 114 for housing one or more sensors. For example, the sensor panel may, but is not limited to, house a microphone 124, a speaker 126, and/or an occupancy sensor assembly 1205. In some embodiments, the user interface 112 and/or the sensor panel 114 are exposed (e.g. to a user) through the one or more openings 106 of the faceplate 104.

In some embodiments, the device control assembly 110 includes a casing 116 to enclose one or more electronic and/or mechanical components (e.g. components associated with the user interface 112 and display 182, components associated with load regulation, one or more sensors within the sensor panel 114, or the like). In some embodiments, the casing 116 provides a sealed enclosure. Further, access to contents within the casing 116 may be provided via one or more removable panels (not shown).

Figure 4D:
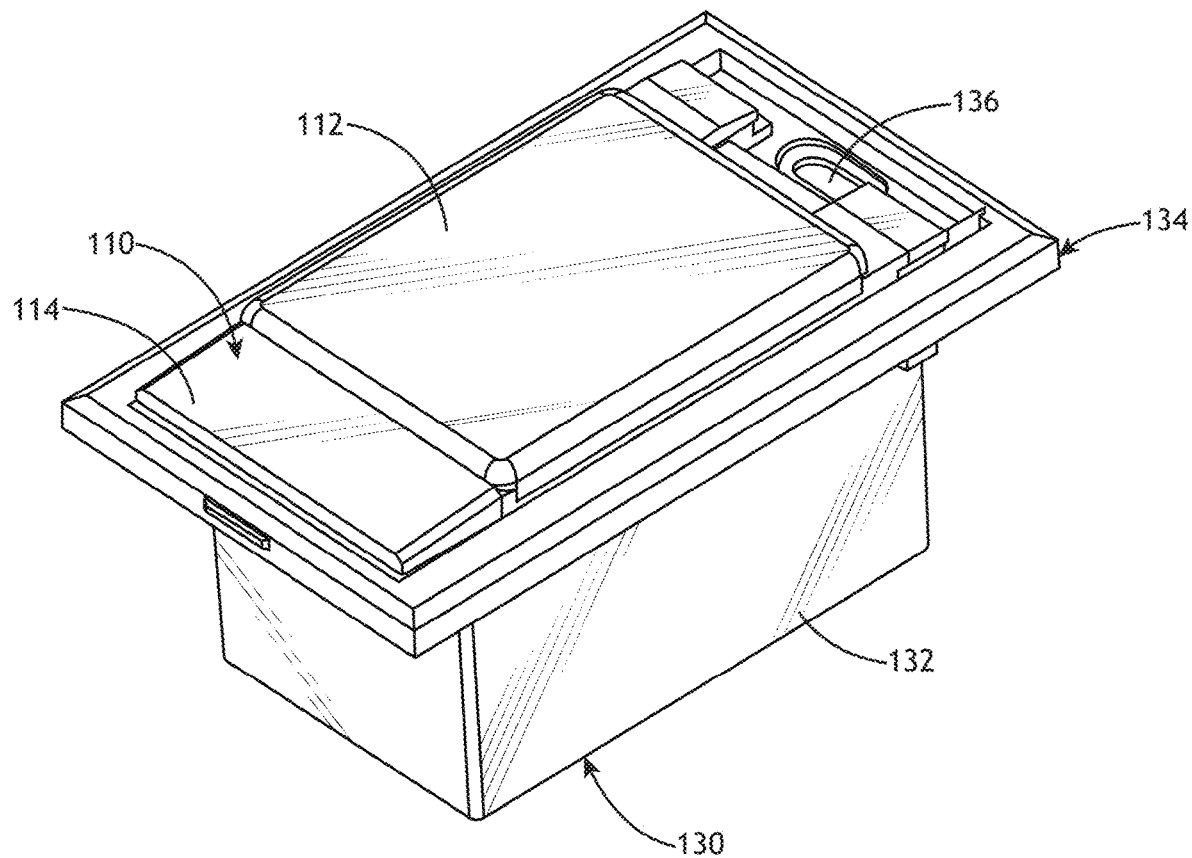
FIG. 4D is an isometric view of a device control assembly coupled to a backplate, in accordance with one or more embodiments of the present disclosure.

FIG. 4D is an isometric view of a device control assembly 110 coupled to a backplate 130, in accordance with one or more embodiments of the present disclosure. In some embodiments, the device control assembly 110 securely fits within the opening 142 of the backplate 130 such that all electrical connections (e.g. contact pads 118) are inaccessible (e.g. to a user).

In some embodiments, the device control assembly 110 includes a user interface 112 to accept one or more input signals. In some embodiments, the device control assembly 110 includes a sensor panel 114 for housing one or more sensors. For example, the sensor panel may, but is not limited to, house a microphone 124, a speaker 126, and/or an occupancy sensor. In some embodiments, the user interface 112 and/or the sensor panel 114 are exposed (e.g. to a user) through the one or more openings 106 of the faceplate 104.

In some embodiments, a modular control unit 100 may include one or more components suitable for wired connections between a backplate 130 and a device control assembly 110. In this regard, data and/or electrical power may be transferred between the backplate 130 and the device control assembly 110. For example, the backplate 130 may contain logic, memory and communication transceiver. For example, the communication transceiver might use a technique such as, but not limited to, one-wire, I2C, SPI, USB, or serial communication interface.

Referring to FIGS. 4A through 4D, in some embodiments, a backplate 130 is configured to interchangeably receive device control assemblies 110. In some embodiments, the backplate 130 includes a casing 132 forming a partially enclosed opening 142 (e.g. a cavity, or the like) to receive a device control assembly 110. In some embodiments, the backplate 130 includes a mounting plate 134. The mounting plate 134 may include one or more mounting holes 136 configured to align with corresponding mounting holes on an electrical junction box 102 (e.g. see FIG. 3). Further, a backplate 130 may be mounted to an electrical junction box 102 by one or more screws via the one or more mounting holes 136. In this regard, the backplate 130 may be semi-permanently mounted to an electrical junction box 102.

In some embodiments, the mounting plate 134 may be secured to the casing 132 by any mechanism known in the art. For example, the mounting plate 134 may be secured to the casing 132 through one or more screws 138. As another example, the mounting plate 134 may be secured to the casing 132 using one or more catches. In this regard, a mounting plate 134 may "snap" onto the casing 132. As a further example, a backplate 130 may include a combined mounting plate 134 and casing 132 such that the mounting plate 134 and casing 132 are formed from a continuous piece of the same material.

It is noted herein that the above description of the modular control unit 100 is provided for illustrative purposes only and should not be interpreted as limiting. For example, the modular control unit 100 may include any combination of a device control assembly 110 and a faceplate 104 or a backplate 130. In some embodiments, the modular control unit 100 includes a device control assembly 110 and a faceplate 104. In this regard, the device control assembly 110 is configured to connect with the electrical wiring system without a backplate 130. In some embodiments, the modular control unit 100 includes a device control assembly 110 and a backplate 130. In this way, the device control assembly 110 fully covers the electrical junction box when coupled with a backplate 130. In some embodiments, the modular control unit 100 includes a device control unit 110 configured to directly connect to the electrical wiring system and fully cover the electrical box.

Figure 5:
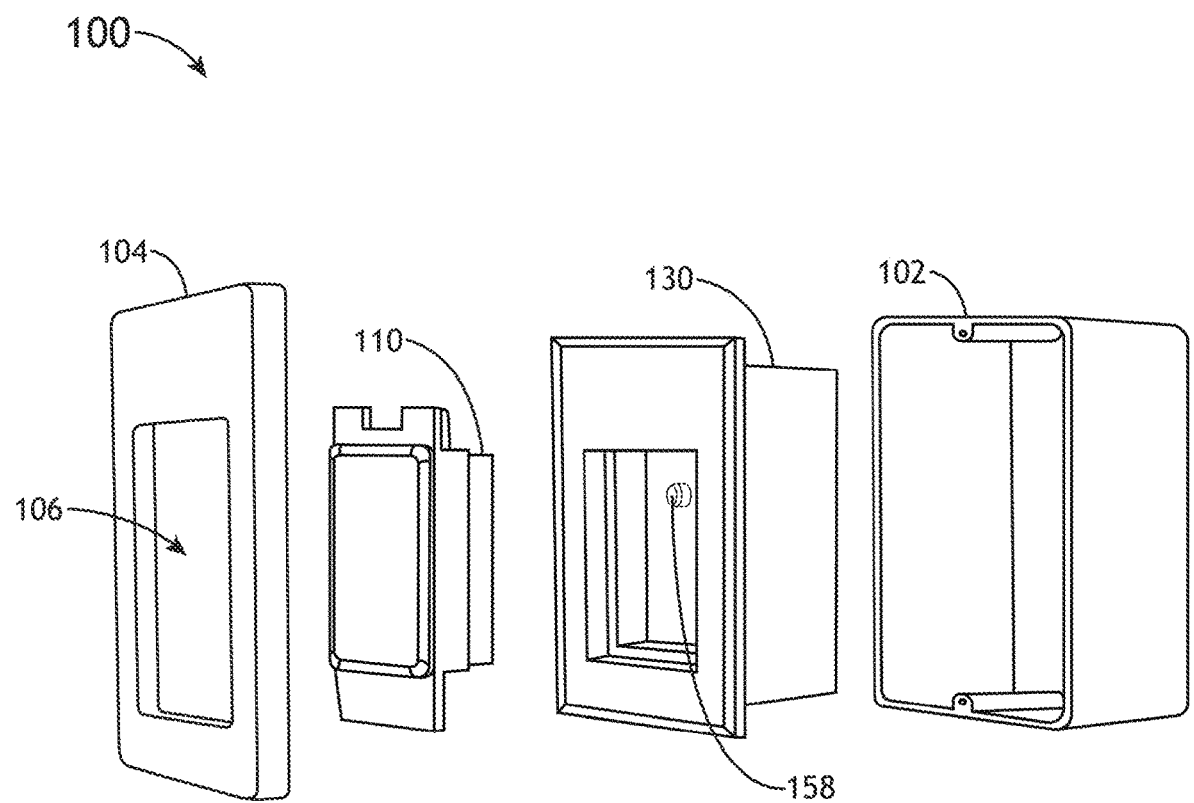
FIG. 5 is an exploded view of a modular control unit configured to mount within an electrical junction box, in accordance with one or more embodiments of the present disclosure.

FIG. 5 is an exploded view of a modular control unit 100 configured to mount within an electrical junction box 102, in accordance with one or more embodiments of the present disclosure. In some embodiments, the modular control unit 100 includes a backplate 130 including a keyed feature 158 configured to mount within an electrical junction box 102 and provide an electrical connection to an electrical wiring system. In some embodiments, a modular control unit 100 includes a device control assembly 110 to control one or more load devices and is configured to removably couple with the keyed feature 158 of the backplate 130.

Figure 6A:
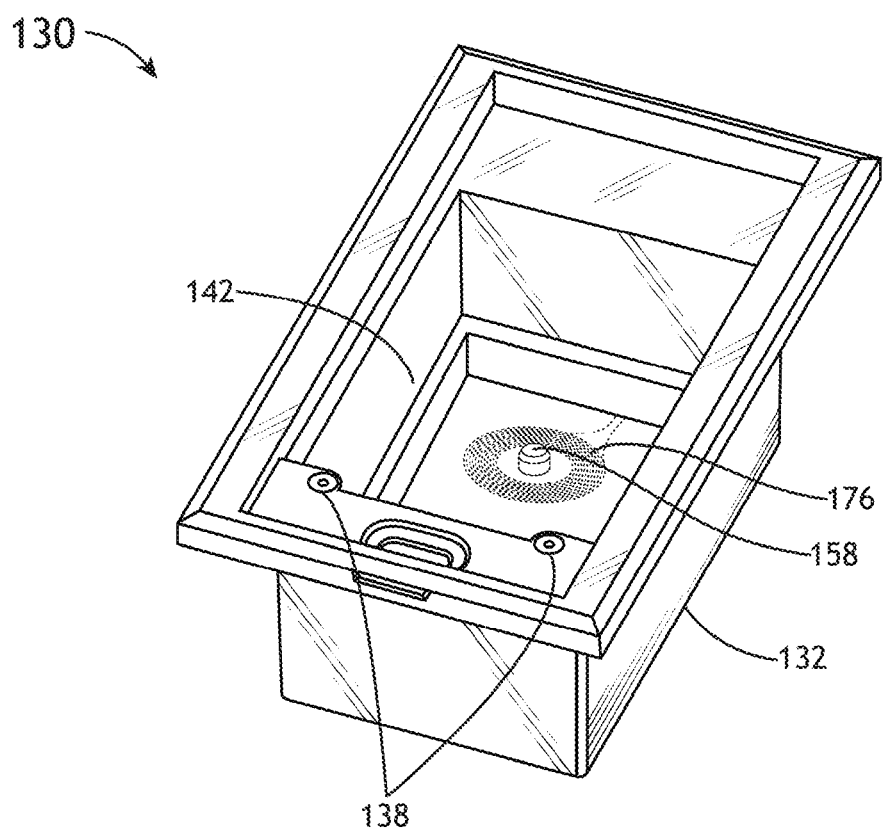
FIG. 6A is an isometric view of a backplate including a rectangular recess and further including an inductance coil, in accordance with one or more embodiments of the present disclosure.

FIG. 6A is an isometric view illustrating a rectangular enclosure backplate 130 including an inductance coil 176 and a keyed feature 158 on the backplate 130. In some embodiments, a modular control unit 100 may include one or more inductance coils to provide data communication and/or power transfer between a backplate 130 and a device control assembly 110. It is noted herein that inductance coils located in the backplate 130 and device control assembly 110 remove electrical contracts and eliminate the need for shielding when a device control assembly is not inserted into a backplate 130. In some embodiments, the backplate 130 includes an inductance coil 176. In some embodiments, the inductance coil 176 performs inductance power transfer between the backplate 130 and the device control assembly 110. In some embodiments, the inductance coil 176 communicatively couples the backplate 130 with the device control assembly 110.

Figure 6B:
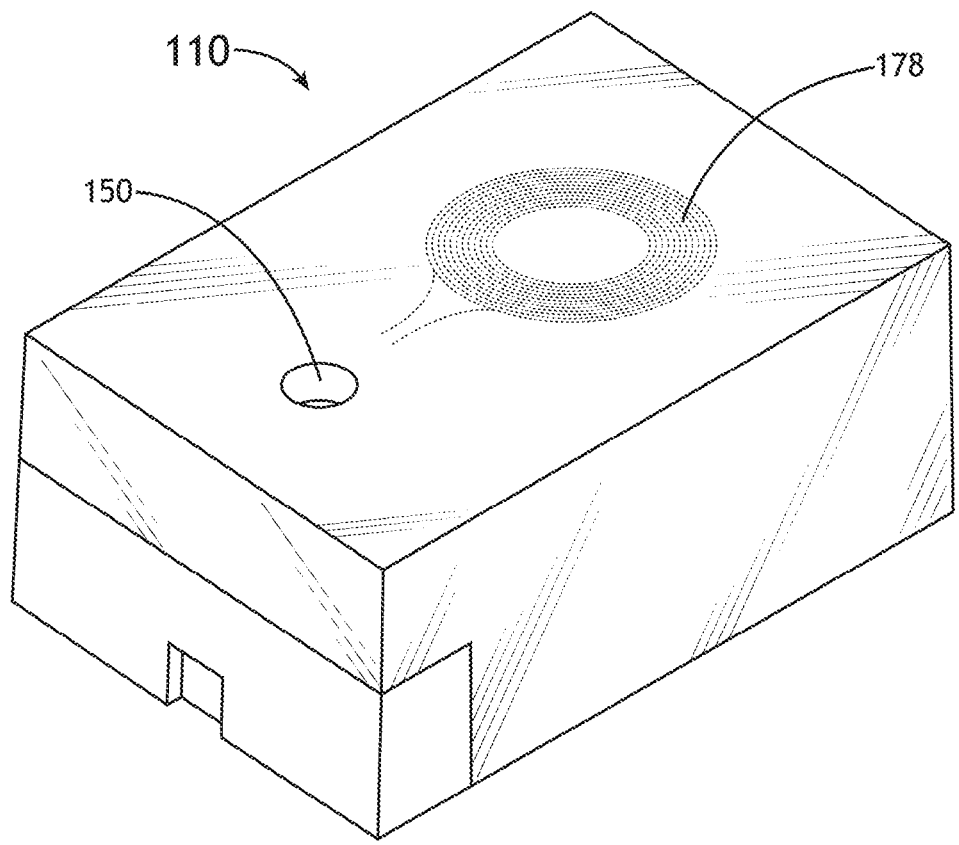
FIG. 6B is an isometric view of the back side of a rectangular device control assembly including an inductance coil, in accordance with one or more embodiments of the present disclosure.

FIG. 6B is an isometric view of a back side of a device control assembly 110 configured with a rectangular housing 132 and including an inductance coil 178 and further including a keyed recess 150 on the backplate 130. In some embodiments, the inductance coil 178 allows inductance power transfer between the backplate 130 and the device control assembly 110. In some embodiments, the inductance coil 178 receives inductance power transfer from the backplate 130. In some embodiments, the inductance coils 176 in the backplate 130 and the inductance coils 178 in the device control assembly 110 communicatively couple the device control assembly 110 and the backplate 130.

Figure 6C:
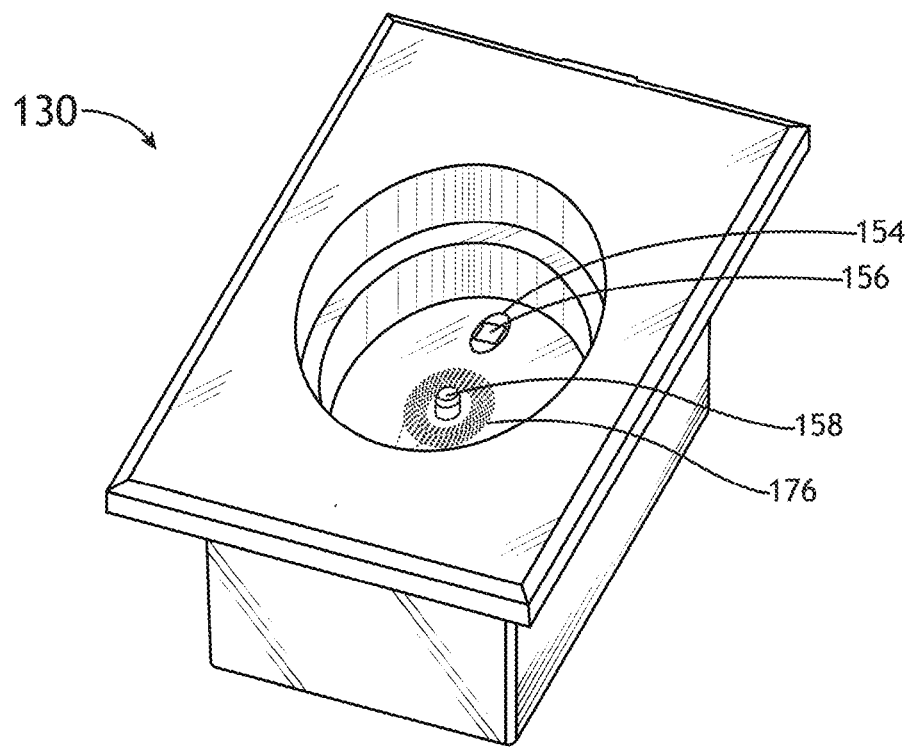
FIG. 6C is an isometric view of a backplate including a rounded recess and further including an inductance coil, in accordance with one or more embodiments of the present disclosure.

FIG. 6C is an isometric view illustrating a rounded enclosure recess backplate 130 including an inductive coil 176 and a keyed feature 158 on the rounded enclosure recess. In some embodiments, the inductance coil 176 performs inductance power transfer between the device control assembly 110 and the backplate 130. In some embodiments, the inductance coil 176 communicatively couples the backplate 130 with the device control assembly 110. In some embodiments, the backplate 130 includes a transparent cover plate 154 placed over an optical reader 156. In some embodiments, the optical reader 156 reads optical marks 159 on the device control assembly 110. For example, as a circular device control assembly 110 is rotated within a backplate 130 the optical marks 159 will move over the optical reader 156 and be scanned.

Figure 6D:
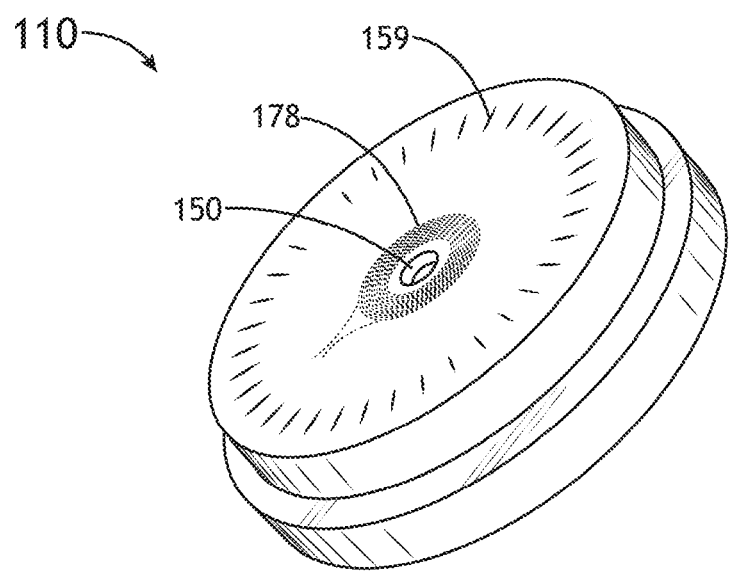
FIG. 6D is an isometric view of the back side of a rounded device control assembly including an inductance coil, in accordance with one or more embodiments of the present disclosure.

FIG. 6D is an isometric view of a back side of a device control assembly 110 configured with a rounded housing. In some embodiments, the device control assembly 110 includes an inductance coil 178 and further includes a keyed recess 150. In some embodiments, the inductance coil 178 receives inductance power transfer from the backplate 130. In some embodiments, the inductance coils 176 in the backplate 130 and the inductance coils 178 in the device control assembly 110 communicatively couple the device control assembly 110 and the backplate 130. In some embodiments, the device control assembly 110 includes a rotary encoder. In some embodiments, the rotary encoder includes a reader and indicative marks. The encoder takes measurements as indicative marks are translated across the encoder and the encoder is able to determine information including, but not limited to, position, speed and distance traveled. In some embodiments, the device control assembly 110 and the backplate 130 include one of an optical encoder, magnetic encoder, capacitive encoder or fiber optic encoder. In some embodiments, the device control assembly 110 includes a masked optical encoder or a phased array optical encoder.

In some embodiments, the device control assembly 110 includes optical marks 159 on the back portion of the device control assembly 110 housing. In some embodiments, the optical marks are lines radially disposed about the back portion of the device control assembly housing. In some embodiments, the optical marks 159 are a pattern disposed circularly about the back portion of the device control assembly 110 housing. In some embodiments, the device control assembly 110 can freely rotate in the backplate 130. In some embodiments, a rotating device control assembly 110 will move the optical marks 159 over the optical reader 156 in the backplate 130 and be scanned.

Figure 7:
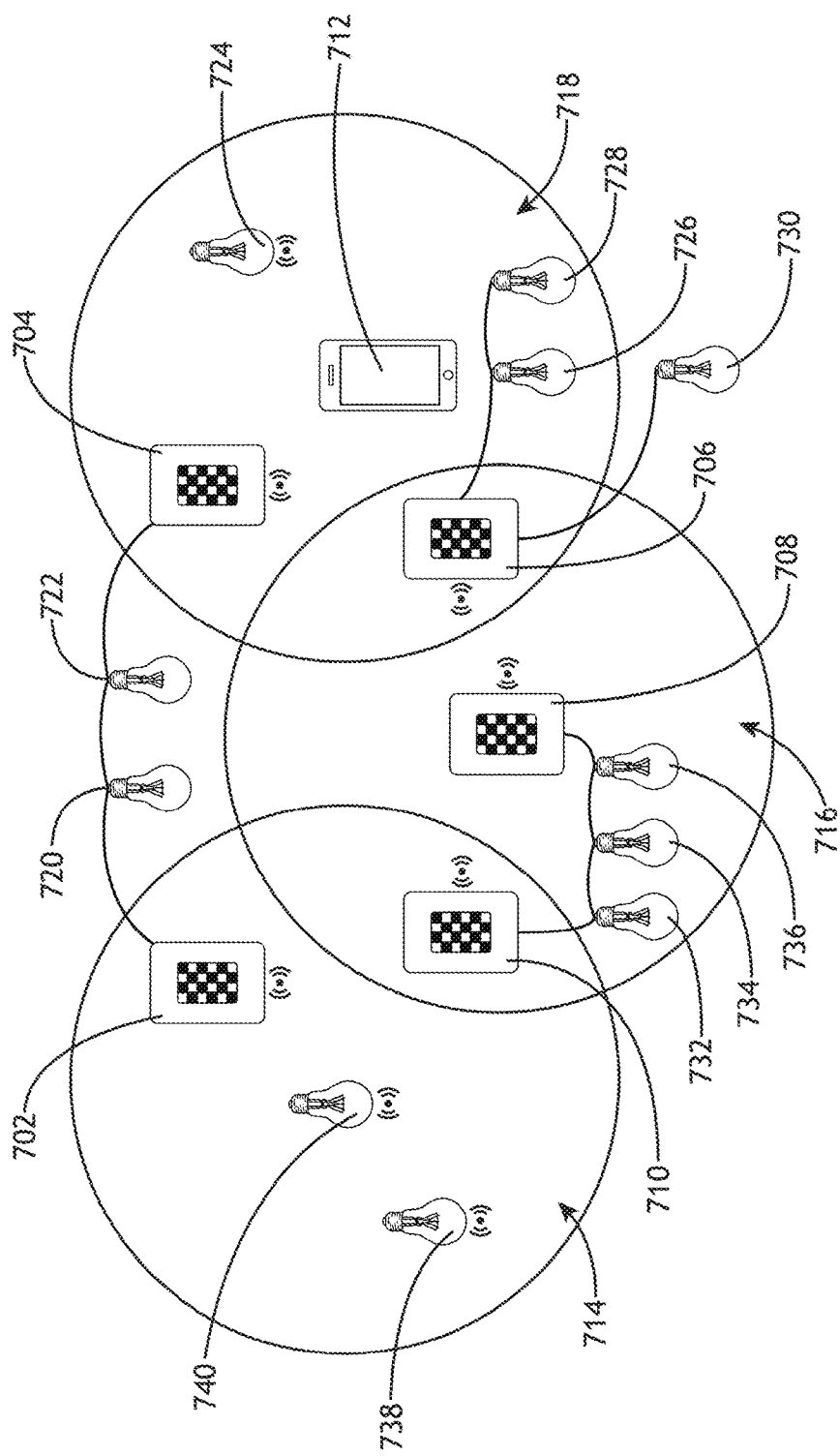
FIG. 7 is an illustration of a configurable network, in accordance with one or more embodiments of the present disclosure

FIG. 7 is an illustration of a configurable network 700, in accordance with one or more embodiments of the present disclosure. It is noted herein that the network 700 described herein is provided solely for illustrative purposes and should not be interpreted as limiting the present disclosure. In some embodiments, the network includes device control assemblies 702-710 and a connected mobile device 712 (e.g. a phone, a tablet, a wirelessly-connected computer, or the like) configured to control one or more load devices 720-740.

In some embodiments, device control assemblies 702 and 704 are physically paired to load devices 720 and 722 and are configured to operate as a three-way switch. In some embodiments, device control assembly 706 is physically paired to load devices 726-730 and is configured to operate as a multi-function keypad to operate load devices 726-728 and load device 730 independently. In some embodiments, device control assemblies 708 and 710 are physically paired to load devices 732-736 and are configured to operate as a three-way switch. Further, device control assembly 708 is configured to always be on, in this way only device control assembly 708 controls the load devices 732-736. In some embodiments, load devices 724, 738, and 740 are wirelessly connected to the network 700 and are further not physically paired with any device control assembly 702-710.

In some embodiments, device control assemblies 702-710 are wirelessly connected within the network 700 via one or more data pathways. In some embodiments, network circuitry and associated network hardware of device control assemblies 110 are configured to connect via a Bluetooth Low Energy (BLE) protocol in a mesh network topology (e.g. a flood mesh topology). In some embodiments, BLE mesh network protocol is used to pass messages between nodes on a network primarily using BLE advertising packets. Further, mobile device 712 and load devices 724, 738, and 740 are nodes within the mesh network 700. In this regard, each node on the mesh network may transmit or retransmit mesh network traffic such that all nodes of the mesh network may communicate (e.g. via single-hop or multi-hop paths). Accordingly, mobile device 712 can be paired with load devices 738 and 740 via the network 700. For example, mobile device 712 may have a data range 718 insufficient to reach load device 738. However, device control assembly 708 may serve as a repeater (e.g. in a flood mesh network). In this regard the data range 716 overlaps with data range 718 of mobile device 712 and data range 714 of load device 738 to provide data communication. In some embodiments, each node can be any device associated with the network. For example, a network node can include any one of a device control assembly 110, mobile phone, tablet, garage door controller, occupancy sensor assembly systems 1200, door/window sensors, temperature sensor 1212, humidity sensor 1210, one or more smoke detectors 1216, carbon monoxide detector 1214, or other remote sensor. In some embodiments, all devices connected to the BLE mesh network are included in a mesh network whether they are a device controller assembly 110 or not. For example, the mesh network could include, but is not limited to, a device controller assembly 110, mobile phone, tablet, television, luminaries, sensors, remote controllers, computers, displays or microphone.

In some embodiments, the mobile device 712 connects to a device control assembly (e.g. device control assembly 706) for communication with load devices 190 within the network 700. In this regard, device control assembly 706 may operate as a bridge to communicate data between the mobile device 712 and any device on the network 700.

It is noted herein that mobile device 712 or, alternately any connected device (e.g. a connected television, a connected electrical appliance, a wearable device, or the like), may not include appropriate hardware to properly communicate on the network 700. However, a device control assembly (e.g. device control assembly 706) may simultaneously connect with the network 700 on a first protocol (e.g. a flood mesh protocol) and a connected device on a second protocol (e.g. a Bluetooth protocol) to provide a bridge for data communication between the connected device and one or more devices on the network 700.

It is noted herein that any number of device pairings between device control 702 assemblies 702-710, mobile device 712, and load devices 720-740 may be established via the configurable network 700. Accordingly, the descriptions of pairings above are intended solely for illustrative purposes and should not be interpreted as limiting.

Figure 8:
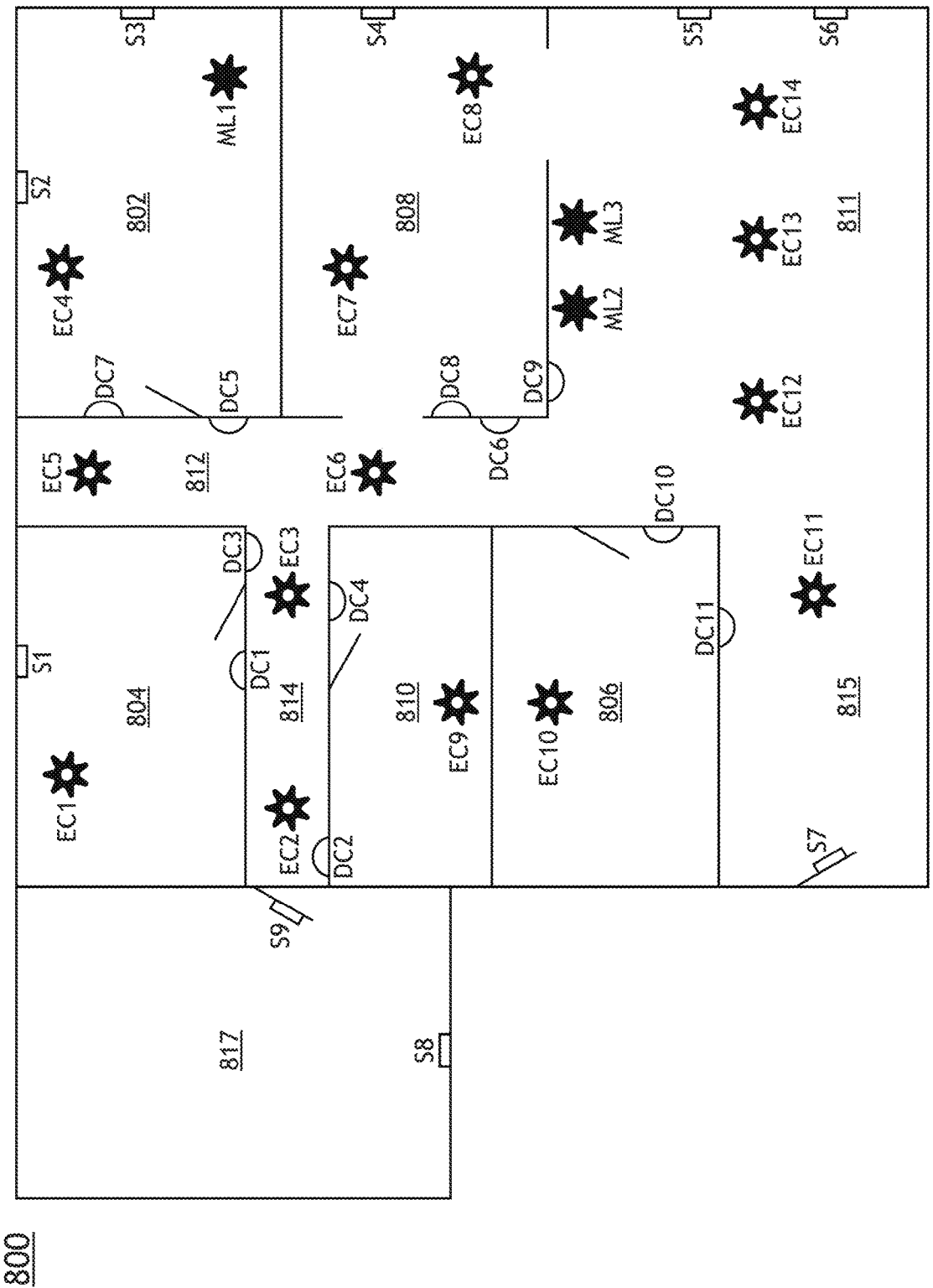
FIG. 8 is an illustration of a configurable network in a household, in accordance with one or more embodiments of the present disclosure.

FIG. 8 is a floor plan 800 of a house that illustrates a configurable network in a household, in accordance with one or more embodiments of the present disclosure. It is noted herein that a device control assembly 110 is illustrated in floor plans throughout this disclosure as a half circle coupled to a wall. In floor plan 800 device control assemblies 110 are labeled DC1-DC11 and are represented by a half circle coupled to a wall. In floor plan 800 door and window sensors (load devices 190) are labeled S1-S9 and are represented by a rectangle coupled to a door or window location. Floor plan 800 illustrates mesh connected luminaries (load devices 190) as an asterisk and labels mesh connected luminaries as ML1-ML3. Floor plan 800 illustrates electrically connected luminaries (load devices 190) as an asterisk with a hole in the middle and labels electrically connected luminaries as EC1-EC14. In some embodiments, the device control assembly 110 is coupled to other components to perform various functions. For instance, the device control assembly 110 may function as a keypad, a light dimmer, a color controller or a light switch. By way of another example, the control device assembly 110 may be coupled to an electrically connected light source or a mesh network connected light source. By way of another example, the device control assembly 110 may be coupled to a mesh network connected device control assembly 110 that is connected to a load device 190. By way of yet another example, the device control assembly 110 may be coupled to a mesh network connected device or sensor (load device 190). By way of yet another example, a device control assembly 110 may be coupled to a group of devices as described herein in any of the aforementioned example. In some embodiments, the device control assembly 110 functions as a light switch and toggles the state of the coupled load device. In some embodiments, a device control assembly 110 includes a color controller that varies the color, light hue, of a lamp. In some embodiments, the device control assembly 110 functions as a dimmer to set the brightness of a coupled load device in accordance to the linearity pattern of the associated load device 190. For example, if a load device 190 is coupled to the device control assembly 110 the energy delivered is limited using a dimmer circuit. For instance, a triode for alternating current (TRIAC) dimmer may be coupled with a load device 190 to lower the luminary level of the device. In some embodiments, the control device assembly 110 coupled to a load device 190 through a mesh network will send a mesh network command to the one or more nodes associated with a load device 190. In some embodiments, multiple device control assemblies 110 may be coupled to the same load device 190 or group of load devices 190. In some embodiments, a device control assembly 110 coupled to a load device will be aware that other device control assemblies 110 are coupled to the same load device 190.

TABLE 1

Example Home Pairing Table

| Device Control Assembly Location | Short Name | Paired Devices and Lighting | | | | | | | |
|---|---|---|---|---|---|---|---|---|---|
| Entry | E1 | L14 | | | | | | | |
| Living Room | LR1 | L12 | L13 | L15 | L16 | L17 | L26 | | |
| Bathroom | B1 | L9 | | | | | | | |
| Kitchen | K1 | L10 | L11 | L26 | | | | | |
| Bedroom 1 | BR1 | L4 | L5 | L21 | L22 | L23 | L24 | L25 | L26 |
| Bedroom 2 | BR2 | L1 | | | | | | | |
| Hallway 1 A | H1A | L6 | L7 | L15 | | | | | |
| Hallway 1 B | H1B | L6 | L7 | L15 | | | | | |
| Hallway 2 A | H2A | L2 | L3 | | | | | | |
| Hallway 2 B | H2B | L2 | L3 | | | | | | |
| Laundry | LA1 | L8 | | | | | | | |

In some embodiments, a mesh network of device control assemblies 110 functions as a three-way or a four-way switch. It is noted herein that traditional three-way light switch configurations may allow for two light switches to dim, or turn on and off a light or group of lights. It is also noted herein that a traditional four-way switch may be used to add more than two switches to a three-way configuration. It is further noted herein that these three-way and four-way switches may require special electrical wiring to control the switches and electrical wiring typically isn't changed after construction of a home unless there is renovation. Table 1 is a table of paired devices and lights L1-L26 to illustrate the various load devices 190 that could exist in various spaces in a house. In some embodiments, three-way switch functionality is achieved, without updating wiring, when two device control assemblies 110 are coupled to the same load device 190. For example, three-way switch functionality is illustrated in Table 1 where the control device assembly 110 in H1A and H1B are connected to lights L6, L7 and L15 and mesh connected the control device assembly 110 LR1, which is electrically connected to light source 15. For instance, actuating control device assembly 110 H1A or H1B toggles the states of lights L6, L7, and L15 if all the lights are in the same state. It is noted herein that light 15 is controllable by control device assembly 110 H1A, H1B and LR1, so the situation is more complicated and such switch behavior is described in Table 2.

TABLE 2

Three-Way Example w/Multiple Groups

| Light State | Switch Actuated | Next Light State |
|---|---|---|
| 6/On, 7/On, 15/On | H1A, H1B | 6/Off, 7/Off, 15/Off |
| 6/On, 7/On, 15/Off | H1A, H1B | 6/Off, 7/Off, 15/Off |
| 6/On, 7/On, 15/Off | LR1 | 6/On, 7/On, 15/On |
| 6/On, 7/On, 15/Off | H1A, H1B | 6/Off, 7/Off, 15/Off |
| 6/Off, 7/Off, 15/Off | LR1 | 6/Off, 7/Off, 15/On |
| 6/Off, 7/Off, 15/Off | H1A, H1B | 6/On, 7/On, 15/On |

In some embodiments, the touch user interface 112 is the primary user interface of the device control assembly 110. Table 3 provides an exemplary illustration of different ways of accessing the different display modes.

TABLE 3

Touch User Interface Interaction Table

| First Input | Display Mode | Next input | Display Indication |
|---|---|---|---|
| Single-Tap | Dimmer | Dim level based on finger location (top = 100%, bottom = 0%) | Dimmer bar lights up with brightness relative to the dim level |
| Double-Tap | Keypad | Scene selection | Scenes |
| Tap and Hold | Notifications | Scene selection | Status of paired devices |
| Double-Tap and Hold | Color Selection | Color Selection, location of finger sets color (see image) | Red, Green, Blue icons |

In some embodiments, different user interface modes are enabled by deadfronting and a touch user interface 112. For example, the device control assembly 110 display 182 may function in the modes of Off, Dimmer, Notification, Color Selection, and Keypad. For instance, each display mode allows the user to interface with different features of the device control assembly 110 and Table 4 describes how a user will interact with a user interface 112 of a control device assembly 110 depending on the display mode to control the Load Under Control (LUC).

TABLE 4

Display Modes and User Interface

Figure 9A:
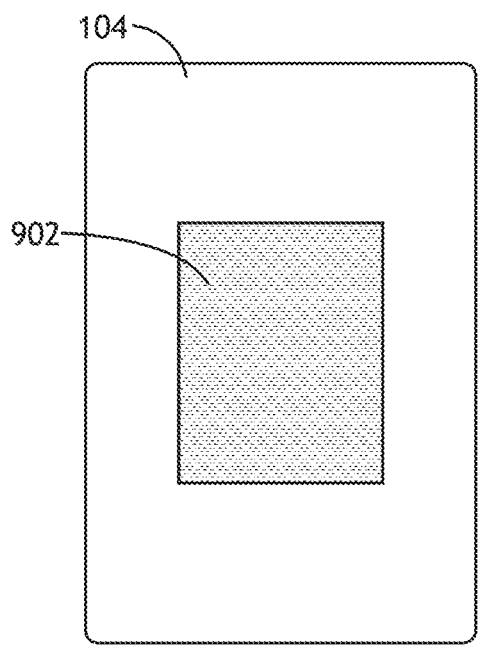
FIG. 9A illustrates an "Off" display mode of a dead front switch, in accordance with one or more embodiments of the present disclosure.
Figure 9B:
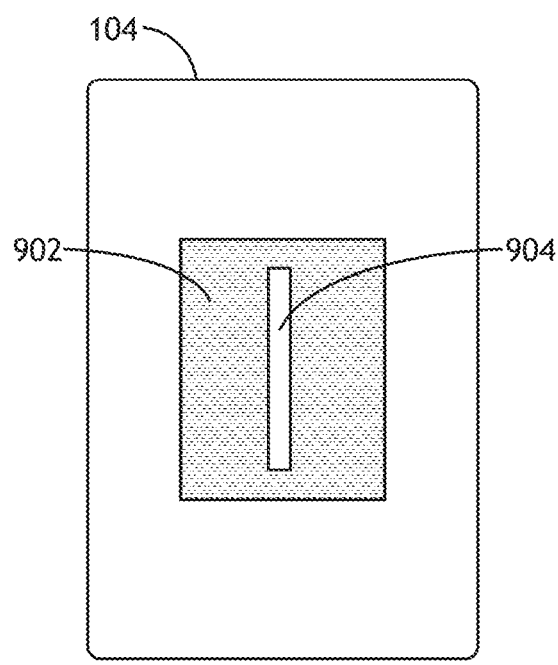
FIG. 9B illustrates a "Dimmer" display mode of a dead front switch, in accordance with one or more embodiments of the present disclosure.
Figure 9C:
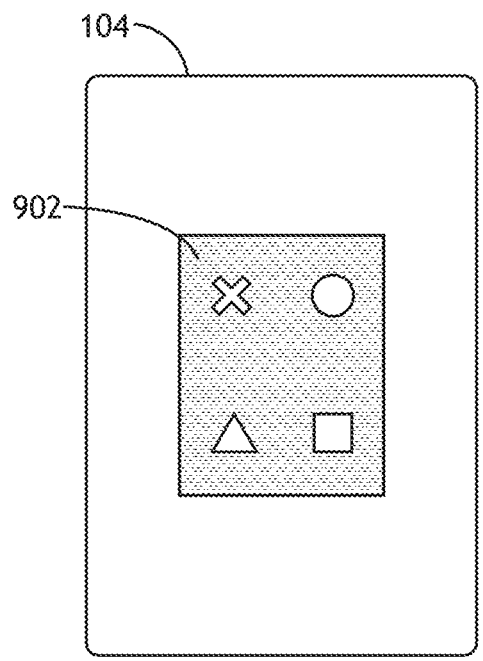
FIG. 9C illustrates a "Keypad" display mode of a dead front switch, in accordance with one or more embodiments of the present disclosure.

| Display Mode | Reference FIG. | Device Control Assembly Usage Scenarios |
|---|---|---|
| Off | FIG. 9A - Display Off | Depress the switch to toggle the LUC (for example from on to off). The display will physically move (travel) and the user will feel and hear a click from the mechanical switch from FIG. 1. Touch the display without the depressing the tactile switch and the state of the display will change depending on the nature of the touch. |
| Dimmer | FIG. 9B - Dimmer | Depress the switch to toggle the LUC (for example from on to off). The display will physically move (travel) and the user will feel and hear a click from the mechanical switch from FIG. 1. Touch somewhere on the display to set the brightness of the LUC. If the LUC is not already turned on the light will turn on to the specified brightness when the touch is lifted off. |
| Keypad | FIG. 9C - Keypad | Depress the switch to toggle the LUC (for example from on to off). The display will physically move (travel) and the user will feel and hear a click from the mechanical switch from FIG. 1. Touch an Icon (i.e. virtual button) on the keypad (FIG. 10) to perform a pre-defined action. An example is turning off all the connected lights in the house. Double-tapping on an icon will change the display to a predefined state for the devices associated to the icon. An example double-tapping on the color change scene, which will allow the user to change the color of a mesh connected RGB LED light using the Color Selection display. |

TABLE 4-continued

Display Modes and User Interface

Figure 9D:
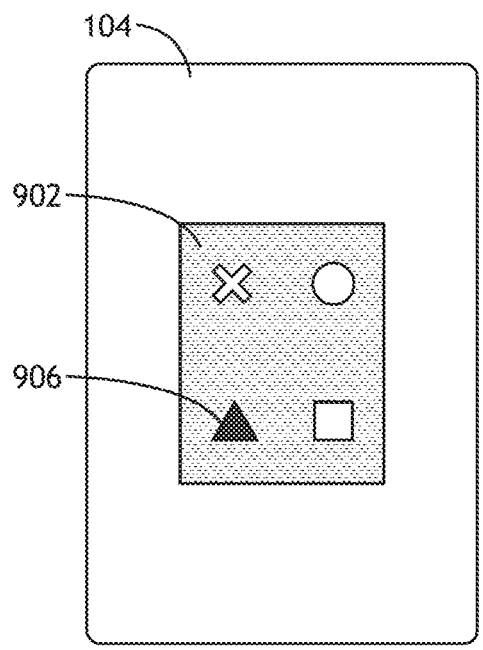
FIG. 9D illustrates a "Notification" display mode of a dead front switch, in accordance with one or more embodiments of the present disclosure.
Figure 9E:
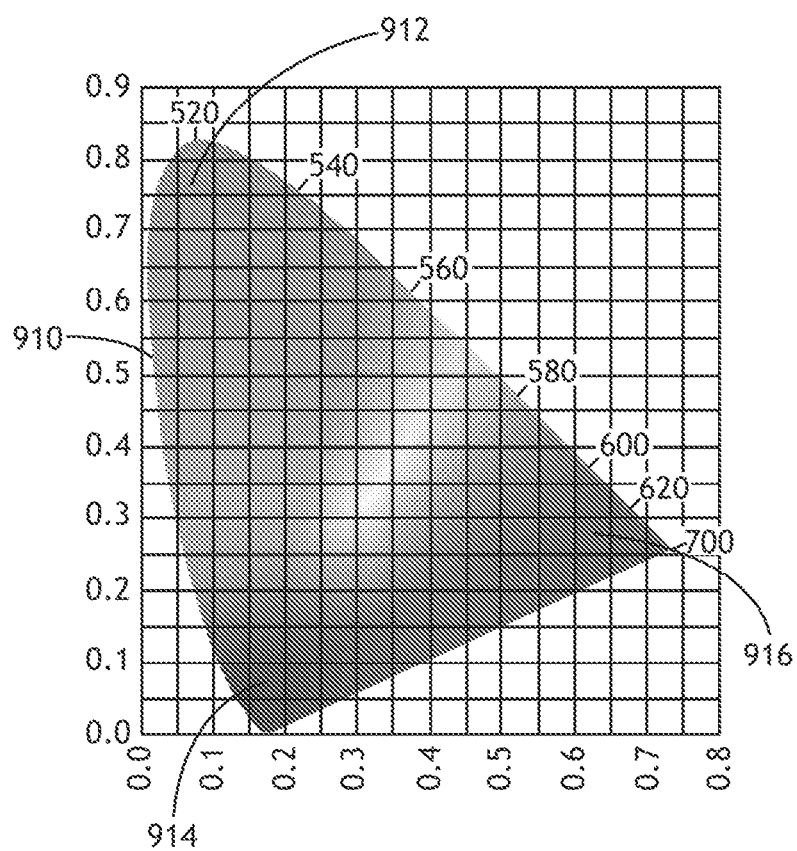
FIG. 9E illustrates the CIE 1931 color space chromaticity diagram chart, in accordance with one or more embodiments of the present disclosure.
Figure 9F:
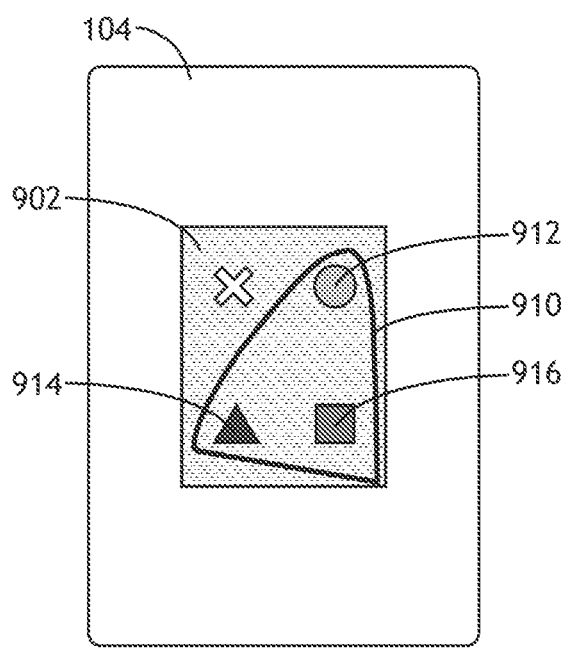
FIG. 9F illustrates a "Color Selection" display mode of a dead front switch, in accordance with one or more embodiments of the present disclosure.

| Display Mode | Reference FIG. | Device Control Assembly Usage Scenarios |
| --- | --- | --- |
| Color Selection | FIG. 9F - Color Selection | Depress the switch to toggle the LUC (for example from on to off). The display will physically move (travel) and the user will feel and hear a click from the mechanical switch from FIG. 1. The Red, Green and Blue colored icons form a triangle that approximates the 1931 CIE color chart. The location of the finger as it moves around the color chart sets the color of any RGB in the LUC. |
| Notification | FIG. 9D - Notification | Depress the switch to toggle the LUC (for example from on to off). The display will physically move (travel) and the user will feel and hear a click from the mechanical switch from FIG. 1. The notification display will indicate the status of devices if they meet notification criteria i.e. if the garage door is open at 10PM, the triangle will blink Red and the user can tap the triangle icon to close the garage door. |

FIG. 9A is a front profile view of the faceplate and display that illustrate an "Off" display mode of a display/trackpad 902 (user interface 112). FIG. 9B is a front profile view of the faceplate and display that illustrates a "Dimmer" display mode 904 of a display/trackpad 902. FIG. 9C is a front profile view of the faceplate and display that illustrates a "Keypad" display mode of a display/trackpad 902. FIG. 9D is a front profile view of the faceplate and display that illustrates a "Notification" display mode of a display/trackpad 902 where the notification is indicated as a triangle 906 illuminated by a red backlight 248. In some embodiments, a user may interact with a blinking shape on the display 182 (e.g. via a tap, a double tap, or the like) to respond to the notification. For example, the triangle 906 may blink red to indicate that a door (e.g. a garage door, a front door, or the like) is open or unlocked. In response, the user may tap the triangle 906 to close the garage door, or lock the front door, and reset the notification (e.g. return the triangle 906 to a nominal illumination profile). In some embodiments, each shape may indicate a different notification (e.g. an open door, an open window, a missed telephone call, or the like). Further, each shape may illuminate with any number of illumination profiles (e.g. combinations of color and intensity) to indicate any number of notifications. FIG. 9E is a front profile view of the faceplate and display that illustrates the CIE 1931 color space chromaticity diagram chart 910 with green wavelengths 912, blue wavelengths 914, and red wavelengths 916. FIG. 9F is a front profile view of the faceplate and display that illustrates a "Color Selection" display mode of a display/trackpad 902 including the 1931 CIE color chart 910 superimposed over the display/trackpad 902. In some embodiments, an approximation of the CIE 1931 color space chromaticity diagram chart 910 is superimposed over the display/trackpad 902 and positions the green wavelengths 912 over the circle image, the blue wavelengths 914 over the triangle image, and the red wavelengths 916 over the square image. In some embodiments, users select a color for the display from the approximation of the 1931 CIE color chart 910 on the display/trackpad 902.

Figure 10A:
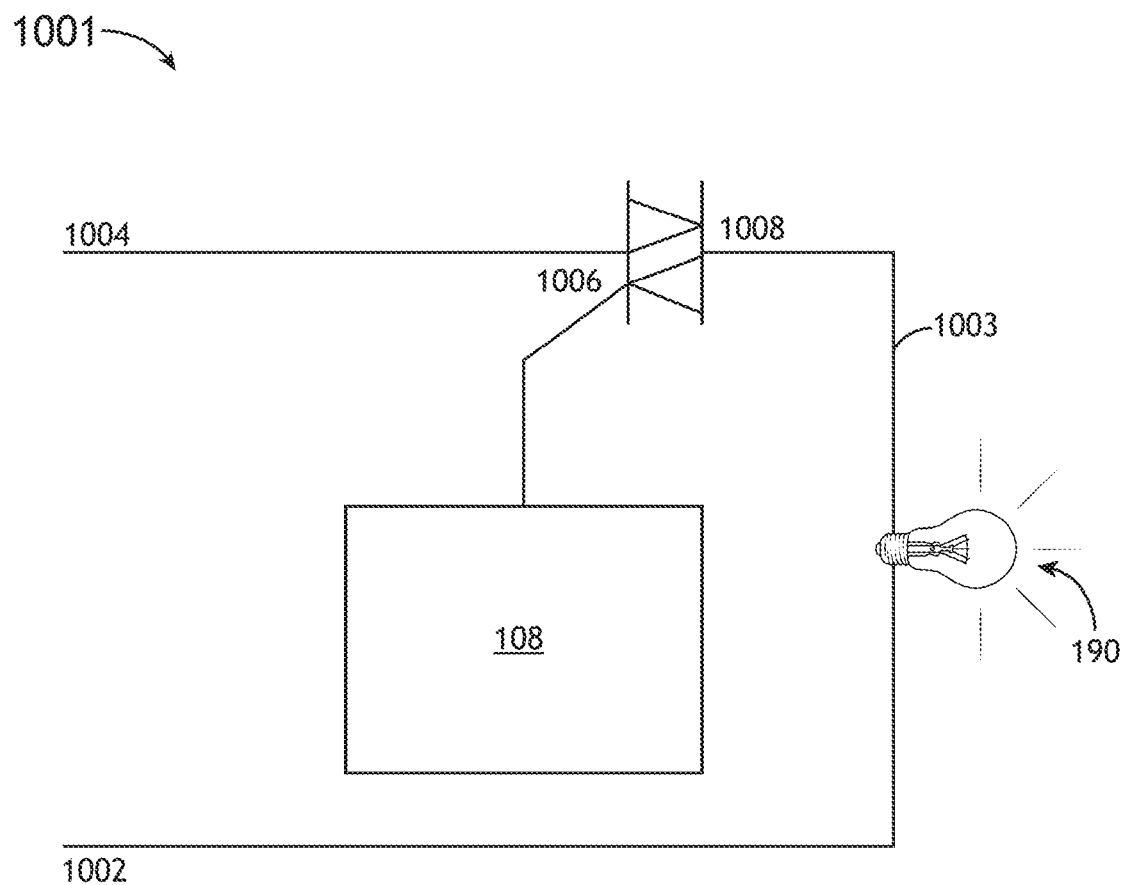
FIG. 10A illustrates a diagram of a dimmer circuit, in accordance with one or more embodiments of the present disclosure.
Figure 10B:
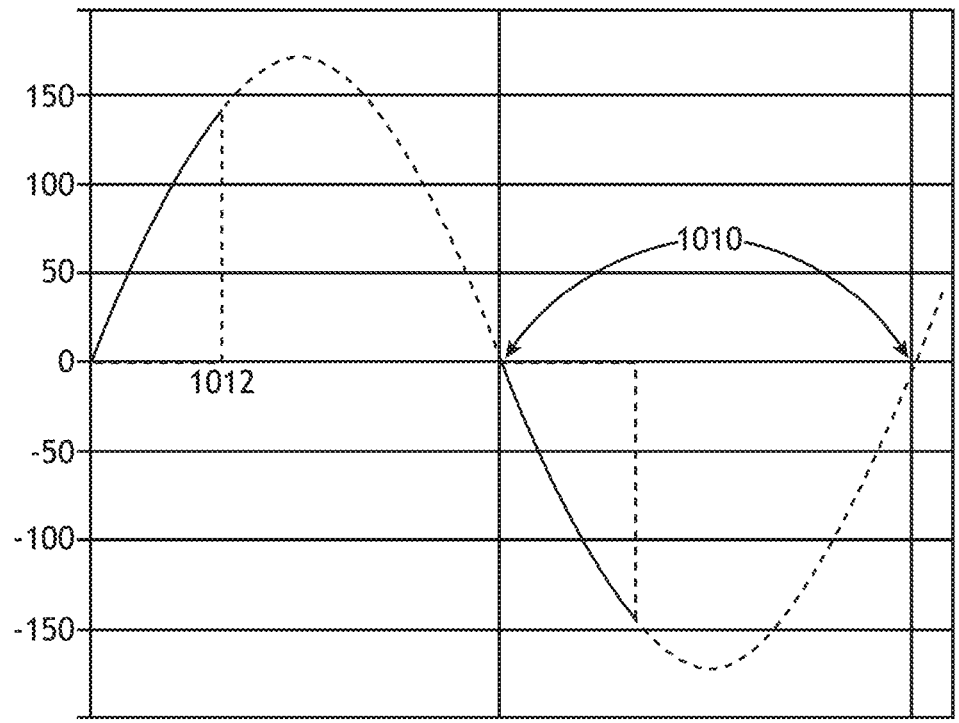
FIG. 10B illustrates a graph of a dimmer circuit phase response, in accordance with one or more embodiments of the present disclosure.
Figure 10C:
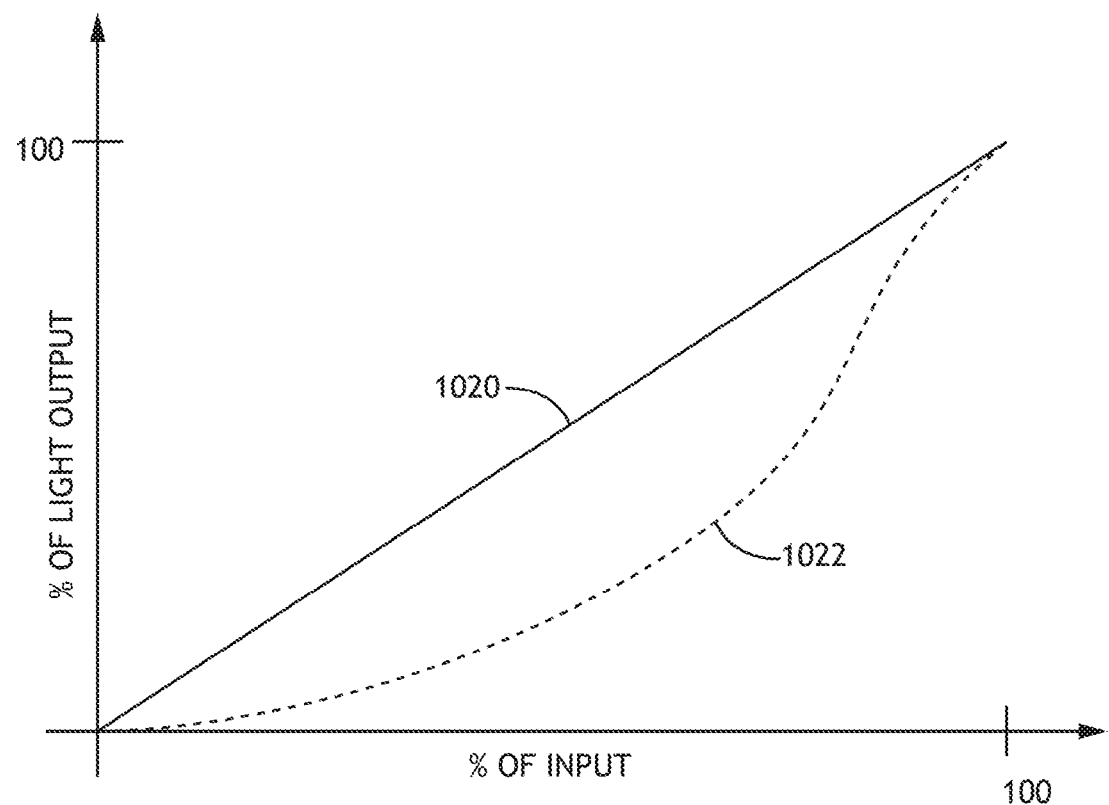
FIG. 10C illustrates a graph plot of the linearization pattern when dimming an incandescent light source, in accordance with one or more embodiments of the present disclosure.

In some embodiments, the device control assembly 110 has an electronic lighting dimmer circuit 1001 that controls the amount of current delivered to a load device 190. For example, a TRIAC-based dimmer circuit converts the requested dim level to an AC-line phase angle. In some embodiments, the requested dim level of a load device 190 is set by the user. In some embodiments, the dim level is determined by the device control assembly 110. FIG. 10A is a circuit diagram that illustrates a dimmer circuit 1001 that detects the zero-crossing 1010 of the waveform of an AC-line 1004 with respect to ground 1002. FIG. 10B is an AC waveform phase diagram that illustrates the associated analysis of the waveform phase angle 1012 by FIG. 10A. In some embodiments, the lighting controller system 108 detects a zero-crossing 1010 and counts to a time delay equal to the phase angle 1012 and then drives the gate 1006 of the TRIAC 1008 which allows current to flow through the TRIAC 1008. It is noted herein that the TRIAC 1008 dimmer only works on electrically connected load devices 190. In some embodiments, the dimming level can also be expressed as a percentage of the half-cycle instead of the phase-angle. It is noted herein that the AC-line will have a lower average voltage level 1003 entering the load device 190 which results in the dimming effect on the load device 190.

In some embodiments, the device control assembly 110 is able to detect the type of load device 190 it is coupled to. For example, a device control assembly 110 may detect if the load device 190 is a compact fluorescent, incandescent or Light Emitting Diode (LED). In some embodiments, the load device 190 is connected to the device control assembly 110 by direct wiring. In some embodiments, the load device 190 is connected to the device control assembly 110 by a magnetic low-voltage transformer. In some embodiments, the load device 190 is connected to the device control assembly 110 by an electronic low voltage transformer. In some embodiments, the device control assembly 110 can determine if the load device 190 is dimmable or not. In some embodiments, the type of load device 190 can be detected by measuring the current through the load device 190 over time and matching the current levels to a known current vs. time profile. In some embodiments, a light sensor is utilized to determine if a load device 190 connected to the device control assembly 110 is dimmable. In some embodiments, the lighting controller system 108 selects a linearization pattern 1020 tuned to the load device 190 coupled to the device control assembly 110. In some embodiments, the lighting controller system 108 adjusts the luminary level of a load device 190 in accordance with the linearization pattern 1020 chosen for the specific load device 190 being adjusted. FIG. 10O is a luminary device light level plot diagram that illustrates the normalization lighting curve for an incandescent load device 190. It is noted herein that the optimal linearization pattern changes depending on the type of load device. It is further noted herein that the linearization pattern for one type of load device will not function to linearize another type of load device. In some embodiments, a linearization pattern normalizes the amount of light generated at each dimming level. For example, as a load device receives increasing amounts of energy it is observed by a user that the lighting level in a room increases in a constant ramping manner. It is noted that without linearization the dimming pattern of a load device 190 will dim or brighten in a non-linear manner 1022. In some embodiments, when the type of load device 190 connected to a device control assembly 110 changes the linearization pattern applied to the load device 190 is also changed. For example, if an LED load device was replaced with an incandescent light the device control assembly 110 may identify the new load device 190 and apply the linearization pattern to produce a linear dimming curve for an incandescent light. In some embodiments, a load device 190 may be identified by the electrical current properties measured for the new load device 190 when it is inserted into the device control assembly 110. In some embodiments, a user may be prompted to select the load device 190 type in a mobile phone application controlling the device control assembly 110. In some embodiments, a light sensor is used to measure the light output from a load device and by comparing the expected light level to measured light levels make adjustments to the dimming percentage to configure light levels to agree with expectations.

Figure 11:
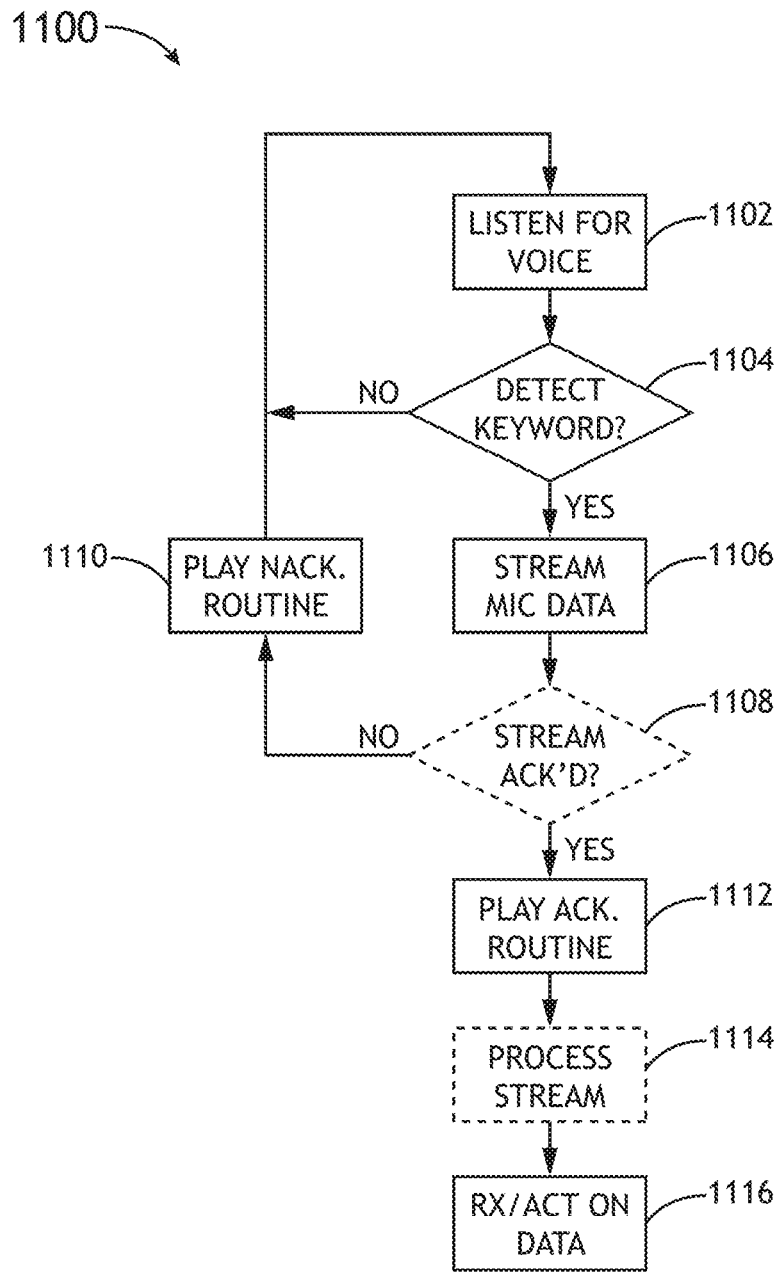
FIG. 11 illustrates a flow chart of the steps to record and process voice commands, in accordance with one or more embodiments of the present disclosure.

In some embodiments, the device control assembly 110 records voice commands and sends them to a predetermined voice service for processing. For example, a service for voice processing could be Sir, Cortana or Alexa. For instance, the device control assembly 110 may listen for a keyword such as "Deako" and then starts streaming to the voice service. In some embodiments, the voice service receives the voice stream and processes the request and acknowledges receipt of the stream. FIG. 11 is a flow chart that illustrates the steps taken to notify the user whether their voice stream process request was received and accepted or not. In some embodiments, the acknowledgement (Ack) and no-acknowledgement (Nack) routine 1100 notifies the user of the status of their voice stream request by a notification including, but not limited to, playing a tone, flashing a green light, or flashing a red light. In some embodiments, the voice service streams back a voice response played by the device control assembly 110. In some embodiments, a command packet is decoded by the device control assembly 110 as a user action. For example, a command packet may indicate to the device control assembly 110 that the user has requested all the lights in the house be turned off.

In some embodiments, the device control assembly 110 includes WiFi circuitry 170 or a device to make a connection to the Internet. For example, the device control assembly 110 may include a bridge or access point hub to communicate with a home WiFi network. By way of another example, the access point hub may integrate into the device control assembly 110 and be integrated in the mesh network. For instance, each device control assembly 110 may use one or more access point hubs to connect to the Internet. By way of another instance, a separate access point hub device may connect to the device control assembly 110 mesh network and the Internet. In some embodiments, the device control assembly 110 processes the voice command locally. In some embodiments, the device control assembly 110 processes data from the microphone to pick out vocal commands. For example, a vocal command may start with a keyword followed by a command instruction. For instance, the keyword may be "Deako" which would then be followed by a command like turn off kitchen lights. In some embodiments, the device control assembly 110 uses speaker-independent speech recognition software to translate spoken words into text strings. In some embodiments, automatic speech recognition software may be employed (e.g. CMU Sphinx). In some embodiments, deep neural network (DNN) approaches are utilized to recognize speech.

In some embodiments, a keyword verbally spoken is the sole action of the command. It is noted herein that longer keywords are easier for speech recognition systems to identify which results in fewer missed commands. For example, a longer keyword such as "Deako Toggle Lights" may be defined to achieve the simplified interface and higher accuracy speech recognition. For instance, each time "Deako Toggle Lights" is identified by the device control assembly 110 the state of the lights will be toggled. By way of another instance, if the keyword "Deako Toggle Lights" is identified by the device control assembly 110 and the lights were on, the device control assembly 110 would turn the lights off. By way of another instance, if the keyword "Deako Toggle Lights" is identified by the device control assembly 110 and the lights were off, the device control assembly 110 would turn the lights on. In some embodiments, if the load devices 190 are dimmed the dimming level is maintained when a toggle command is give. For example, if the load device 190 is at a 60% on level and a toggle command was given the load device would be configured to a 60% off level.

In some embodiments, a universal serial bus (USB) hub can be coupled to the backplate 130 of a device control assembly 110. For example, a USB hub configured with one or more USB charger ports may be plugged into the device control assembly 110 backplate 130. In some embodiments, the USB hub has a mechanism for mounting commercially available devices (e.g. Apple iPad, Samsung Galaxy S5 phone, or Amazon Kindle Fire). In some embodiments, commercially available devices connected to the USB hub may be equipped with an application to configure the devices to bridge between the BLE Mesh network and WiFi connections in place of the device control assembly 110 WiFi circuitry 170. In some embodiments, the USB hub includes a device control assembly 110.

The tablet holder plugs into the backplate 130, has one or multiple USB charger ports and has a mechanism for mounting commercially available devices, such as an Apple iPad, Samsung Galaxy S5 phone, or Amazon Kindle Fire. These devices, when equipped with an application that configures it as such, can be used as bridges between the BLE Mesh network and WiFi in place of a device control assembly 110 (FIG. 16) or WiFi to BLE bridge. The Tablet Holder may also include a device control assembly 110.

Figure 12:
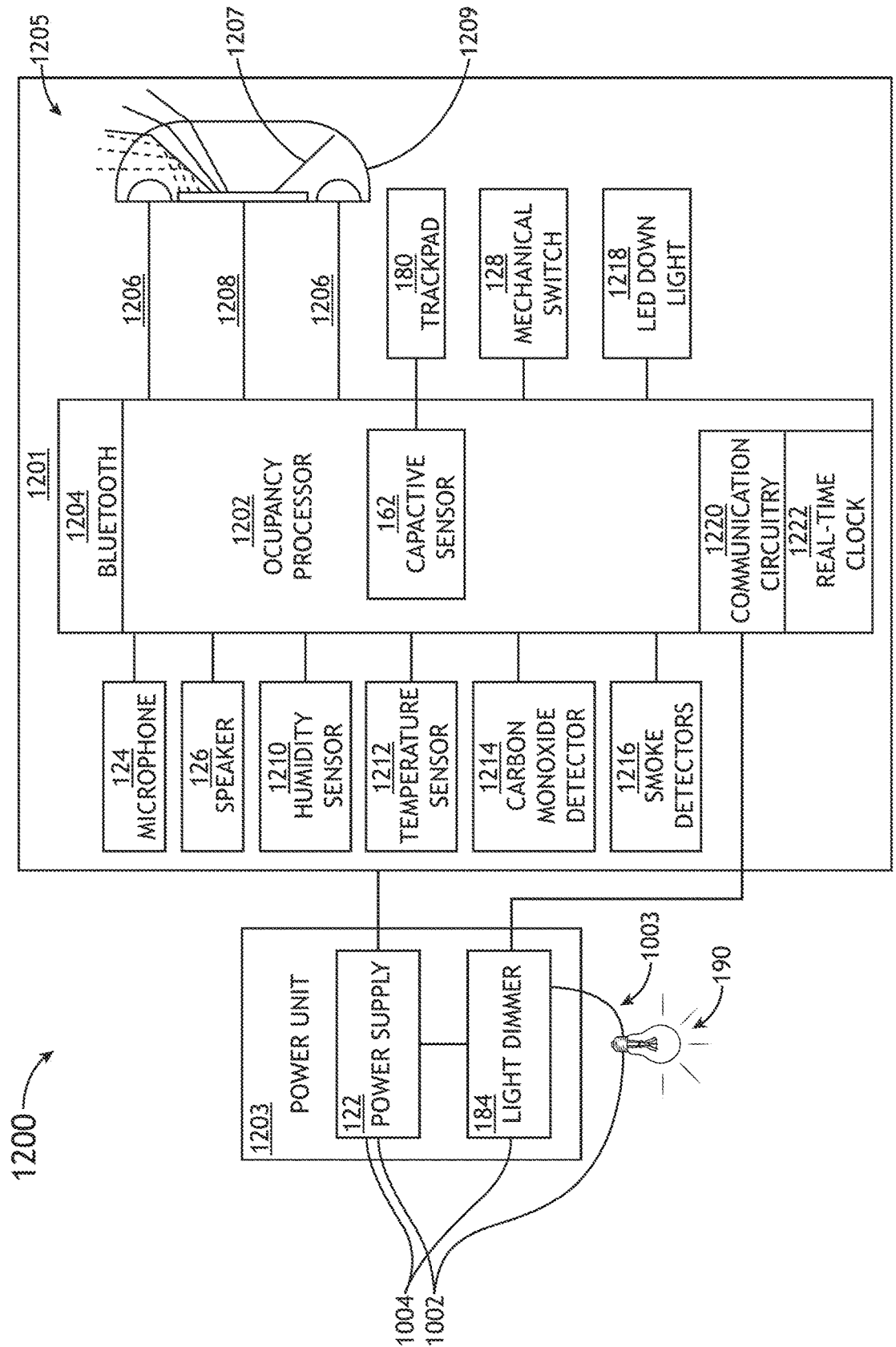
FIG. 12 illustrates a block diagram of components of an Active Infra-Red Occupancy Sensor assembly, in accordance with one or more embodiments of the present disclosure.

FIG. 12 is a block diagram that illustrates the components that make up a device control assembly 110 including an Active Infra-Red Occupancy Sensor assembly system 1200. In some embodiments, the device control assembly 110 is designed in two parts. In some embodiments, the device control assembly 110 includes a front control unit 1201 and a back power unit 1203. In some embodiments, a device control assembly 110 includes an occupancy sensor assembly 1205. In some embodiments, a control unit 1201 includes an occupancy sensor assembly 1205. In some embodiments, an occupancy sensor assembly 1205 includes an occupancy processor 1202 and a sensor assembly 1208. In some embodiments, the power unit 1203 includes a light dimmer 184. In some embodiments, the power unit 1203 includes power monitoring circuitry and an AC/DC power supply. In some embodiments, the power unit 1203 includes power line and communication circuitry. In some embodiments, the control unit 1201 includes a real-time clock 1222. In some embodiments, the control unit 1201 includes an LED down light 1218. In some embodiments, the control unit 1201 and the power unit 1203 are coupled through wireline to communicate and power the control unit 1201. In some embodiments, communication signals from communication circuitry 1220 are used to verify the authenticity of a control assembly. For example, a control assembly not designed to work with the power unit 1203 in an installation will not be powered.

In some embodiments, a device control assembly 110 maintains the lights in a room on while the room is occupied by a person. In some embodiments, the lights in a room are turned off by a device control assembly 110 when the room is no longer occupied by a person. It is noted herein that traditional room occupancy switch detection systems utilize a pyroelectric infrared (PIR) sensor. It is additionally noted herein that PIR sensors are unreliable as occupancy detector because they require a person to be in the field of view (FOV) and also moving to be detected. It is further noted herein that as the distance from the sensor increases the PIR sensor detection effectiveness decreases. In some embodiments, the occupancy sensor assembly 1205 includes one or more IR emitters 1206. In some embodiments, the occupancy sensor assembly 1205 includes a sensor assembly 1208. In some embodiments, the sensor assembly 1208 includes a camera. In some embodiments, the camera includes a CCD sensor. In some embodiments, the camera includes a CMOS sensor. It is noted herein that a CMOS sensor is sensitive to both visible wavelengths as well as IR light. In some embodiments, the sensor assembly 1208 includes a tri-field lens (TFL) 1209.

Figure 13:
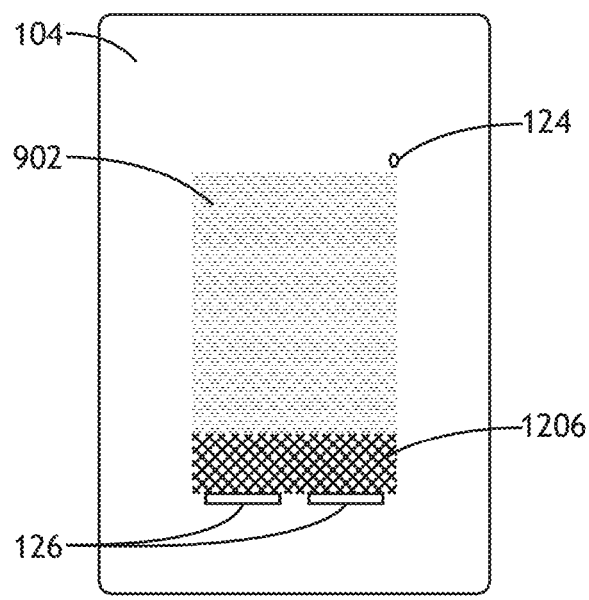
FIG. 13 illustrates the front surface of an Active Infra-Red Occupancy Sensor assembly, in accordance with one or more embodiments of the present disclosure.

FIG. 13 is a front profile view of the faceplate and display that illustrates the front surface of an occupancy sensor assembly system 1200. In some embodiments, the occupancy sensor assembly system 1200 includes a microphone 124. In some embodiments, the occupancy sensor assembly 1205 includes an occupancy processor 1202. In some embodiments, the occupancy sensor assembly 1205 detects an occupant in a space even when a person is stationary or outside of the field of view of the sensor assembly 1208.

In some embodiments, the one or more IR emitters 1206 illuminate the room in IR light for a period of time. In some embodiments, the TFL 1209 is constructed from a solid transparent material that is configured to create mirror-like refractive surfaces. In some embodiments, the TFL 1209 creates three different sections on the image sensor such that the outside sections are mirrored in one axis compared to the middle sections. In some embodiments, the mirrors 1207 in the TFL 1209 create a nearly 180 degree FOV. It is noted herein that the outside sections of the TFL 1209 are distorted like in a fish-eye lens. In some embodiments, the microphone 124 is used to listen to ambient noise in a space to determine if the noise indicates occupancy by a person.

Figure 14:
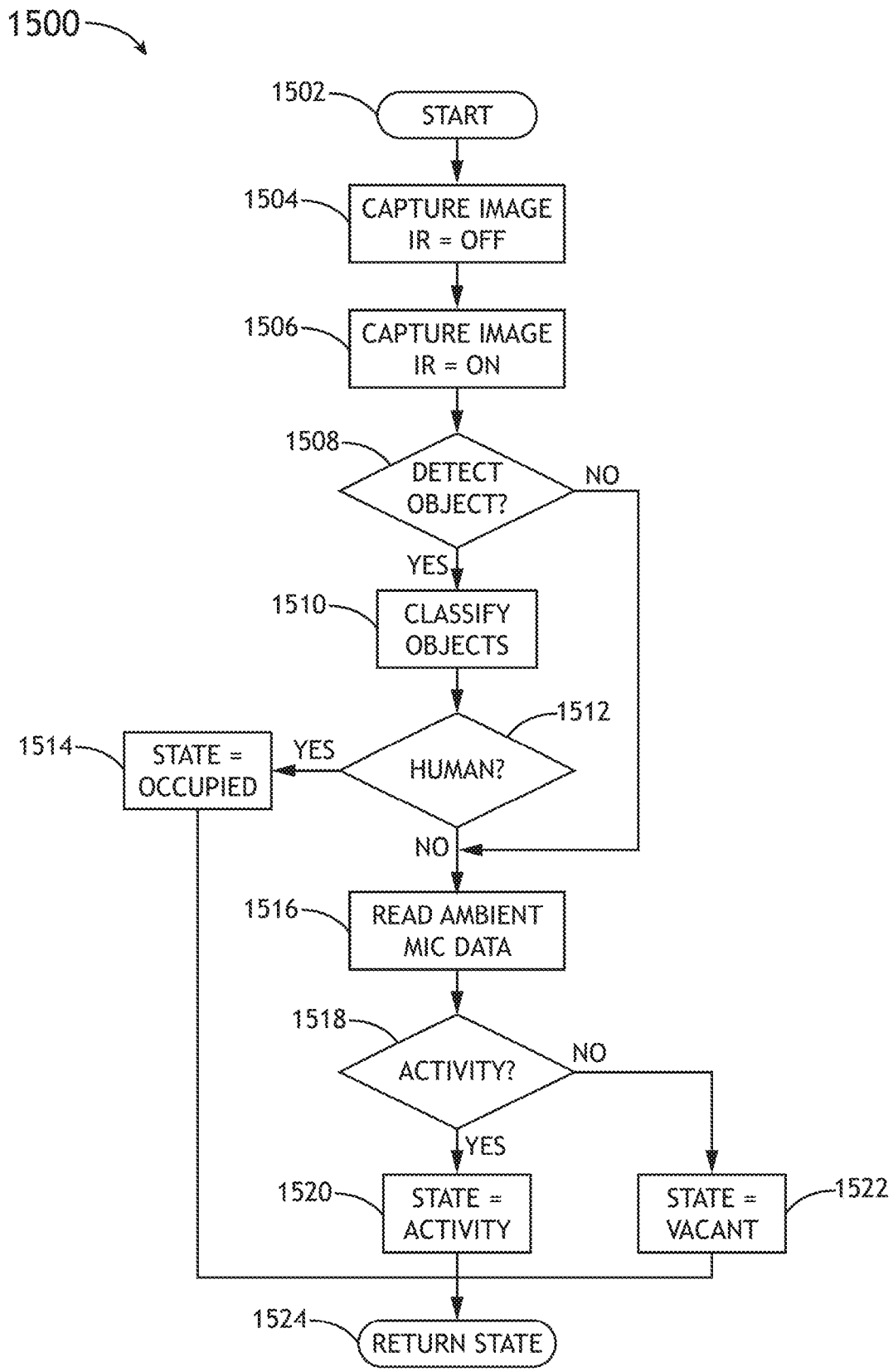
FIG. 14 illustrates a flow chart of the steps followed by the occupancy sensor assembly system to detect an occupant in a room, in accordance with one or more embodiments of the present disclosure.

In some embodiments, the occupancy processor 1202 performs image processing. In some embodiments, the occupancy processor 1202 performs occupancy detection and vacancy detection. In some embodiments, image processing is used to transform an image and compensate for distortion due to the TFL 1209. FIG. 14 is a flow diagram that illustrates the steps of occupancy detection. In some embodiments, a room is illuminated by IR light as images are acquired by the camera. It is noted herein that IR illumination allows viewing the room in a uniform manner regardless of the current ambient light level. In some embodiments, the CMOS sensor captures an image with and without the one or more IR emitters 1206 illuminating the space. In some embodiments, the occupancy processor determines a third image by taking the difference of two acquired images. For example, the difference is taken of two acquired images where one image is taken of the space illuminated by the IR emitters 1206 and the other image was taken without the space being illuminated by the one or more IR emitters 1206. In some embodiments, the occupancy processor 1202 renders an image free from variations due to ambient light. For example, the image acquired by taking the different of images taken of the space when illuminated by the one or more IR emitters 1206 and not illuminated by the one or more IR emitters 1206 will be free from variations due to ambient light. In some embodiments, image processing will be used to determine background and foreground images. In some embodiments, the background image is the view of an unoccupied space. In some embodiments, the foreground image is analyzed to determine occupancy.

Figure 15A:
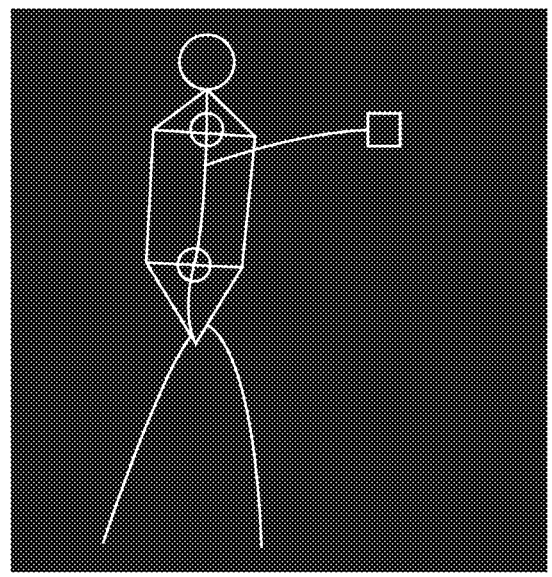
FIG. 15A illustrates the wire frame of a person as identified by the occupancy sensor assembly system from a static foreground image, in accordance with one or more embodiments of the present disclosure.
Figure 15B:
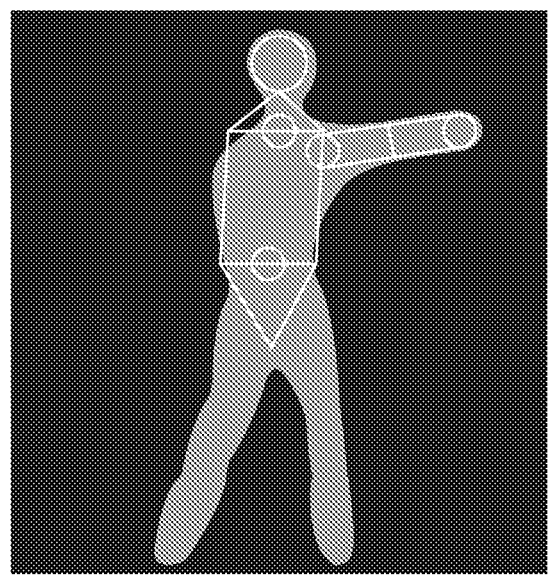
FIG. 15B illustrates the wire frame of an identified person as shown in FIG. 15A superimposed over the image acquired by the occupancy sensor assembly system from a static foreground image, in accordance with one or more embodiments of the present disclosure.
Figure 15C:
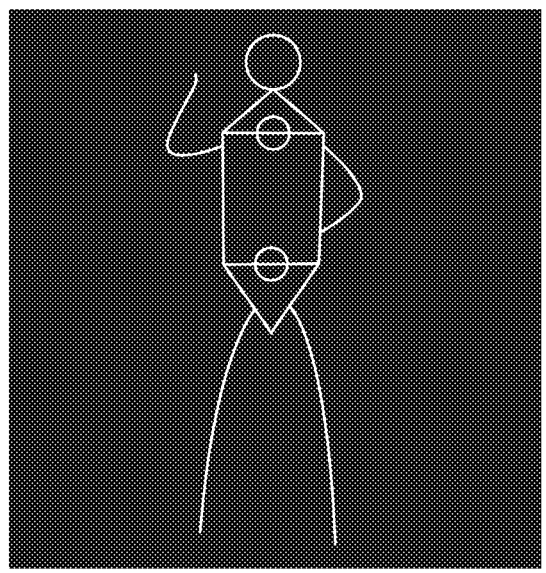
FIG. 15C illustrates the wire frame of a person as identified by the occupancy sensor assembly system from a static foreground image, in accordance with one or more embodiments of the present disclosure.
Figure 15D:
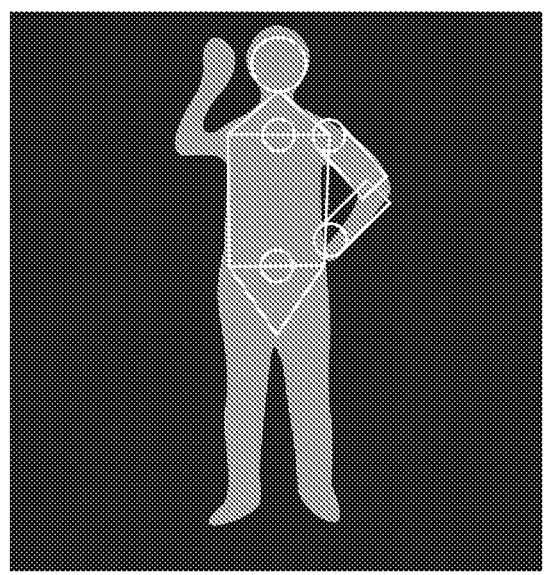
FIG. 15D illustrates the wire frame of an identified person as shown in FIG. 15C superimposed over the image acquired by the occupancy sensor assembly system from a static foreground image, in accordance with one or more embodiments of the present disclosure.
Figure 15E:
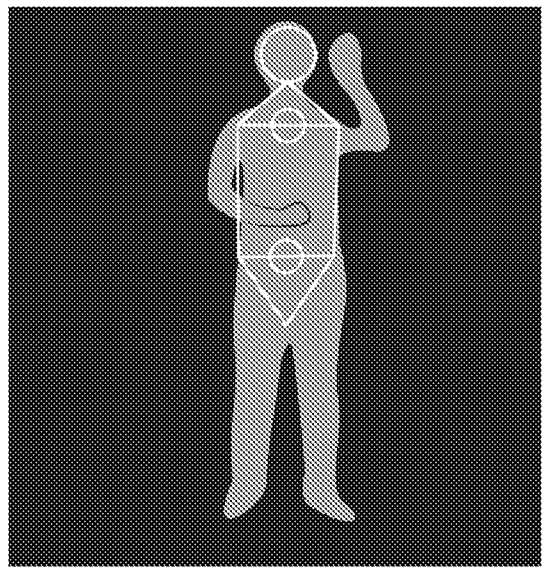
FIG. 15E illustrates the wire frame of a person holding an arm in front of their body as identified by the occupancy sensor assembly system from a static foreground image, in accordance with one or more embodiments of the present disclosure.
Figure 15F:
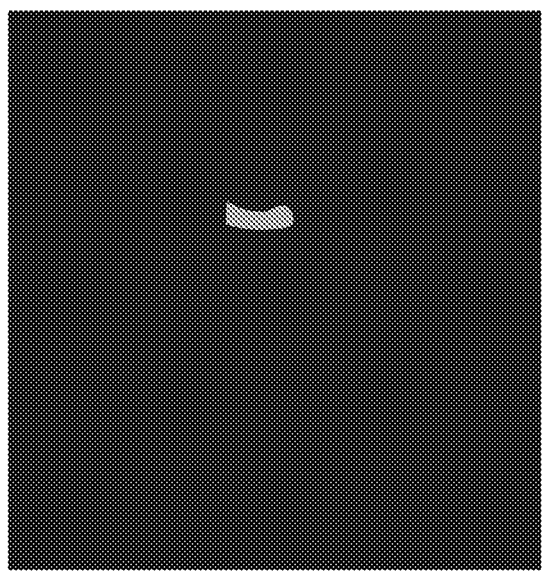
FIG. 15F illustrates the location where the arm of the person in FIG. 15E is in front of the person as identified by the occupancy sensor assembly system from a static foreground image, in accordance with one or more embodiments of the present disclosure.
Figure 15G:
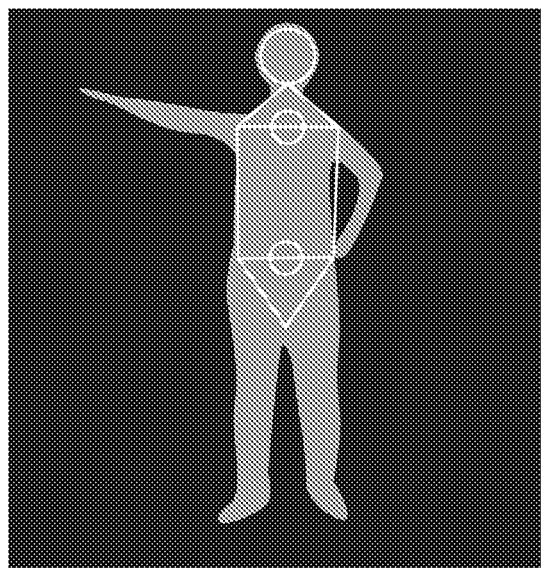
FIG. 15G illustrates the wire frame of an identified person superimposed over the image acquired by the occupancy sensor assembly system from a static foreground image, in accordance with one or more embodiments of the present disclosure.
Figure 15H:
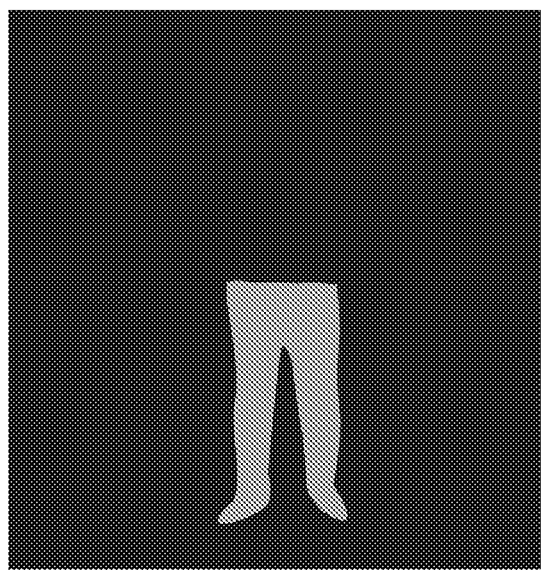
FIG. 15H illustrates the area where the lower portion of a person is located in the image as identified by the occupancy sensor assembly system from a static foreground image, in accordance with one or more embodiments of the present disclosure.

In some embodiments, the IR emitters 1206 are modulated synchronously to CMOS sensor image capture to cancel out the effect of other IR emitters. It is noted herein that remote controllers, reflection from moving window blinds and/or doors opening suddenly will act as IR emitters. FIG. 15A through 15H are example sensor images including identification markings and wireframes that illustrate shape detection to identify stationary objects. FIG. 15A is a wire frame diagram that illustrates a person as identified by the occupancy sensor assembly system 1200 from a static foreground image. FIG. 15B is an image of a person with a wire frame representation of the person from FIG. 15A superimposed to illustrate the identification of a person as identified by an image acquired by the occupancy sensor assembly system 1200. FIG. 15C is a wire frame diagram of a person that illustrates a person as identified by the occupancy sensor assembly system 1200 from a static foreground image. FIG. 15D is an image of a person with a wire frame representation of the person from FIG. 15C superimposed to illustrate the identification of a person as identified by an image acquired by the occupancy sensor assembly system 1200. FIG. 15E is an image of a person including a wire frame representation superimposed illustrating a person holding an arm in front of their body as identified by the occupancy sensor assembly system 1200 from a static foreground image. FIG. 15F is an analyzed imagine that illustrates the location where the arm of the person in FIG. 15E is in front of the person as identified by the occupancy sensor assembly system 1200. FIG. 15G is an image of a person including a wire frame representation superimposed illustrating a person as identified and acquired by the occupancy sensor assembly system 1200 from a static foreground image. FIG. 15H is an analyzed image that illustrates the area where the lower portion of the person in FIG. 15G is located in the image as identified by the occupancy sensor assembly system 1200. In some embodiments, shape and motion detection will be used to identify moving object (i.e. discriminating between human occupants and pets or insects near the sensor).

In some embodiments, the occupancy sensor assembly system 1200 can be coupled to any location where occupancy detection is desired. For example, the occupancy sensor assembly system 1200 can be coupled to a wall, ceiling, archway or post. It is noted herein that the use of a home as an exemplary place is for illustrative purposes and not as a limitation on the present disclosure.

Figure 16:
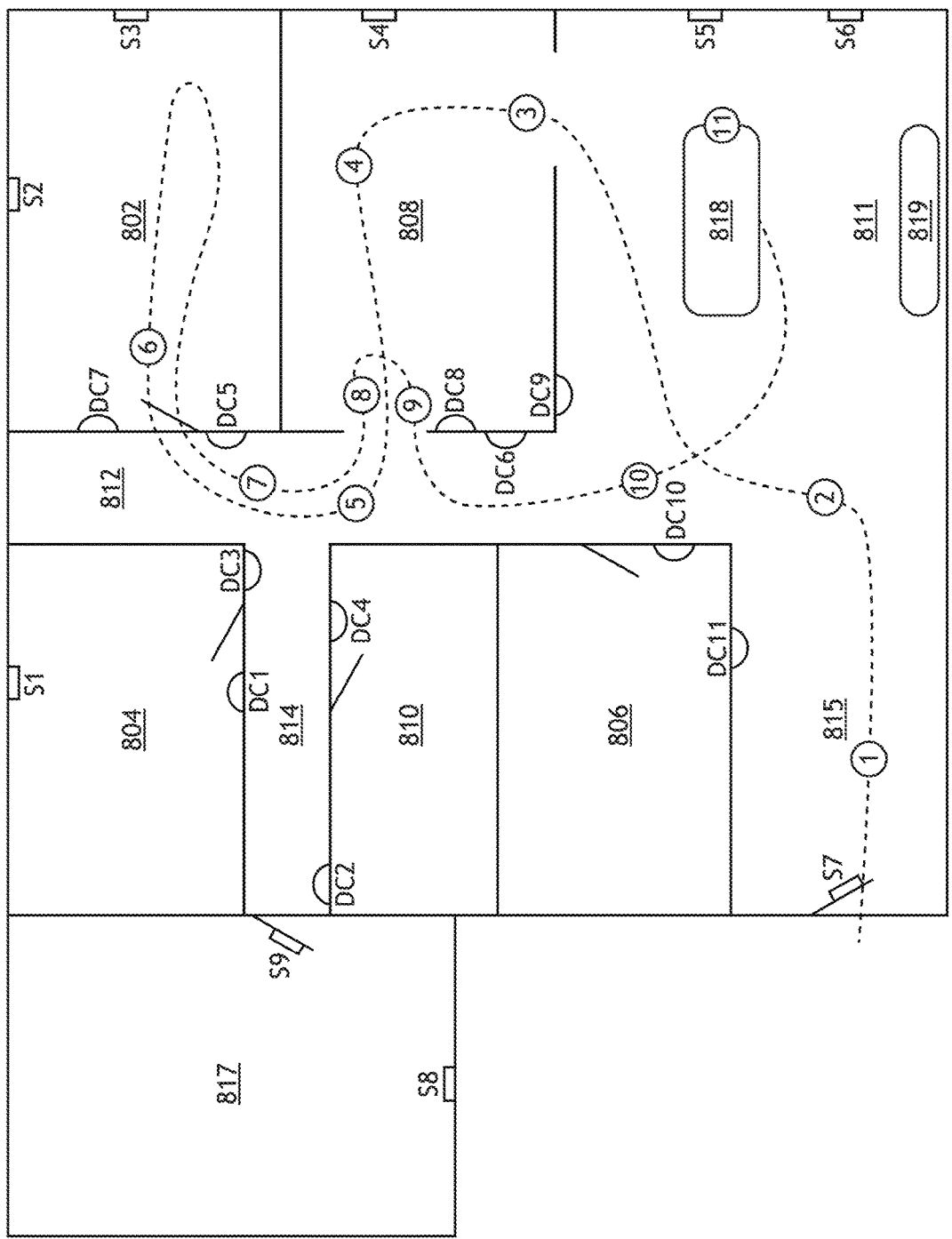
FIG. 16 illustrates an exemplary routine followed by an occupant upon returning home from work, in accordance with one or more embodiments of the present disclosure.

FIG. 16 is a floor plan 1600 that indicates the path of a person through a house to illustrate a scenario when a person enters a house and follows a routine. For example, a person returns home from work at the end of a day and follows a routine pathway upon entering the house. For instance, a person enters door S7 and follows the path indicated by the dotted line. In floor plan 1600, device control assemblies 110 are labeled DC1-DC11 and are represented by a half circle coupled to a wall. In floor plan 1600 door and window sensors are labeled S1-S9 and are represented by a rectangle coupled to a door or window location. Floor plan 1600 includes actions by a person along the path as numbers and these actions are summarized in the state table Table 5. For example, a person enters the house at S7 and walks through the entry 815 and through the living room 811 to the kitchen 808 where the person sets down their keys and wallet. The example continues with, the person walks from the kitchen 808 through a first hallway 812 to a first bedroom 802 where the person sets down their bag. The example continues with, the person walks from the first bedroom 802 through the first hallway 812 to the refrigerator in the kitchen 808. The example concludes with, the person exits the kitchen and walks through the first hallway 812 to the couch 818 in the living room 811 and turns on the television 819.

the house because the occupancy sensor assembly 1205 of each device control assembly 110 uses imaging to track objects as they move through space.

In some embodiments, the occupancy state of an occupant action includes, but is not limited to, Enter (N), Exit (X), Stationary (S), and Moving (M). In some embodiments, the occupancy state of an occupant location includes, but is not limited to, Floor Right (FR), Floor Left (FL), Floor Middle (FM), Lower Right (LR), Lower Middle (LM), Lower Left (LL), Upper Right (UR), Upper Middle (UM), and Upper Left (UL). In some embodiments, the occupancy state noise type may include, but is not limited to, Shuffling Feet (SF), Television (TV), Conversation (TK), Music (MC), and Typing (TP). In some embodiments, the convention used to discuss states is described by Action-Location or Audible-Noise type. For each frame of data there can be an Action state and one or more Audible states.

In floor plan 1600 consider the exemplary illustration where a person takes action 1 in entry 815, a device control assembly 110 will detect that a person entered the room from the right of the sensor FOV (N-FR), continued to the middle

TABLE 5

Simplified Occupancy Sensor States

Occupancy Detector System States (Simplified)

| # | Entry | Living Room | Kitchen | H1A | H1B | BR1 | Notes |
|---|---|---|---|---|---|---|---|
| 1 | Occupied | Vacant | Vacant | Vacant | Vacant | Vacant | Person enters house |
| 2 | Occupied | Occupied | Vacant | Occupied | Vacant | Vacant | Person walks towards Living Room |
| 3 | Vacant | Activity | Occupied | Vacant | Vacant | Vacant | Person walks towards Kitchen, through Living Room |
| 4 | Vacant | Vacant | Occupied | Vacant | Vacant | Vacant | Person drops off keys/wallet in Kitchen, walks towards Hallway 1 |
| 5 | Vacant | Vacant | Activity | Occupied | Occupied | Vacant | Person walks towards Bedroom 1 through Hallway 1 |
| 6 | Vacant | Vacant | Vacant | Vacant | Activity | Occupied | Person enters Bedroom 1, drops off bags, exits to Hallway 1 |
| 7 | Vacant | Vacant | Vacant | Occupied | Occupied | Vacant | Person walks through Hallway 1, towards Kitchen |
| 8 | Vacant | Vacant | Occupied | Vacant | Vacant | Vacant | Person grabs items from the refrigerator |
| 9 | Vacant | Vacant | Activity | Occupied | Occupied | Vacant | Person exits Kitchen, walks through Hallway 1 towards Living Room |
| 10 | Activity | Occupied | Vacant | Occupied | Vacant | Vacant | Person enters Living Room, walks towards Couch and turns on the TV |
| 11 | Activity | Activity | Vacant | Vacant | Vacant | Vacant | Person laying on the Couch watching TV, 45 minutes later |

State Table 5 shows simplified occupancy states for each device control assembly 110. The mesh network of device control assemblies 110 in floor plan 1600 has much more information about the actions of the person moving through of the room from the right (M-FM) with action 2 and exited the sensors' FOV to the left (X-FL). The complex state name and description of actions in floor plan 1600 can be found in state Table 6.

TABLE 6

Complex State Descriptions

| Complex State Name | Simplified State Name | Definition | Example |
|---|---|---|---|
| N-FR | Occupied | Enter image sensor FOV Floor Right | Person enters from right on the floor normal to the sensor |

TABLE 6-continued

Complex State Descriptions

| Complex State Name | Simplified State Name | Definition | Example |
| --- | --- | --- | --- |
| X-UL | Vacant | Exit image sensor FOV Upper Left | Person exits from the left going up a staircase |
| S-FM | Occupied | Stationary in Middle of image sensor FOV | Person is sitting in a chair |
| M-LR | Occupied | Moving in Lower Right of image sensor FOV | Person is going down a staircase but has not exited |
| A-SF | Activity | Audible shuffling feet | Someone is walking near the sensor system |

In some embodiments, every node on the network is continually aware of where occupants are and where they have been. For example, each device control assembly 110 communicates state data to every other node on the network for each frame of data. In some embodiments, the network can learn the behavioral patterns of typical occupants. For example, the occupant of Bedroom 1, gets up in the morning and exits (X-FR), then walks down Hallway1 812 (N-FR, M-FM, X-FL), the system would predict, based on past behavior, that the occupant will go to the Kitchen 808. By way of another example, when the occupant of Bedroom2 804 exits (X-FR), then walks down Hallway2 814 (N-FR, M-FM, X-FM) the system predicts that the occupant will go to the Bathroom 816.

In some embodiments, the prediction engine may be based on Recursive Bayesian Estimation (RBE) and in this device a Kalman filter with a dynamically weighted state-transition model (STM) predictive learning algorithm is used. For example, the observation model table illustrated in Table 9 is populated over time for every system and validated by the STM.

Figure 17A:
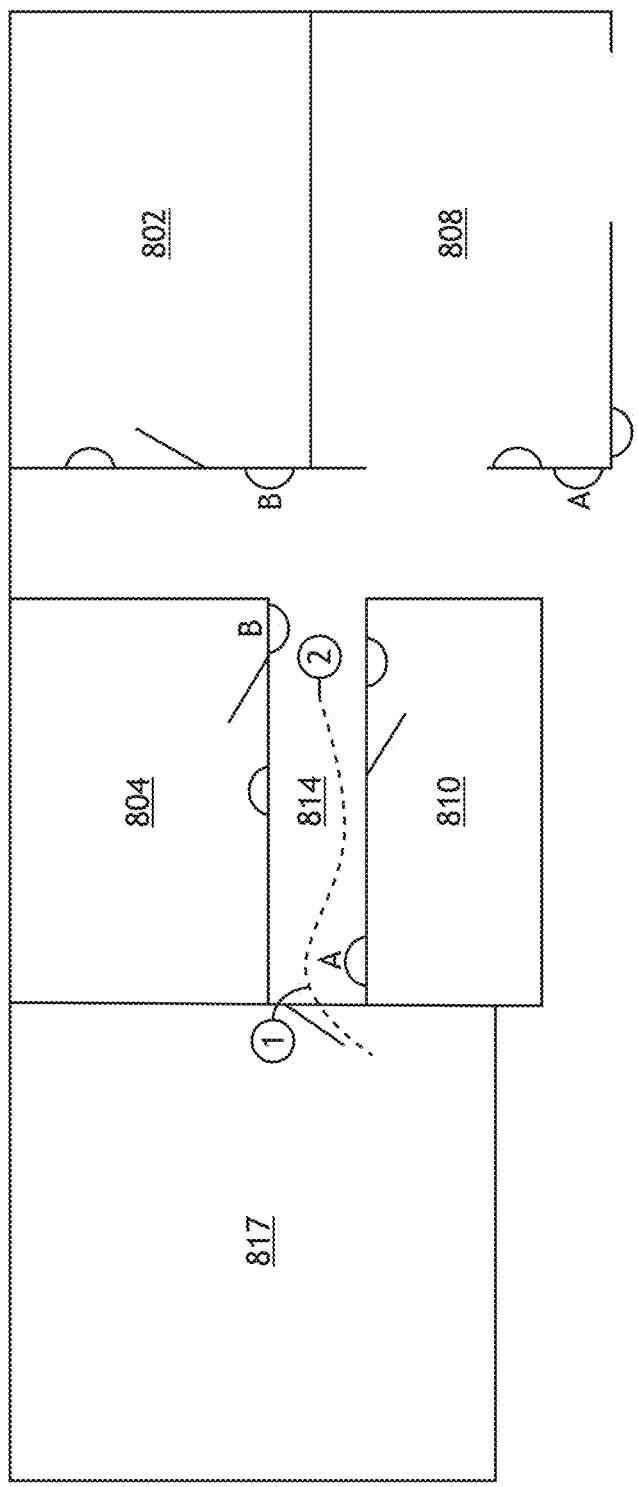
FIG. 17A illustrates an exemplary route taken by an occupant upon entry into the house, in accordance with one or more embodiment of the present disclosure.

FIG. 17A is a floor plan 1700 diagram that illustrates a validation process by considering the scenario where a person enters the house through the garage. In this example, the Hallway2 A and Hallway2 B sensors pick up the person during action 1, the person continues to walk down Hallway2 814 and a velocity vector is created for the person. The example continues with, the person approaching the door to the Laundry Room 810, at 100 mpm (meters per minute). In this example, the prediction engine predicts the room that the person is most likely going to enter next using the STM to populate a look-up-table (LUT), as shown in Table 7 (see FIG. 17B).

The prediction LUT of Table 7 indicates that a person is going to Hallway1 814 75% of the time, going to Bedroom2 804 10% of the time, going to the Laundry Room 810 15% of the time, and so far has not ever gone to the Garage 817. The predicted next state of the system will be N-FR for H1A and N-FM for H1B.

TABLE 7

State Transitions

| # | H2A | H2B | BR2 | Laundry | H1A | H1B |
| --- | --- | --- | --- | --- | --- | --- |
| 1 | N-FL | N-FR | Vacant | Vacant | Vacant | Vacant |
| 2 | M-FR | M-FR | Vacant | Vacant | Vacant | Vacant |
| Predicted Next State | X-FR | X-FL | Vacant | Vacant | N-FR | N-FR |

As Table 8 illustrates the prediction system predicts that a person coming into the Garage 817 will enter Hallway1 814. In some embodiments, after the next occupancy state is detected the STM weights are updated. For example, if the person enters bedroom 2 804, the STM is updated to reflect that movement. As illustrated in Table 9 (see FIG. 17C) the STM has used the observed behavior and Hallway1 814 was updated to indicate a 74% weighting factor and bedroom 804 has an 11% weighting factor for the next time the prediction LUT is populated.

Figure 18:
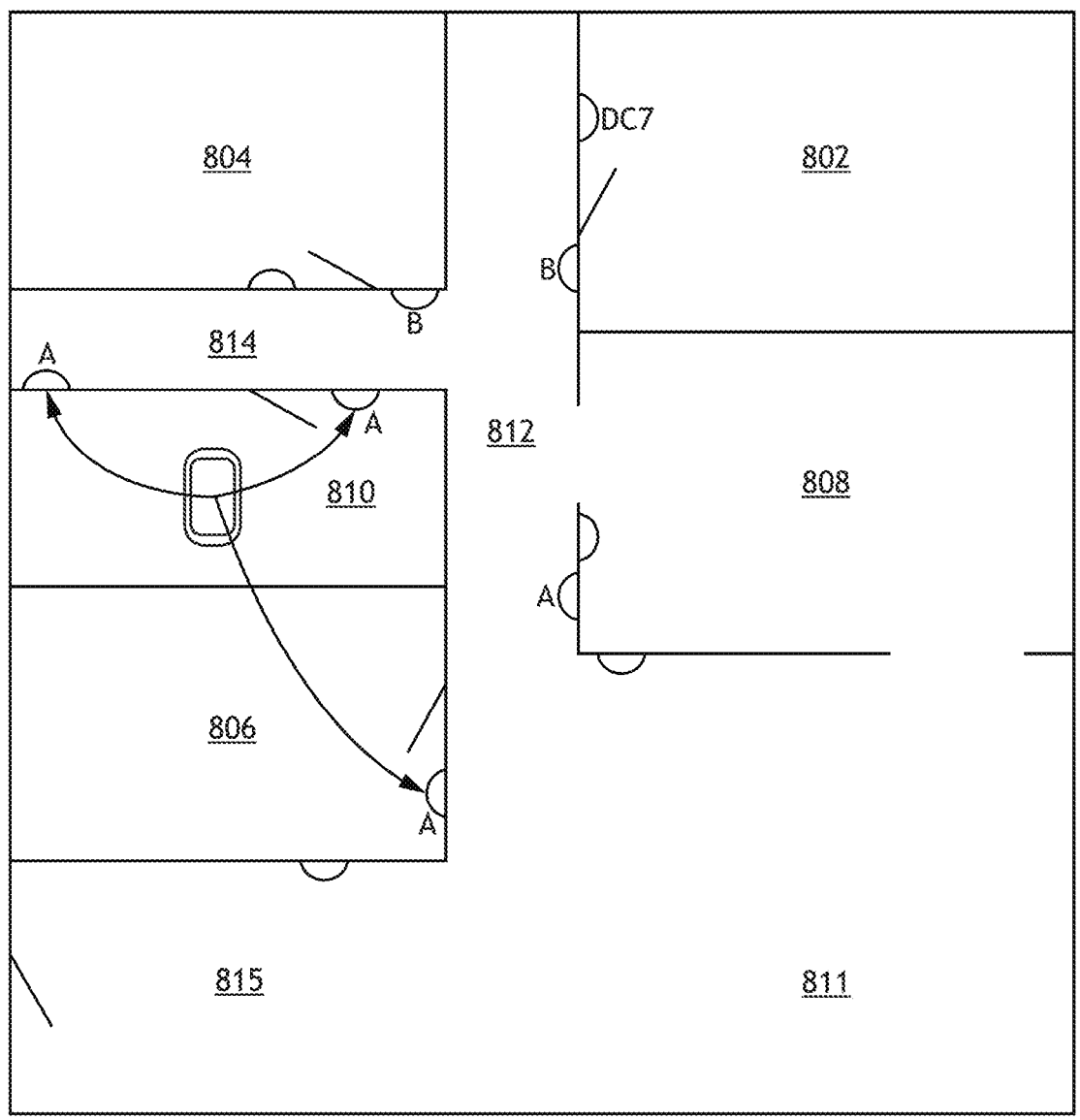
FIG. 18 illustrates the use of Bluetooth radio by three occupancy sensors to act as beacons and triangulate the location of an occupant, in accordance with one or more embodiments of the present disclosure.

In some embodiments, the occupancy sensor assembly system 1200 includes one or more Bluetooth radios 1204. In some embodiments, the Bluetooth radios 1204 are used as beacons. For example, beacons use Bluetooth radios 1204 to determine the identity of a person standing near the beacons. In some embodiments, when three or more beacons sense a person in a space it is possible to triangulate the location of the person. For example, FIG. 18 is a floor plan 1800 diagram that illustrates how three or more beacons can use triangulation to determine the precise location of a person carrying a Bluetooth enabled device. For instance, as shown in floor plan 1800, a person in the Laundry Room 810 will be sensed by beacon A in the Laundry Room 810, beacon A in Hallway1 814, and beacon A in the Bathroom 806 allowing the location of the person to be triangulated.

Figure 19:
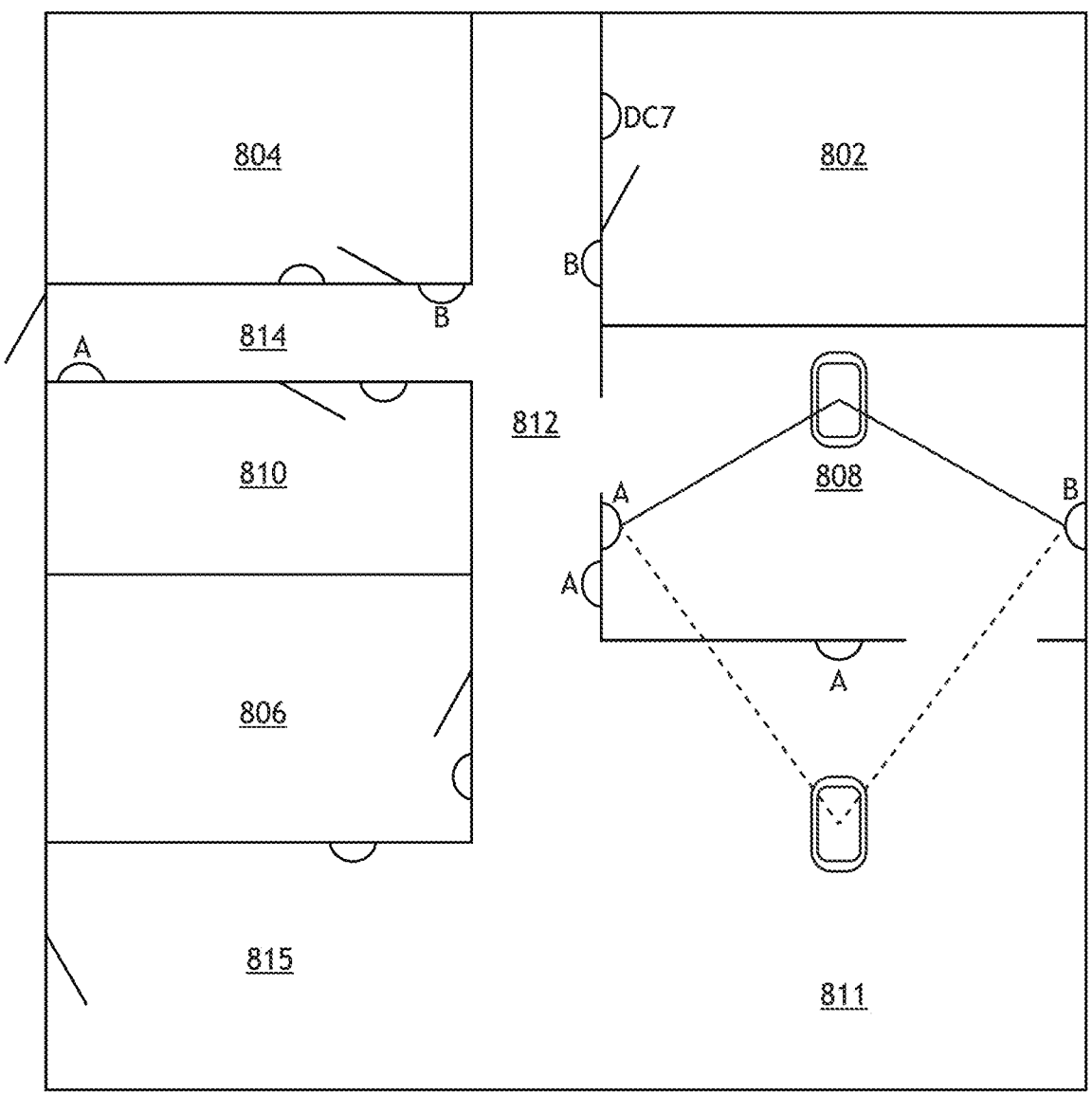
FIG. 19 illustrates the scenario when triangulation by the occupancy sensors acting as beacons identifies an ambiguous result for the location of the occupant, in accordance with one or more embodiments of the present disclosure.

FIG. 19 is a floor plan 1900 diagram that illustrates how triangulation may yield two possible locations of an occupant. For example, triangulation as shown in floor plan 1900 could indicate an occupant is in the Kitchen 808 or the living room 811. In some embodiments, the triangulated location of a device using beacons can be validated by the occupancy sensor system assembly 1200. For example, as shown in floor plan 1900 when a person is approximately equidistant from two beacons, 808 A and 808 B, and the third beacon, 811 A, is planar to the combined vector of the other two beacons the location of the occupant is validated by the occupancy sensor system assembly 1200. In floor plan 1900 data from the occupancy sensor assembly systems 1200 in the Kitchen 808 and Living Room 811 indicate that the correct location of the occupant is in the kitchen. In some embodiments, the beacon function provides the occupancy sensor assembly system 1200 with identification of the user. In some embodiments, the identification of the user is used to augment the weighting of the STM in the prediction engine.

Figure 20:
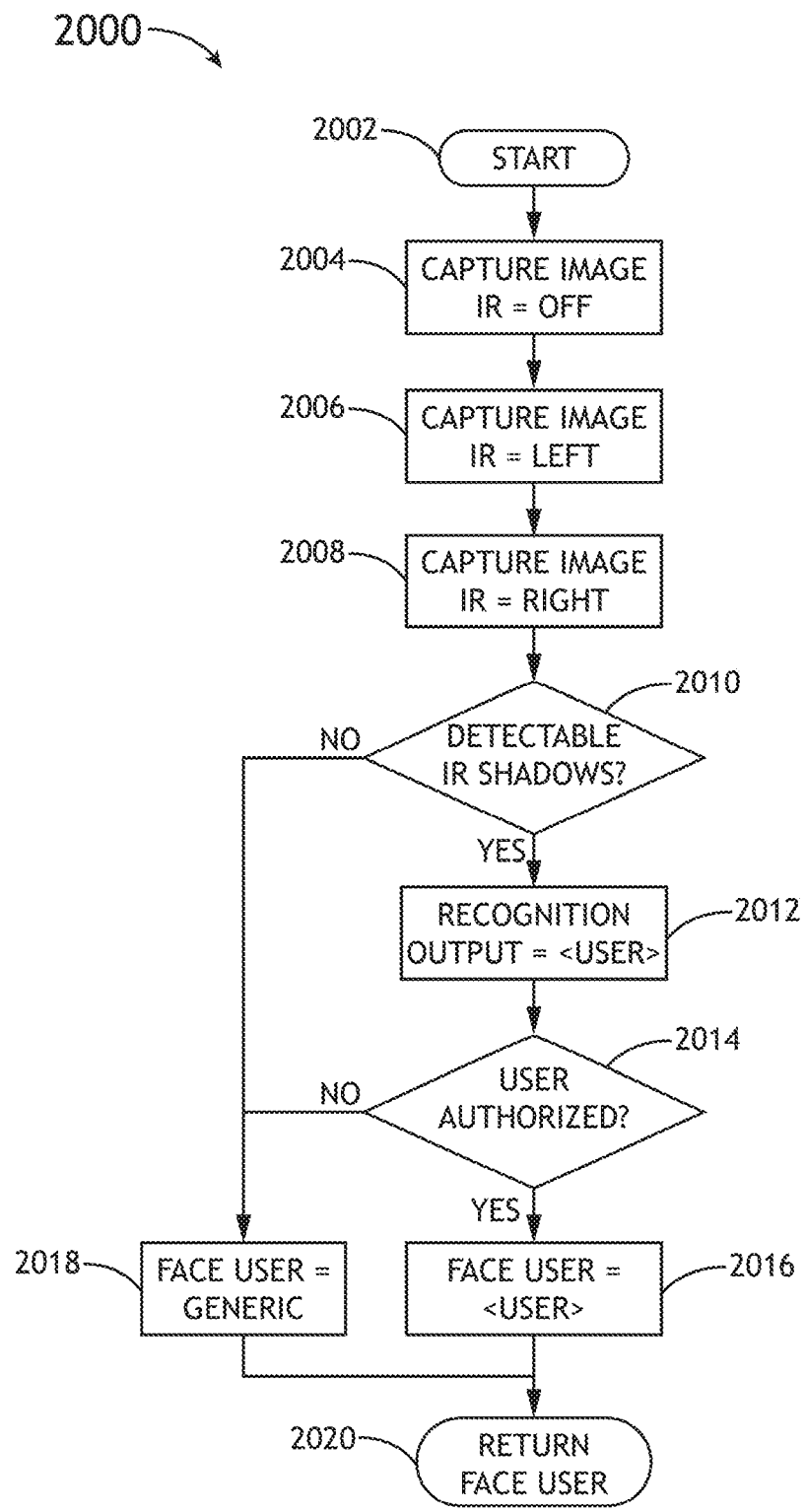
FIG. 20 illustrates a flow chart of the steps followed by the occupancy sensor assembly system to perform facial recognition on an occupant, in accordance with one or more embodiments of the present disclosure.

In some embodiments, each occupancy sensor assembly system 1200 has the capability of performing biometric authentication through facial and/or fingerprint recognition. In some embodiments, fingerprint recognition is achieved through a separate sensor. In some embodiments, facial recognition is performed by the occupancy sensor assembly system. In some embodiments, the occupancy sensor assembly 1205 and the occupancy processor 1202 are used to detect facial features and authenticate users of a device control assembly 110. In some embodiments, the facial recognition function is enhanced using the IR emitters 1206 to create shadows on either side of a face. FIG. 20 is a flowchart that illustrates the steps taken by the occupancy sensor assembly system to identify a face for authentication purposes.

In some embodiments, the output of each device control assembly 110 in a mesh network is a frame of data stored in every device control assembly 110 in the mesh network. In some embodiments, data across the mesh network is refreshed at a fixed time. For example, data in a mesh network may be refreshed every 500 ms or at a 2 Hz rate. In some embodiments, the frame of data recorded throughout the mesh network of device control assemblies 110 contains any combination of data sets recorded by the device control assemblies 110. For example, the frame of data may contain complex state information related to occupancy, authenticated users, the precise location of users, environmental data, and predicted next states. In some embodiments, predicted next states are noted by "t+1" in the "Time" column of a data table. An exemplary table of a mesh network frame of data is illustrated in Table 10.

embodiments, each occupancy sensor assembly system 1200 can be aware of data and communicate this data to all other occupancy sensor assembly systems 1200 in a connected mesh network.

Figure 21A:
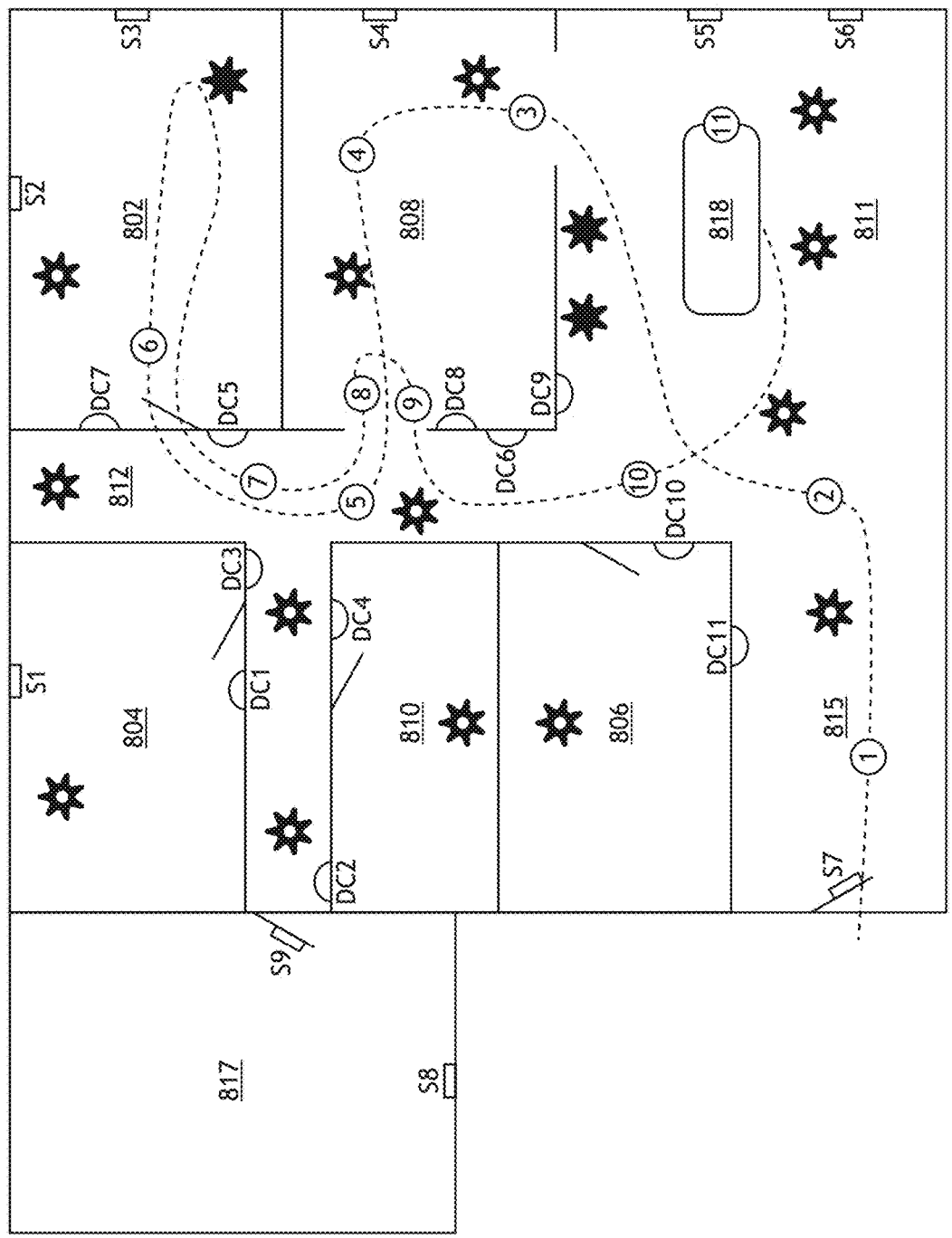
FIG. 21A illustrates an exemplary scenario of multiple occupancy sensor assembly systems automating the lighting of a house, in accordance with one or more embodiments of the present disclosure.

In some embodiments, the occupancy sensor assembly system 1200 is coupled with a load device. For example, an occupancy sensor assembly system 1200 could be coupled with an appliance. For instance, the occupancy sensor assembly system 1200 could be coupled with a luminary, security system or other appliance that performs a service for a person. FIG. 21A is a floor plan 2100 that adds lights to the example of floor plan 1600 to illustrate how data from the occupancy sensor assembly system 1200 is applied to a lighting system. In some embodiments, the occupancy sensor assembly system 1200 turns lights on when an occupant is in a room and starts a timer when there is no occupant or activity detected in the room. In some embodiments, the occupancy sensor assembly system 1200 starts a countdown timer when no activity or occupant is detected in a room. In some embodiments, the lights in a room are turned off when a timer expires. In some embodiments, the lights in

TABLE 8

AIROS Output Data

| Class | Objects Occupancy SensorNName | Time | Possible Values Entry | Living | Kitchen | H1A | H1B | BR1 | BR2 | Bath | H2A | H2B |
|---|---|---|---|---|---|---|---|---|---|---|---|---|
| Occupancy | Simple Occupancy SensorN | t, t + 1 | Occupied | Vacant | Activity | | | | | | | |
| Occupancy | Complex Occupancy SensorN | t, t + 1 | X-FR | M-UL | S-FM | S-FL | N-LR | | | | | |
| Occupancy | Audible SensorN | t, t + 1 | A-SF | A-TV | A-MC | A-TK | | | | | | |
| Personalization | SensorUserN Name | t, t + 1 | USER0 | USER1 | Generic | | | | | | | |
| Personalization | SensorUserN Location | t, t + 1 | Entry | Living | Kitchen | H1A | H1B | BR1 | BR2 | Bath | H2A | H2B |
| Personalization | SensorUserN Activity | t, t + 1 | Standing | Moving | Exercising | Sitting | | | | | | |
| Personalization | SensorUserN AuthType | t, t + 1 | Facial | Fingerprint | Beacon | Behavior | | | | | | |
| Environment | Ambient Temperature | t | Float Number | | | | | | | | | |
| Environment | Surface Temperature | t | Heatmap Image | | | | | | | | | |
| Environment | Humidity | t | Float Number | | | | | | | | | |
| Environment | Ambient Noise | t | Float Array | | | | | | | | | |
| Environment | Ambient Light | t | Float Array | | | | | | | | | |
| Environment | Carbon Monoxide | t | Float Array | | | | | | | | | |
| Environment | Smoke Detector | t | Float Array | | | | | | | | | |
| Connections | Connected DeviceN StateM | t, t + 1 | Device dependent | | | | | | | | | |
| Connections | Connected DeviceN Message | t, t + 1 | Device dependent | | | | | | | | | |

In some embodiments, the occupancy sensor assembly system 1200 detects people and environmental conditions. For example, the occupancy sensor assembly system 1200 will detect people and environmental conditions in the surrounding area or room in which the occupancy sensor assembly system 1200 is located. In some embodiments, the occupancy sensor assembly system 1200 can identify and authenticate occupants using biometric identification methods. In some embodiments, the occupancy sensor assembly system 1200 predicts what occupants will do next. In some a room are turned off when a timer reaches a predetermined value. For example, the lights in a room are turned off when a timer reaches 5 minutes of recorded inactivity or no occupants have been present in a room for 3 minutes. Table 11 illustrates the light behavior in each room of floor plan 2100. It is noted herein that Table 11 contains all the information present in Table 5 and additionally includes the state of the load device 190. It is also noted herein that Table 11 additionally indicates the state of a load device 190 based on a three minute timer.

TABLE 9

Light Response to Occupancy

| # | Time | Entry AIROS | Living LUC | Kitchen AIROS | H1A LUC | H1B AIROS | BR1 LUC | Notes AIROS | LUC | AIROS | LUC | AIROS | LUC | |
|---|------|-------------|------------|---------------|---------|-----------|---------|-------------|-----|-------|-----|-------|-----|---|
| 1 | 1:00 | Occupied | On | Vacant | Off | Vacant | Off | Vacant | Off | Vacant | Off | Vacant | Off | Person enters house |
| 2 | 1:00 | Occupied | On | Occupied | On | Vacant | Off | Occupied | On | Vacant | On | Vacant | Off | Person walks towards Living Room |
| 3 | 1:01 | Vacant | Start Timer | Activity | On | Occupied | On | Vacant | Start Timer | Vacant | Start Timer | Vacant | Off | Person walks towards Kitchen, through Living Room |
| 4 | 1:03 | Vacant | Timer | Vacant | Start Timer | Occupied | On | Vacant | Timer | Vacant | Timer | Vacant | Off | Person drops of keys/wallet in Kitchen, walks towards Hallway 1 |
| 5 | 1:05 | Vacant | Off | Vacant | Timer | Activity | On | Occupied | On | Occupied | On | Vacant | Off | Person walks towards Bedroom 1 through Hallway 1 |
| 6 | 1:08 | Vacant | Off | Vacant | Off | Vacant | Start Timer | Vacant | Start Timer | Activity | Start Timer | Occupied | On | Person enters Bedroom 1, drops off bags, exits to Hallway 1 |
| 7 | 1:08 | Vacant | Off | Vacant | Off | Vacant | Timer | Occupied | On | Occupied | On | Vacant | Start Timer | Person walks through Hallway 1, towards Kitchen |
| 8 | 1:09 | Vacant | Off | Vacant | Off | Occupied | On | Vacant | Start Timer | Vacant | Start Timer | Vacant | Timer | Person grabs items from the refrigerator |
| 9 | 1:10 | Vacant | Off | Vacant | Off | Activity | On | Occupied | On | Occupied | On | Vacant | Timer | Person exits Kitchen, walks through Hallway 1 towards Living Room |
| 10 | 1:10 | Activity | Off | Occupied | On | Vacant | Start Timer | Occupied | On | Vacant | On | Vacant | Timer | Person enters Living Room, walks towards Couch and turns on the TV |
| 11 | 1:55 | Activity | Off | Activity | On | Vacant | Off | Vacant | Off | Vacant | Off | Vacant | Off | Person laying on the Couch watching TV, 45 minutes later |

In some embodiments, a more complex solution is enabled by the occupancy sensor assembly system 1200 that utilizes the data recorded from a mesh network of occupancy sensor assembly systems 1200. For example, a more complex solution is enabled utilizing the data defined in Table 10 as utilizing this data allows for the creation of a predictive lighting system as illustrated in Table 12 (see FIG. 21B). The results of an improved solution are illustrated in Table 12 with the improvements over the previous system being highlighted in gray.

Figure 22:
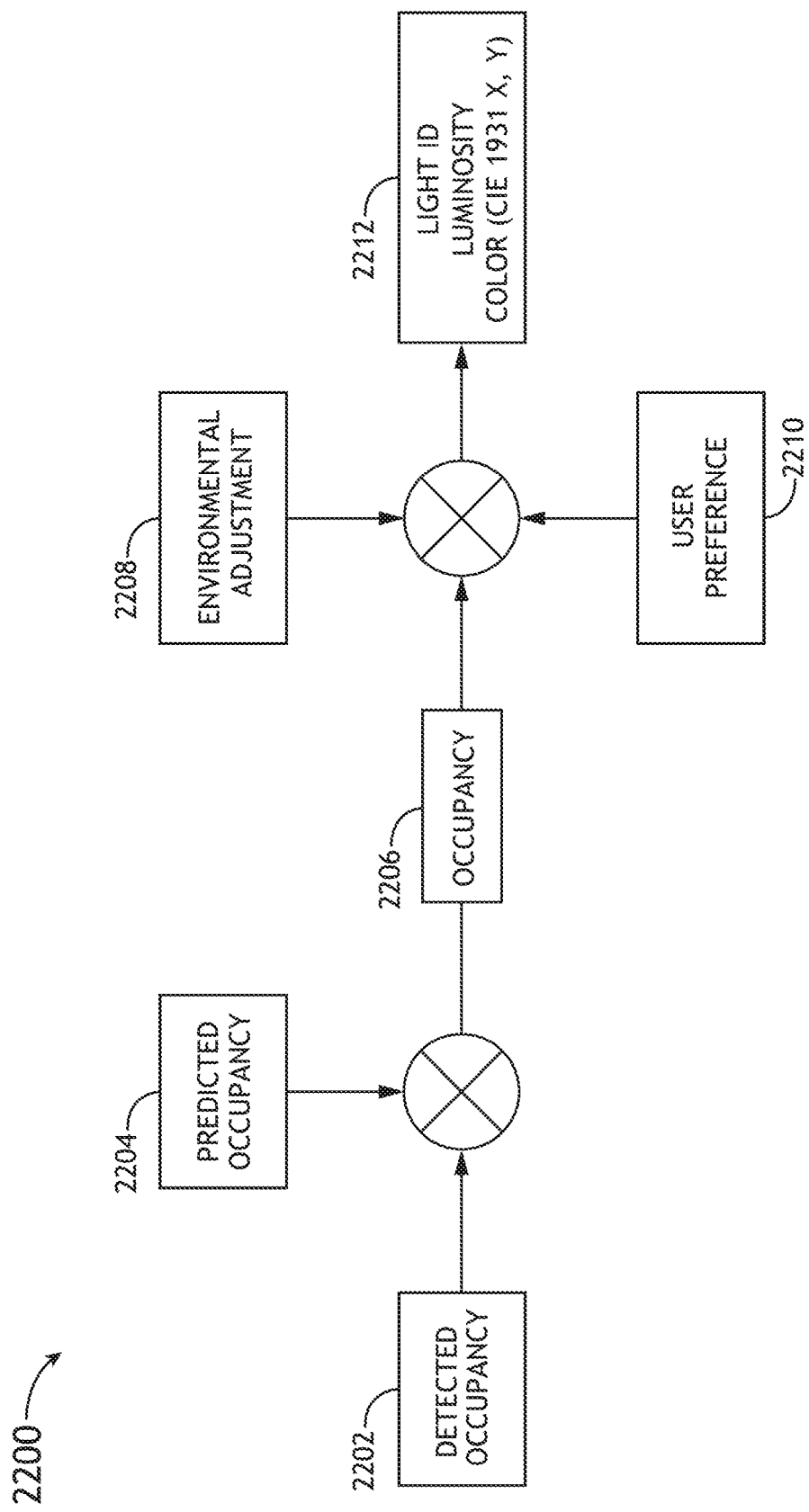
FIG. 22 illustrates a flow chart of the steps taken by the occupancy sensor assembly system to automate lighting of a house, in accordance with one or more embodiments of the present disclosure.

In some embodiments, the state of lights can be altered to adapt to environmental conditions. For example, the state of lights can be altered to adapt to the ambient light level, ambient temperature, time of day, latitude, longitude, and day of the year. For instance, in the example illustrated in Table 12 consider that it is 6:00 pm PDT on January 10th at 48° north latitude 122° west longitude. Now continuing this instance, consider that before a person enters Bedroom1 802, the occupancy sensor assembly system 1200 reads the ambient light level in Hallway1 812 and Bedroom1 802, the temperature in Bedroom1 802, and is aware of the position of the sun. In some embodiments, the occupancy sensor assembly system 1200 calculates a lighting level based on environmental conditions and the past behavior of the occupant. FIG. 22 is a flowchart that illustrates the steps of the occupancy sensor assembly system 1200 to automatically adjust and/or set the lighting level in an occupied room.

In some embodiments, the environmental adjustment input 2208 is based on the light level of the previously occupied rooms, the light level in the predicted next rooms, ambient temperature, position of the sun, and time of day. In some embodiments, the light level is the total ambient light, which is defined as the natural light level plus the artificial light level. For example, the light level is the natural light level plus the artificial light level. In some embodiments, the user preference input 2210 in flow chart 2200 comes from a manual override of the settings. In some embodiments, the user preference input 2210 comes from a preselected preference of the authenticated user as identified by the occupancy sensor assembly system 1200. In some embodiments, the user preference input 2210 is a default profile setting.

In some embodiments, the occupancy sensor assembly system 1200 is capable of controlling blinds and façade to actively manage lighting and temperature. For example, if a user wants to darken a room to use a projector the occupancy sensor assembly system 1200 allows the user to turn down the artificial light level and close the blinds. In some embodiments, a user can turn down the lights in a room by dragging their finger down the trackpad 180. In some embodiments, both the blinds and load device 190 luminaries can be controlled simultaneously on the trackpad 180. For example, a user can lower the total light level by lowering artificial light levels in a room by dragging their finger down the trackpad 180. For instance, a user dragging their finger down the trackpad 180 could dim the artificial light from luminaries in the room and close the blinds to block out some of the natural light from the sun.

In some embodiments, the blinds, or façade, can be automatically controlled for occupancy (boxes 2202-2206). For example, a window exposed to the sun most of the day during the summer increases the temperature inside a house. In some embodiments, the occupancy sensor assembly system 1200 can measure ambient light, surface temperature and ambient temperature of a room to detect if the blinds are up and increasing the temperature inside the house. In some embodiments, if the occupancy sensor assembly system 1200 detects that blinds being open is resulting in the temperature inside the house increasing, the occupancy sensor assembly system 1200 will close the blinds. In some embodiments, the occupancy sensor assembly system 1200 will consider the behavior of the occupant to determine if the blinds should be closed. For example, if an occupant opens a window the occupancy sensor assembly system 1200 may close some blinds to block out the sun.

Figure 23A:
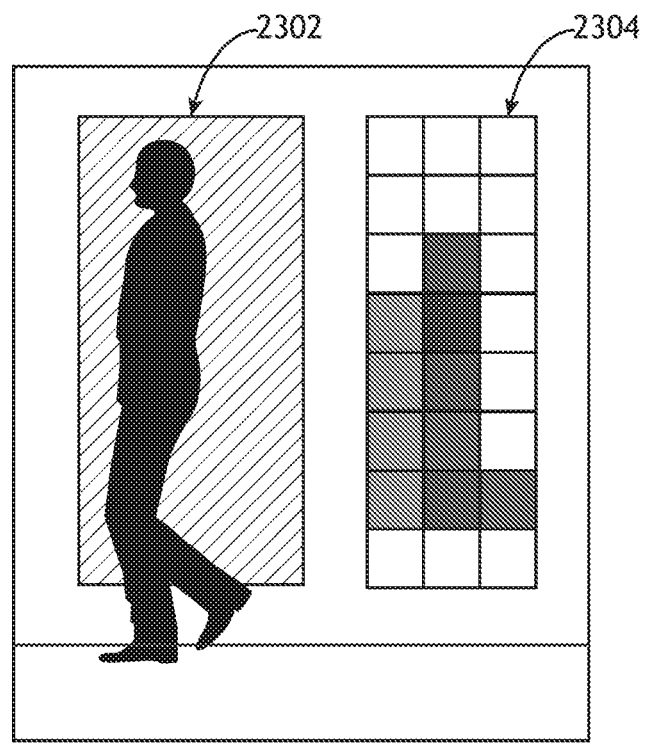
FIG. 23A illustrates an exemplary output of a thermopile array sensor for an occupant in motion, in accordance with one or more embodiments of the present disclosure.
Figure 23B:
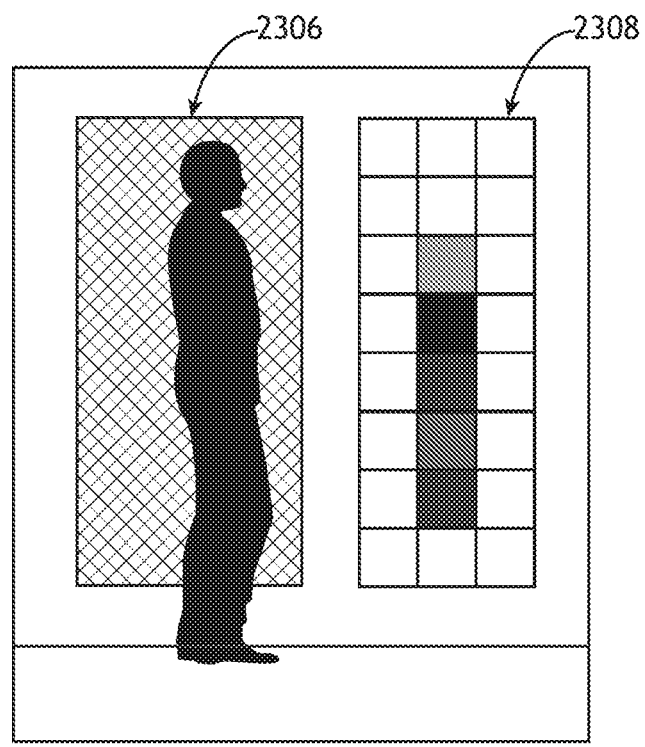
FIG. 23B illustrates an exemplary output of a thermopile array sensor for a stationary occupant, in accordance with one or more embodiments of the present disclosure.

In some embodiments, a thermopile sensor measures the absolute temperature of the FOV of the sensor. In some embodiments, a thermopile array (TPA) and a directional lens can be used to measure the temperature of a space divided into a grid. In some embodiments, TPA measurements are reported in a heat map grid where darker grid locations indicate higher measurement readings. FIG. 23A is an image of a person and the associated TPA image to illustrate the output of the TPA. In FIG. 23A a person in motion 2302 is imaged by a TPA and the results presented in a heat map grid 2304. FIG. 23B is an image of a person and the associated TPA image to illustrate the output of the TPA. In FIG. 23B a stationary person 2306 is imaged by a TPA and the results presented in a heat map grid 2308. In some embodiments, the sensor assembly 1208 includes only a TPA. In some embodiments, the sensor assembly 1208 includes a TPA in addition to another sensor to further improve the accuracy of the occupancy sensor assembly system 1200. For example, the sensor assembly could include a TPA and a CMOS sensor. In some embodiments, the lens from the occupancy sensor assembly 1205 is used to increase the FOV and the occupancy processor 1202 is still used to normalize the image.

Figure 24:
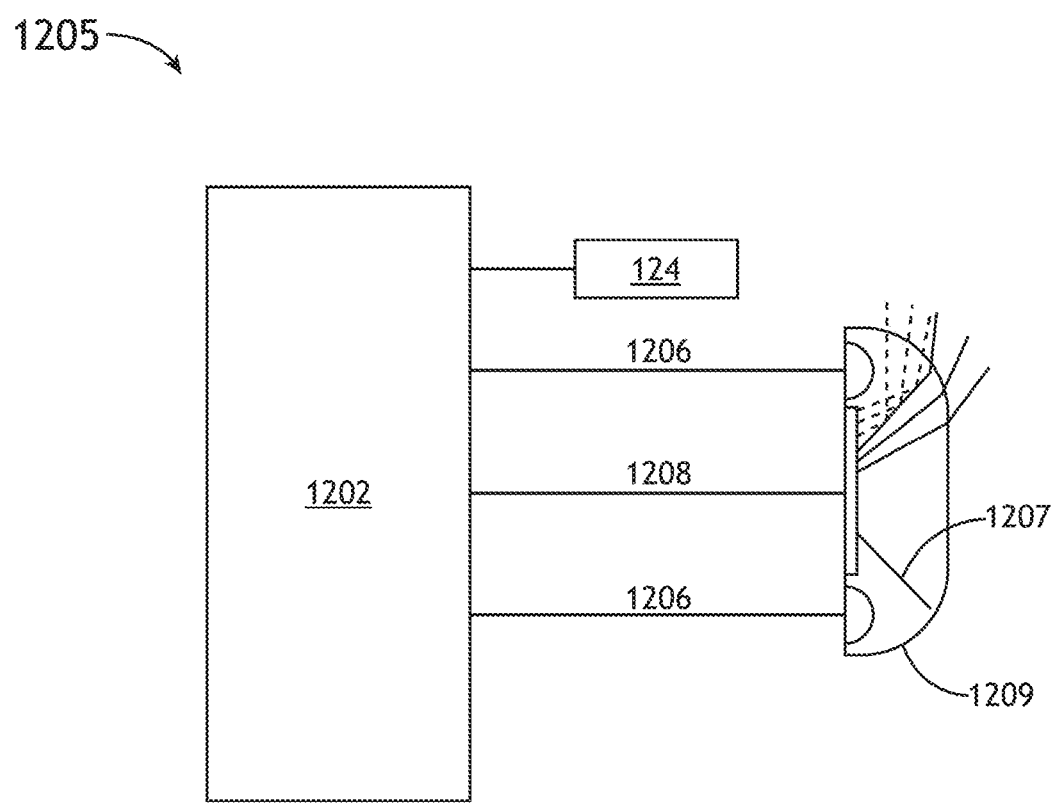
FIG. 24 illustrates a block diagram of the sensors of the occupancy sensor assembly system, in accordance with one or more embodiments of the present disclosure.

FIG. 24 is a block diagram of the sensor assembly 1208 which may include one or more sensors. In some embodiments, the sensor assembly 1208 includes a CMOS sensor and a TPA. In some embodiments, the sensor assembly 1208 includes only a TPA. In some embodiments, the sensor assembly 1208 includes a CMOS sensor and a PIR sensor.

It is noted herein that using a PIR sensor with a CMOS sensor can improve the accuracy of the occupancy sensor assembly system 1200. It is also noted herein that a PIR sensor only detects motion, which is a strength of the CMOS sensor, but a PIR sensor can be made more effective at long distances by increasing the gain of the sensing element or the sensitivity to changes in temperature. In some embodiments, including a PIR sensor in the sensor assembly 1208 helps remove false positives from other sensors. In some embodiments, the PIR sensor gives the occupancy sensor assembly system a long-range sensor that can detect activity and compliment the shorter range of the CMOS sensor. It is noted herein that the increased range is important for picking up motion of warm, moving bodies at long distances and is used to maintain occupancy when the CMOS sensor stops detecting motion.

Figure 25:
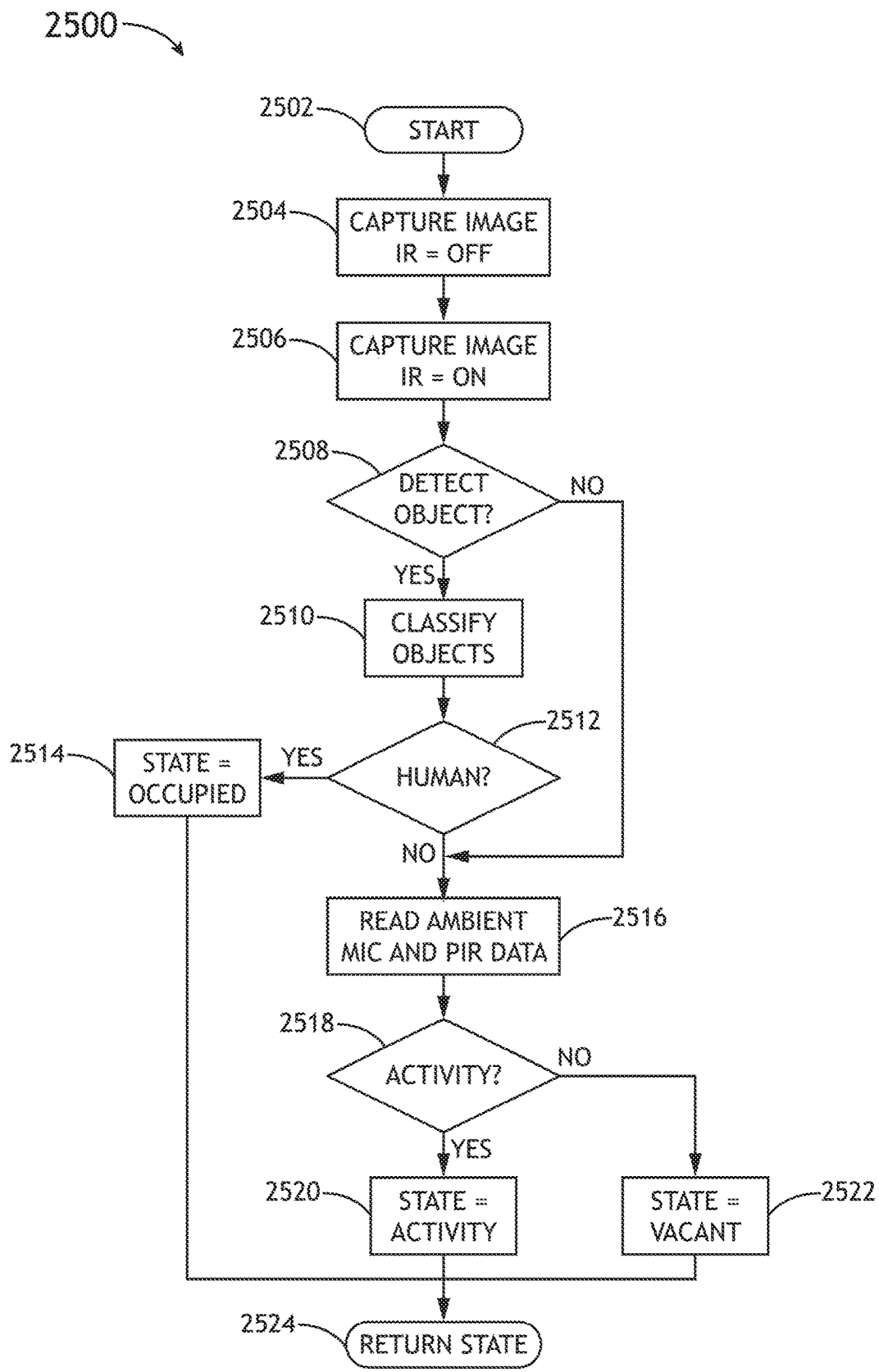
FIG. 25 illustrates a flow chart of the steps followed by the occupancy sensor assembly system to determine the occupancy state of a room when a pyroelectric infrared sensor is one of the sensors in the sensor assembly, in accordance with one or more embodiments of the present disclosure.

FIG. 25 is a flow chart that illustrates the occupancy state with PIR sensor. In some embodiments, the system illustrated by flow chart 2500 performs all computing in the occupancy sensor assembly system 1200. In some embodiments, a processor separate from the occupancy sensor assembly system 1200 perform computations. For example, a local hub may be utilized to perform computations. By way of another example, a cloud service may be utilized to perform computations.

In some embodiments, the occupancy sensor assembly system 1200 creates an intercom throughout a house. In some embodiments, the intercom utilizes the microphone 124, command interface, trackpad 180, mesh network, occupancy sensor assembly 1205, and speaker 126. In some embodiments, the command interface of the intercom includes at least one of voice commands, a control panel, a mobile phone, or a universal remote. In some embodiments, an intercom "call" from one occupancy sensor assembly system 1200 to another can be initiated by pressing a pre-defined part of the trackpad. In some embodiments, an intercom "call" from one occupancy sensor assembly system 1200 to another can be initiated by stating a voice command. For example, stating the voice command "Deako call rooms" would initiate an intercom throughout the house. In some embodiments, an intercom could be established through a device application connected either wirelessly or by wireline to an occupancy sensor assembly system 1200.

Figure 26:
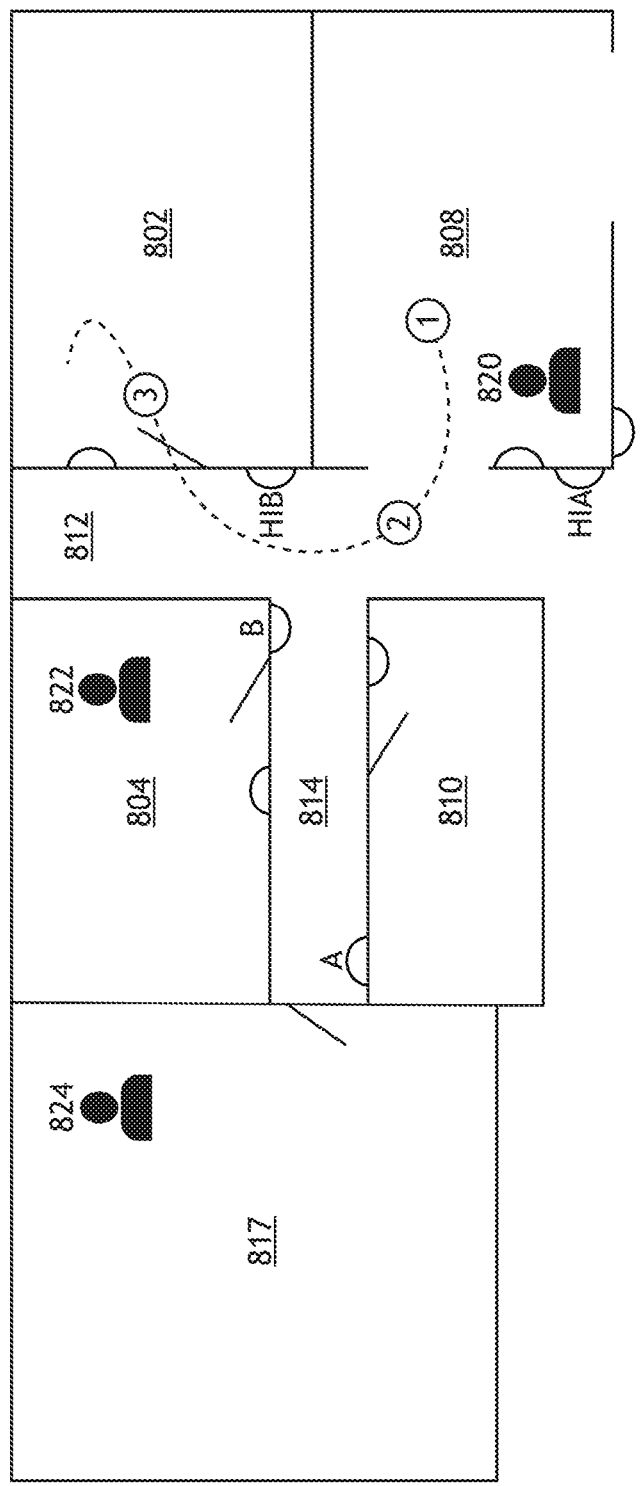
FIG. 26 illustrates an exemplary intercom system utilizing multiple occupancy sensor assembly systems, in accordance with one or more embodiments of the present disclosure.

In some embodiments, once a "call" is initiated the person talks to the occupancy sensor assembly system 1200 which digitizes the voice and streams the data to the mesh network. In some embodiments, the voice stream is available to all the occupancy sensor assembly systems 1200 in the house. In some embodiments, voice stream is only broadcast to occupied rooms. In some embodiments, the system only broadcasts to rooms where the light is on. FIG. 26 is a floor plan 2600 that illustrates the intercom function of device control assemblies 110 (identified has half circles) including occupancy sensor assembly systems 1200 as a person travels through the house. For example, in floor plan 2600 Person 1 820 is in the Kitchen 808 and calling the occupants Person 2 822 and Person 3 824, for breakfast. The example continues with the occupancy sensor assembly system 1200 in each room being alerted to the message, but only the occupancy sensor assembly system 1200 in the device control assembly 110 in the Bedroom 2 804 and the Garage 817 broadcast the voice stream. In some embodiments, any of the occupancy sensor assembly systems 1200 have control of the lights in the Bedroom 2 804 and the occupancy sensor assembly system 1200 in the Garage 817 and is able to notify the occupants of an intercom message by changing the lights in a pre-defined pattern. For example, the occupancy sensor assembly system 1200 can configure the lights to have a pulsed dimming effect or the lights could change color.

In some embodiments, occupancy sensor assembly systems 1200 used throughout the applicable space in a house allow a user to freely walk between rooms and maintain an active intercom connection. For example, in FIG. 26, person 820 may move to a different space as indicated by the dotted line and as person 820 moves the active occupancy sensor assembly system 1200 follows. For instance, an occupancy sensor assembly system 1200 in the Kitchen 808 detects that person 820 has left and the H1A and H1B occupancy sensor assembly systems 1200 will detect that person 820 is in Hallway1 812. At action 2, H1B becomes the active occupancy sensor assembly systems 1200, streaming the voice of person 820 to the rest of the network, until person 820 enters Bedroom 1 802 and an occupancy sensor assembly system 1200 in Bedroom 1 802 becomes the active occupancy sensor assembly system 1200. The instance concludes with, the call is terminated at which time the initiator ends the intercom. In some embodiments, a user touches a pre-determined region on the trackpad to terminate the intercom. In some embodiments, a user states a keyword and the intercom is terminated. For example, a user might say "Deako End Call" and the intercom is terminated.

In some embodiments, a voice stream can be coupled to a mobile device to make a call outside of the house. In some embodiments, a voice stream can be coupled to a mobile device to act as a speakerphone. For example, a person could say "Deako Call Dave" and if Dave is in a space covered by the device control assembly 110 network the device control assembly would call that space. By way of another example, if a person initiates a voice command to call Dave and Dave is not in the house, the device control assembly 110 would process the voice command and send a command to the mobile device of the person to initiate a phone call with Dave. In some embodiments, the device control assembly acts as a "hand-free" speakerphone.

In some embodiments, one or more occupancy sensor assembly systems 1200 used throughout the applicable space in a house can be utilized by a person to initiate an intercom call from a mobile device over Bluetooth. In some embodiments, occupancy sensor assembly systems 1200 act as Bluetooth repeaters that extend the range of a mobile device Bluetooth radio. For example, a person can connect to the occupancy sensor assembly system 1200 in the Kitchen 808 to initiate a phone call using a Bluetooth connection of a mobile device. Now continuing the example, the mobile device is set down in the Kitchen 808 and the person continues to traverse the path indicated by the dotted line in FIG. 26 and upon leaving the Kitchen 808 and moving to Hallway1 812, the speakerphone functionality of the occupancy sensor assembly system 1200 in the Kitchen 808 is transferred to the Hallway1 812, occupancy sensor assembly system 1200. Still continuing the example, the person moves to Bedroom1 802 where the occupancy sensor assembly system 1200 in Bedroom1 802 acts as a speakerphone through the occupancy sensor assembly system 1200 in the Kitchen 808. In some embodiments, the Bluetooth range of a headset, mobile device, or other peripheral device can be extended.

Figure 27:
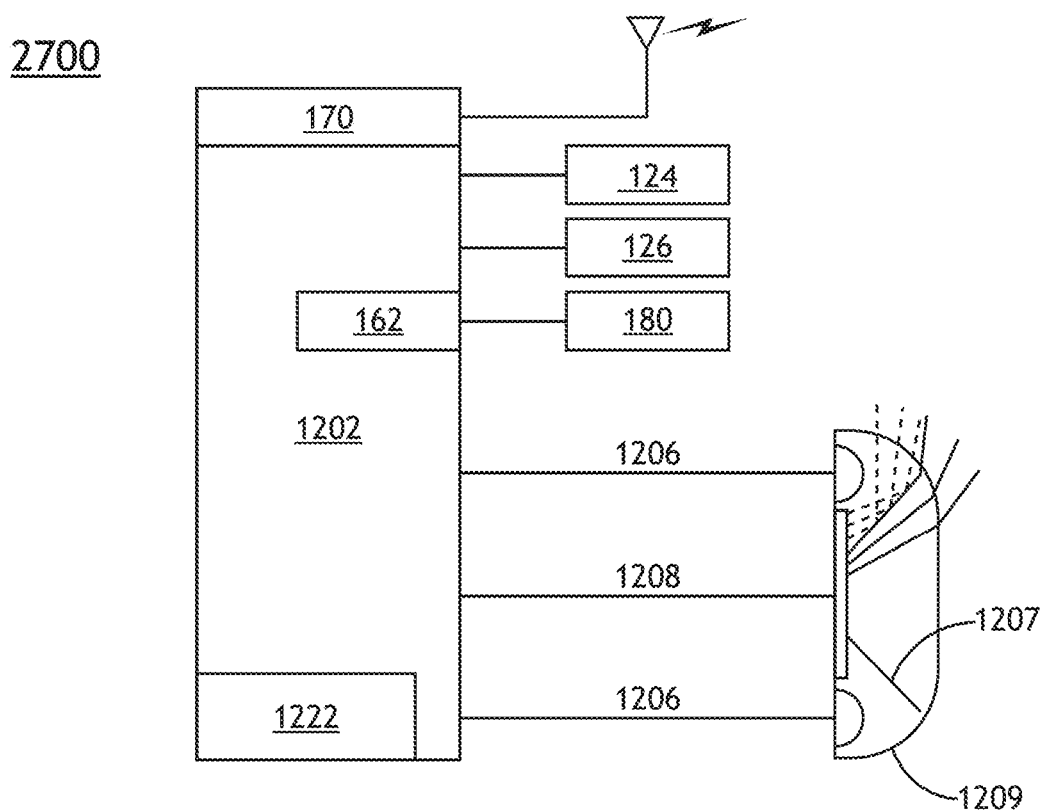
FIG. 27 illustrates a configuration of the occupancy sensor assembly system capable of streaming video, in accordance with one or more embodiments of the present disclosure.

FIG. 27 is a block diagram 2700 of a device control assembly 110 including an occupancy sensor assembly system 1200 and a WiFi connection to illustrate the capability of a device control assembly 110 to stream video. In some embodiments, the CMOS sensor in the occupancy sensor assembly system 1200 can create an audio/video stream from each occupancy sensor assembly system 1200 to a network. In some embodiments, a network terminal can access an audio/video stream from occupancy sensor assembly systems 1200. In some embodiments, a network terminal includes one or more computers, mobile phones, video watches, tablets, televisions or headsets. For example, an occupancy sensor assembly system 1200 can monitor the noise in the room of a sleeping infant and transmit the audio feed to a mobile phone.

In some embodiments, occupancy data is coupled to the video stream allowing pre-defined periods of time to be recorded. For example, if a person routinely leaves and returns to a house at certain times a video stream could be recorded by an occupancy sensor assembly system 1200 during this period of non-occupancy as surveillance footage. In some embodiments, the occupancy sensor assembly system 1200 can use facial recognition to determine who entered a building and where they are located inside the building. In some embodiments, a terminal coupled to an occupancy sensor assembly system 1200 is alerted to a new entrant. In some embodiments, a terminal coupled to an occupancy sensor assembly system 1200 is given the choice about how to respond to a new entrant. For example, if a new entrant is known to the occupant of the house an intercom connection to the entrant may be initiated or the entrant may be granted access to the premises. By way of another example, if a new entrant is unknown to an occupancy sensor assembly system 1200 an alert may be sent to the occupant of the house and an option provided to set off an alarm or greet the new entrant.

Figure 28:
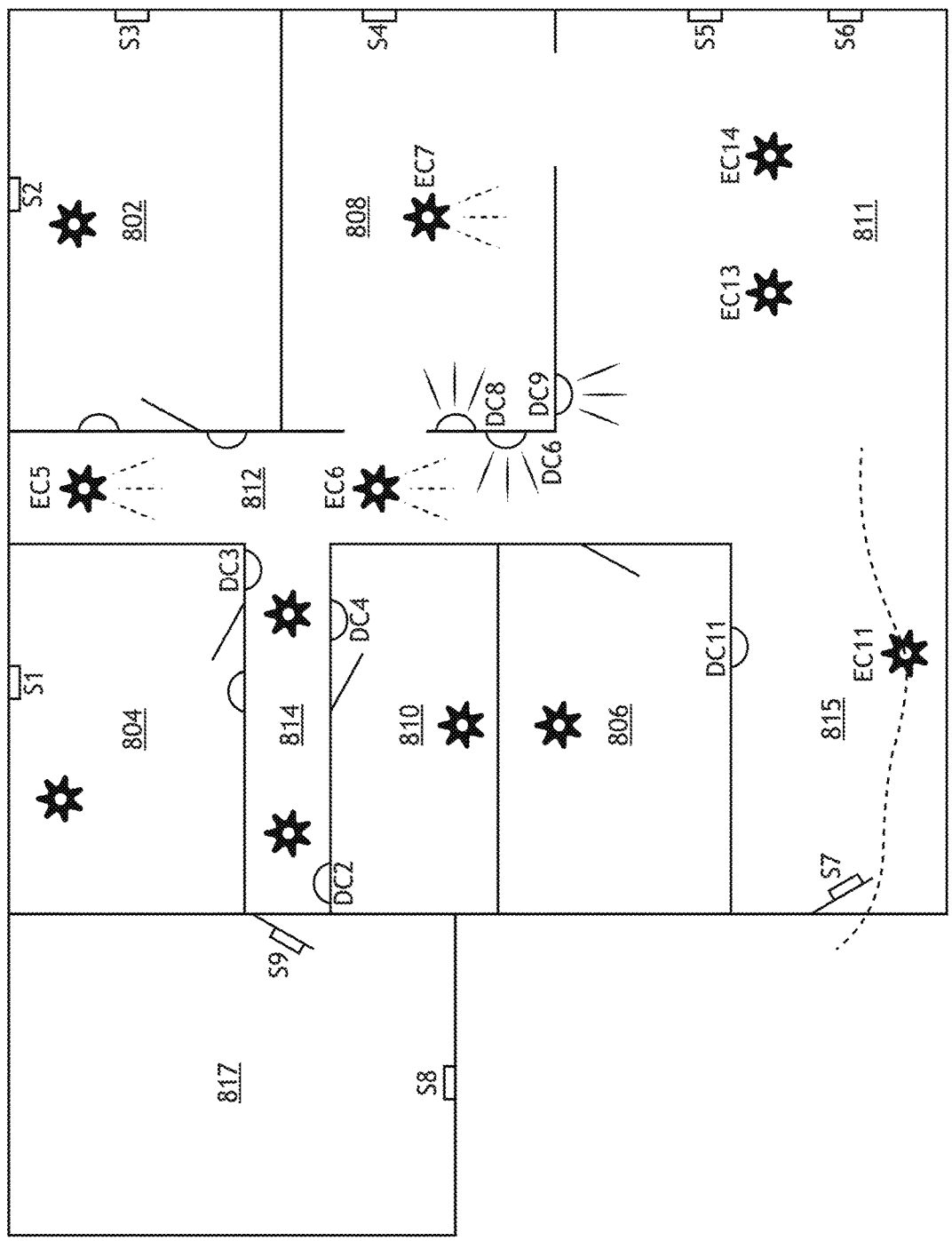
FIG. 28 illustrates the capability of multiple occupancy sensor assembly systems to act as a security system for a home and the deterrent measure it can employ, in accordance with one or more embodiments of the present disclosure.

In some embodiments, a network of occupancy sensor assembly systems 1200 includes sensors that monitor entry through windows and doors. FIG. 28 is a floor plan 2800 that illustrates a network of occupancy sensor assembly systems with sensors on windows and doors. Floor plan 2800 illustrates the monitoring sensors by way of rectangular symbols on the walls, doors and windows. In some embodiments, window and door entry sensors use accelerometers to detect motion. In some embodiments, magnetic tape and sensors are used to detect the present state of a door and/or window. For example, magnetic tape can detect whether a door or window is open or closed. By way of another example, magnetic tape can detect whether a window or door is locked or unlocked. In some embodiments, a network of occupancy sensor assembly systems 1200 is communicatively coupled to door and/or window sensors using Bluetooth. In some embodiments, a network of occupancy sensor assembly systems 1200 including window and door sensors is used with a security system controller as a security system. In some embodiments, the security system controller is made aware by the network of occupancy sensor assembly systems 1200 that the final occupant has left the building and the security system controller "arms" the security system.

In some embodiments, if the security system is armed and a window and/or door sensor is activated the security system controller will alert authorized users. In some embodiments, if a window and/or door sensor is activated the network of occupancy sensor assembly systems 1200 will start surveillance by the occupancy sensor assembly system 1200 closest to the window and/or door sensor that was activated. In some embodiments, surveillance footage is captured and stored on a server for later use. In some embodiments, surveillance footage is captured and stored on a local electronic device for later use. In some embodiments, the new entrant is allowed a period of time to disarm the security system. For example, the new applicant can use the security system control to disarm the security system. By way of another example, the new entrant can disarm the security system using biometric authentication. In some embodiments, if the security system is not disarmed within a predefined amount of time after being armed the security system controller will initiate "deterrent measures". For example, the security system will allow an occupant to disarm the system within 20 seconds of the security system being armed. In some embodiments, deterrent measures of the security system include turning light on in other parts of the house. In some embodiments, deterrent measures of the security system include playing sounds out of the occupancy sensor assembly system 1200. For example, in FIG. 28 a person enters through the front door and activates the door sensor which alerts the security system controller to start a disarming timer. Continuing with this example, the occupancy sensor assembly system 1200 in the Entry 815 detects an occupant and the security system controller determines based on the occupant location in the Entry 815 to use virtual kitchen activity as a deterrent measure if the security system is not disarmed. By way of another example, if an occupant is identified in the Entry 815 while the security system is armed a deterrent measure may include turning lights on in Hallway1 812 or playing sounds in the Living Room 811 through the kitchen occupancy sensor assembly system 1200 or the H1A hallway occupancy sensor assembly system 1200. In some embodiments, the deterrent measure sounds in the Kitchen 808 mimic kitchen activity. For example, kitchen activity sounds include, but are not limited to, running, water, clanging dishes, a refrigerator door opening, a microwave in operation, a stove timer sounding, or a garbage disposal running. In some embodiments, if the security system is armed after a predefined amount of time after deterrent measures are initiated the security system will start "alarm measures" that alert all authorized users of a break-in event. In some embodiments, an alarm measure is to contact a security company. In some embodiments, an alarm measure would play loud alarm bell sounds out of the speakers 126 of the occupancy sensor assembly systems 1200 in the house. In yet another embodiment, an alarm measure would continually strobe the lights in the house.

In some embodiments, the window and/or door entry sensor include a battery, a sensor, and a BLE radio. In some embodiments, the entry sensor includes an accelerometer and a magnetic sensor. In some embodiments, the accelerometer detects motion. In some embodiments, the magnetic sensor detects the state of the window and/or door. In some embodiments, the magnetic sensor detects if a window is locked. For example, the magnetic sensor is placed sufficiently proximate a locking mechanism and a piece of magnetic tape on the locking mechanism such that the sensor can detect if the lock is engaged or not. In some embodiments, the magnetic sensor detects if a door is open or closed. For example, a magnetic sensor is placed on the door and magnetic tape is placed on the doorframe sufficiently proximate to the magnetic sensor so as to sense when the door is closed and sense when the door is opened. In some embodiments, when sensors detect changes in the state of a door and/or window using the magnetic sensor and tape or accelerometer to detect motion the sensor will alert the occupancy sensor assembly system 1200 network on the building. In some embodiments, the occupancy sensor assembly system 1200 network will take action as prescribed by the security system controller.

In some embodiments, the living space feature control apparatus is upgradeable and programmable. In some embodiments, the living space feature controller includes a junction box controller receiver. In some embodiments the junction box controller receiver substantially houses within and creates a mechanical connection to the junction box 102. In some embodiments, the junction box controller receiver is electrically connected to at least one of an AC line and a neutral line routed to the junction box 102. In some embodiments, the junction box controller receiver includes a cover configured with at least an active and an inactive state to mechanically shield electrical connections to the junction box controller receiver. In some embodiments, the junction box controller receiver will selectably provide the living space feature controller feature control. In some embodiments, the junction box controller cover in an active state shields the electrical contacts when the junction box controller is not coupled to the junction box controller receiver. In some embodiments, the junction box controller receiver includes a living space feature controller interface for at least one of inductively and electrically connecting the junction box controller receiver with a living space feature controller for living space feature control. In some embodiments, the junction box controller receiver includes a lock configured to removably receive, activate, and retain for operational control, the living space feature controller with the junction box controller receiver. In some embodiments, the living space feature controller provides wireless addressable connectivity and at least one of lighting control, voice control, motion control, audio control, security control, video control, and climate control. In one embodiment, the junction box controller receiver includes a programmable user interface for wireless programming living space features. In some embodiments, the junction box controller receiver includes at least one of a haptic user control interface and a wireless control interface of at least one living space feature.

In some embodiments, the living space feature controller is toollessly exchangeable for providing differential living space feature control. In some embodiments, the living space feature controller includes a recorder for recording user feature selection over time. In some embodiments the living space feature controller includes a user detector for detecting and differentiating at least a selection of two users. In some embodiments, the living space feature controller includes a predictor for predicting user feature selection based at least in part on previously recorded user feature selection by at least one of user proximity and time. In some embodiments, the living space feature controller provides control for at least one of window opacity and window shades. In some embodiments, the living space feature controller includes a rotary optical encoder for interconnecting said controller with said receiver for selectable user living space control. In some embodiments, the living space feature controller includes sound playback for playing at least one, but not limited to, occupancy noises and user recorded occupancy noises for playback when at least some living space is unoccupied. In some embodiments, the living space feature controller includes at least three controller and receiver pairs for triangulating the position of occupants in a living enclosure. In some embodiments, the living space feature controller determines the position of occupants by at least partially determining the location of one or more occupant user mobile devices. In some embodiments, the living space feature controller includes an audio communication configuration wherein two or more living space feature controllers acquire, transmit and reproduce audio signals. In some embodiments, at least two or more living space feature controllers actively maintain audio signal communication between rooms where occupants are located.

All of the methods described herein may include storing results of one or more steps of the method embodiments in the memory. The results may include any of the results described herein and may be stored in any manner known in the art. The storage medium may include any storage medium described herein or any other suitable storage medium known in the art. For example, the memory medium may include a non-transitory memory medium. As an additional example, the memory medium may include, but is not limited to, a read-only memory, a random access memory, a Flash memory, a magnetic or optical memory device (e.g., disk), a magnetic tape, a solid state drive and the like. It is further noted that memory medium may be housed in a common controller housing with the one or more processors. In some embodiments, the memory medium may be located remotely with respect to the physical location of the one or more processors and controller. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the disclosure is defined by the appended claims.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

The invention claimed is:

1. A user upgradeable and programmable living space feature control apparatus, comprising:
   a device control assembly;
   a backplate for housing within and mechanical connection to a junction box, said backplate electrically connected to electrical wiring routed to the junction box, said backplate including:
      a translatable cover having at least an active and an inactive state, said cover configured to translate to the active state when said device control assembly is coupled to said backplate, said cover in the active state configured to allow electrical connections between said electrical wiring and the device control assembly, said cover configured to translate to the inactive state when said backplate is not coupled to said device control assembly, said cover in the inactive state configured to mechanically shield electrical connections to said electrical wiring;
      one or more locks configured to secure said device control assembly with said backplate when coupled, at least one lock of said one or more locks actuatable upon coupling of said device control assembly to said backplate to enable the translation of the cover from the inactive state to the active state;
   said device control assembly including a programmable user interface for providing selective user control of one or more devices when said device control assembly is coupled to the backplate, said programmable user interface providing said selective user control by at least one of a touch user interface or a voice user interface, said one or more devices including at least one of a luminaire, an appliance, a security device, or a climate control device, said device control assembly providing said control by at least one of regulating electricity through said electrical wiring or wirelessly transmitting signals to at least one of said one or more devices.

2. The apparatus of claim 1, wherein said device control assembly is toollessly exchangeable for another device control assembly providing alternative options for said selective user control.

3. The apparatus of claim 1, further comprising a recorder for recording user feature selection over time.

4. The apparatus of claim 3, further comprising a user detector for detecting and differentiating at least a selection of two users.

5. The apparatus of claim 4, further comprising a predictor for predicting user control selections based at least in part on previously recorded user control selections.

6. The apparatus of claim 5, further comprising sound playback for playing at least one of at least one of occupancy noises or user recorded occupancy noises for playback when at least some living space is unoccupied.

7. The apparatus of claim 1, wherein at least a portion of said device control assembly is rotatable when coupled to said backplate to provide user interaction with said device control assembly, said device control assembly further comprising a rotary optical encoder for monitoring rotation of said device control assembly.

8. The apparatus of claim 1, wherein said device control assembly provides control for at least one of window opacity or window shades.

9. The apparatus of claim 1, further comprising at least three device control assembly and backplate pairs for triangulating a position of at least one occupant in a living enclosure.

10. The apparatus of claim 9, wherein said position of at least one occupant is at least partially determined by a location of one or more user mobile devices.

11. The apparatus of claim 1, wherein the backplate is one of two or more backplates, wherein the device control assembly is one of two or more device control assemblies coupled to the two or more backplates, wherein the two or more device control assemblies provide at least audio communication between at least two of the two or more device control assemblies.

12. The apparatus of claim 11, wherein the two or more device control assemblies actively maintain said communication between rooms where occupants are located.

* * * * *